United States Patent
Engl

(10) Patent No.: US 7,312,732 B2
(45) Date of Patent: Dec. 25, 2007

(54) DEVICES AND METHODS FOR CALIBRATING AMPLIFIER STAGES AND FOR COMPENSATING FOR ERRORS IN AMPLIFIER STAGES OF SERIES-CONNECTED COMPONENTS

(75) Inventor: Bernhard Engl, Miesbach (DE)

(73) Assignee: Infineon Technologies AG, Munich (DE)

( * ) Notice: Subject to any disclaimer, the term of this patent is extended or adjusted under 35 U.S.C. 154(b) by 518 days.

(21) Appl. No.: 10/203,550

(22) PCT Filed: Jan. 19, 2001

(86) PCT No.: PCT/DE01/00238

§ 371 (c)(1),
(2), (4) Date: Nov. 8, 2002

(87) PCT Pub. No.: WO01/58010

PCT Pub. Date: Aug. 9, 2001

(65) Prior Publication Data

US 2003/0184459 A1    Oct. 2, 2003

(30) Foreign Application Priority Data

Feb. 4, 2000 (DE) ............................... 100 04 996

(51) Int. Cl.
*H03M 1/06* (2006.01)

(52) U.S. Cl. ................... 341/118; 341/120; 341/155

(58) Field of Classification Search ............... 341/118, 341/120, 155; 330/254, 261
See application file for complete search history.

(56) References Cited

U.S. PATENT DOCUMENTS 4,496,935 A    1/1985    Inoue et al.

(Continued)

FOREIGN PATENT DOCUMENTS

EP    0 551 910 A2    7/1993

(Continued)

OTHER PUBLICATIONS

Anonymous: "Verstärker zur Verstärkung kleiner Ströme" [amplifier for amplifying low currents], *Research Disclosure*, Jun. 1992, No. 338, XP-000315729.

(Continued)

*Primary Examiner*—Linh Nguyen
(74) *Attorney, Agent, or Firm*—Laurence A. Greenberg; Werner H. Stemer; Ralph E. Locher

(57) ABSTRACT

Devices and methods for calibration of amplifier stages and for compensation of errors in components connected upstream of amplifier stages The described amplifier stage calibration comprises the following steps: creation of appropriate conditions for calibration of the amplifier stage, comparison of signals which are output by the amplifier stage or electrical quantities which occur within the amplifier stage with each other or with assigned reference values, and changing those properties of the amplifier stage which are to be calibrated depending on the result of the comparison. The described compensation of errors in components connected upstream of amplifier stages takes place through a corresponding calibration of the amplifier stage. Through the described devices and described methods, the calibration of amplifier stages and the compensation of errors in components connected upstream of amplifier stages can be carried out in an amazingly simple way, quickly and precisely.

83 Claims, 58 Drawing Sheets

U.S. PATENT DOCUMENTS

| | | | |
|---|---|---|---|
| 4,947,168 A | | 8/1990 | Myers |
| 4,983,969 A | | 1/1991 | Iwamoto et al. |
| 5,047,772 A | | 9/1991 | Ribner |
| 5,432,475 A | | 7/1995 | Fukahori |
| 5,515,103 A | | 5/1996 | Ito |
| 5,784,016 A | | 7/1998 | Nagaraj |
| 5,821,795 A | | 10/1998 | Yasuda et al. |
| 5,835,048 A | | 11/1998 | Bult |
| 5,841,389 A | * | 11/1998 | Kinugasa et al. ........... 341/159 |
| 5,955,978 A | | 9/1999 | Fiedler et al. |
| 6,081,214 A | * | 6/2000 | Morisson et al. ........... 341/120 |
| 6,285,308 B1 | * | 9/2001 | Thies et al. ................. 341/155 |
| 6,452,529 B1 | * | 9/2002 | Li ............................... 341/156 |
| 6,720,901 B2 | * | 4/2004 | Nakamoto ................... 341/156 |
| 6,822,600 B1 | * | 11/2004 | Taft et al. .................... 341/155 |
| 7,034,608 B2 | * | 4/2006 | Gai et al. ........................ 330/9 |
| 7,061,413 B2 | * | 6/2006 | Boemler ..................... 341/120 |
| 7,196,649 B2 | * | 3/2007 | Mokhtari et al. ........... 341/155 |
| 2003/0016149 A1 | * | 1/2003 | Choksi ........................ 341/118 |
| 2003/0227405 A1 | * | 12/2003 | Nakamoto ................... 341/156 |

FOREIGN PATENT DOCUMENTS

| | | |
|---|---|---|
| EP | 0 624 947 A2 | 11/1994 |
| EP | 0 729 233 A1 | 8/1996 |
| FR | 2 793 087 A1 | 11/2000 |
| WO | WO 97/45960 | 12/1997 |

OTHER PUBLICATIONS

James H. Atherton et al.: "An Offset Reduction Technique for Use with CMOS Integrated Comparators and Amplifiers", *IEEE Journal of Solid-State Circuits*, vol. 27, Aug. 1992, No. 8, pp. 1168-1175.

Klaas Bult et al.: "A 170mW 10b 50Msample/s CMOS ADC in 1mm$^2$", 1997 *IEEE International Solid-State Circuits Conference, Digest of Technical Papers*, pp. 136-138.

Pieter Vorenkamp et al.: "A 12-b, 60-Msample/s Cascaded Folding and Interpolating ADC", *IEEE Journal of Solid-State Circuits*, vol. 32, No. 12, Dec. 1997, pp. 1876-1886.

Rob E.J. Van De Grift et al.: "An 8-bit Video ADC Incorporating Folding and Interpolation Techniques", *IEEE Journal of Solid-State Circuits*, vol. SC-22, No. 6, Dec. 1987, pp. 944-953.

Bram Nauta et al.: "A 70-MS/s 110-mW 8-b CMOS Folding and Interpolating A/D Converter", *IEEE Journal of Solid-State Circuits*, vol. 30, No. 12, Dec. 1995, pp. 1302-1308.

Myung-Jun Choe et al.: "A 13b 40Msample/s CMOS Pipelined Folding ADC with background Offset Trimming", *2000 IEEE International Solid-State Circuits Conference*, Feb. 7, 2000, *Digest of Technical Papers*, pp. 36-37.

* cited by examiner

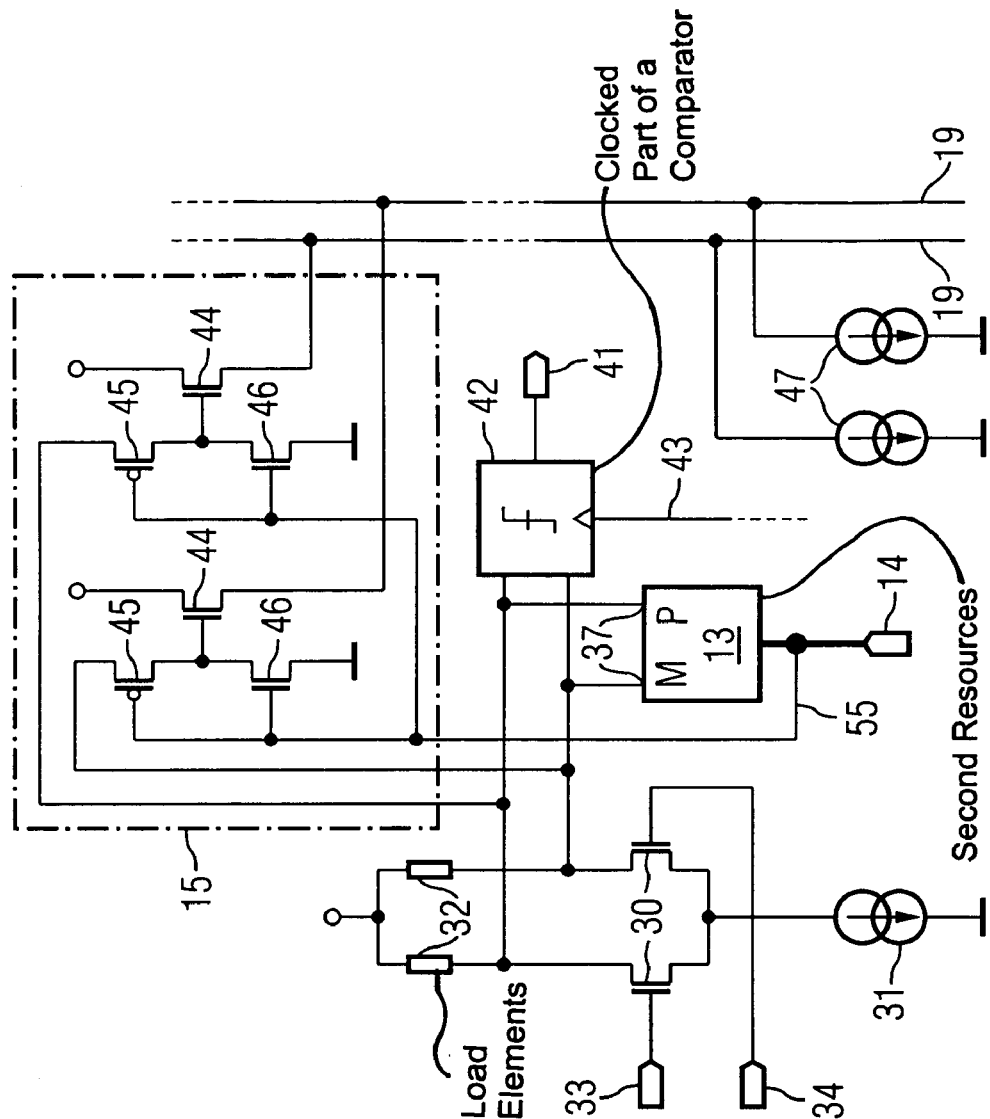
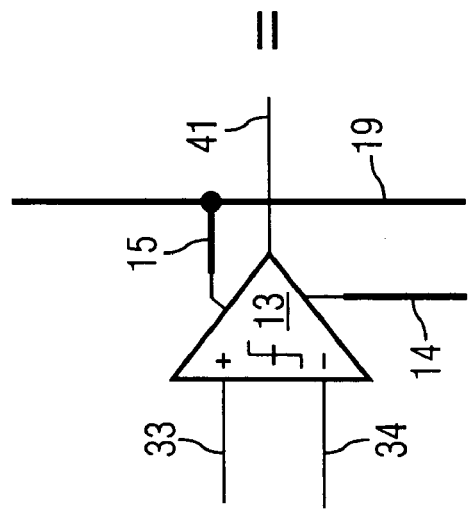
FIG 8

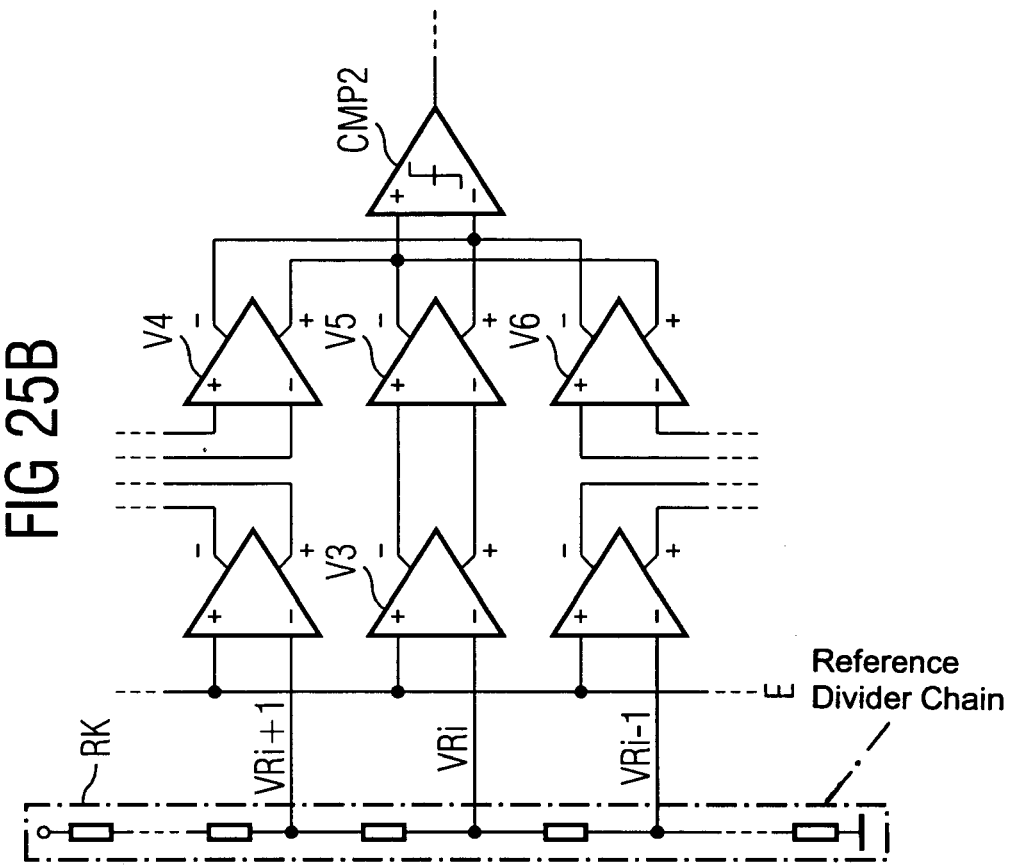
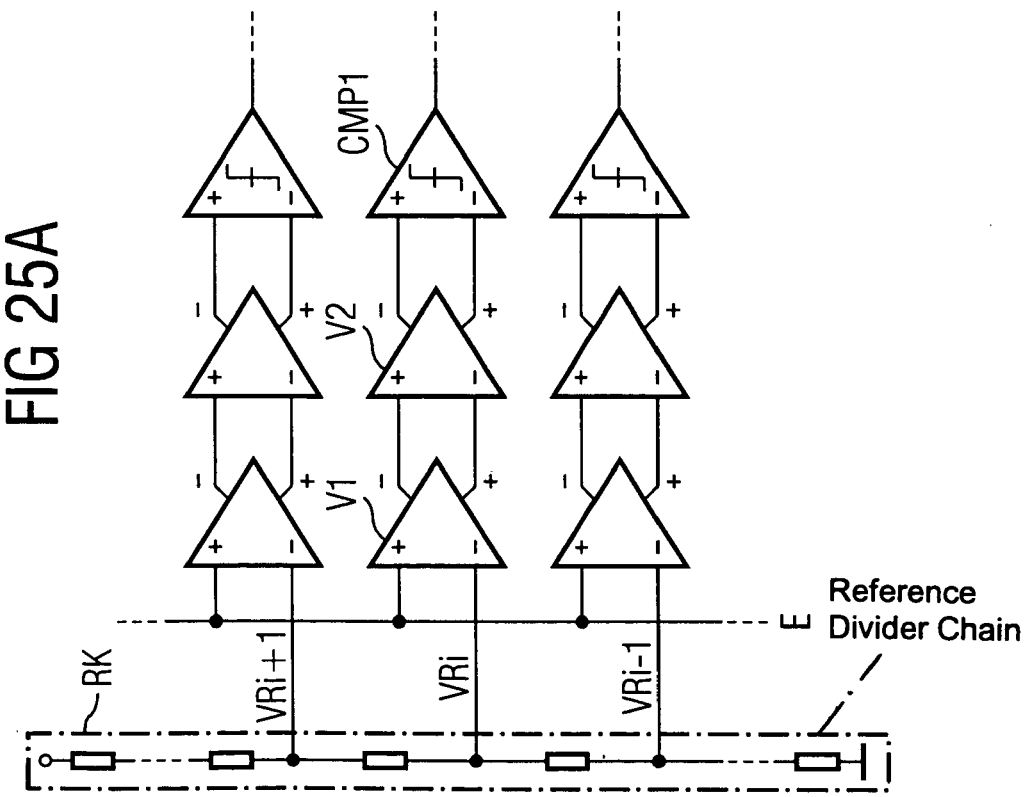

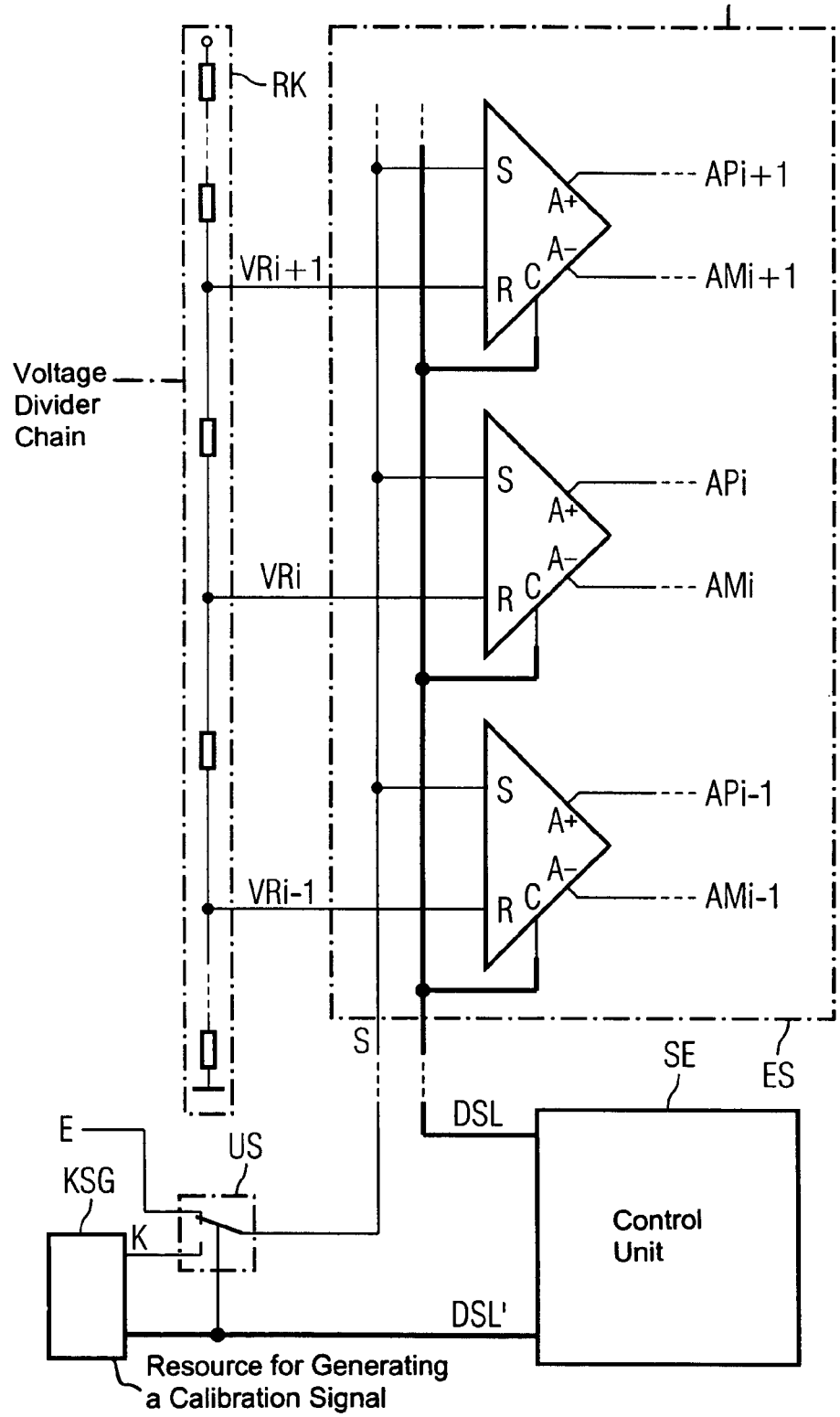

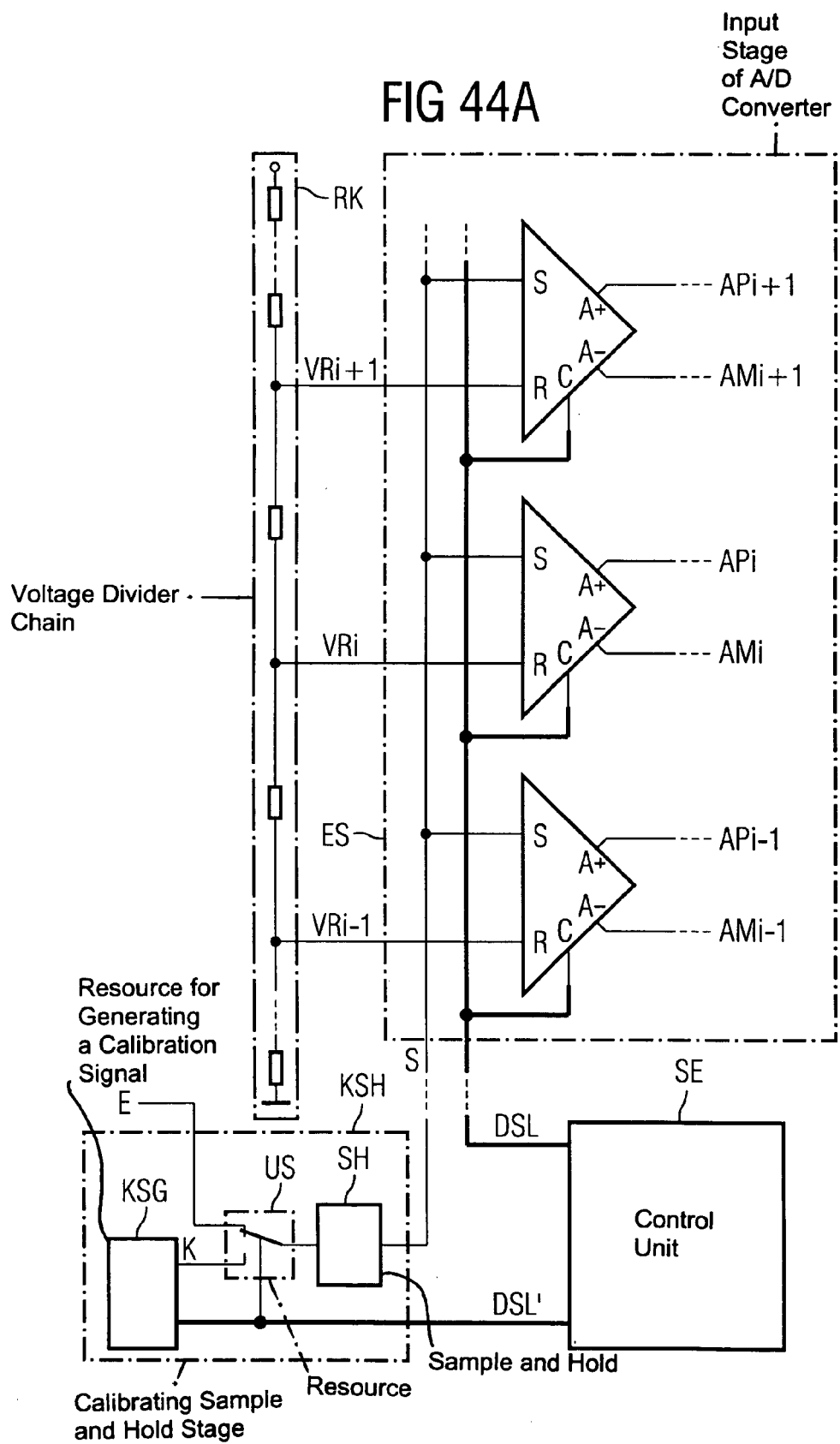

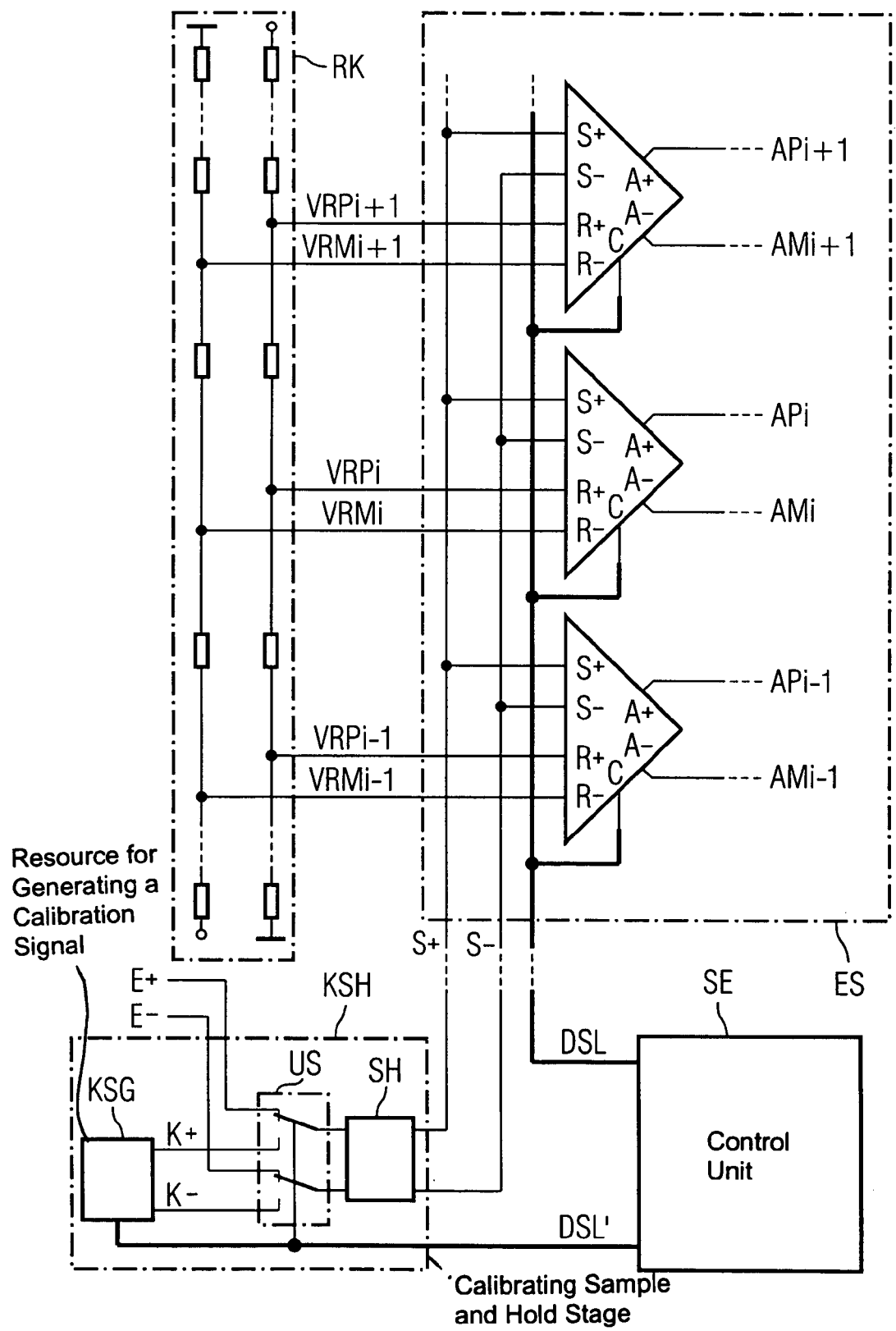

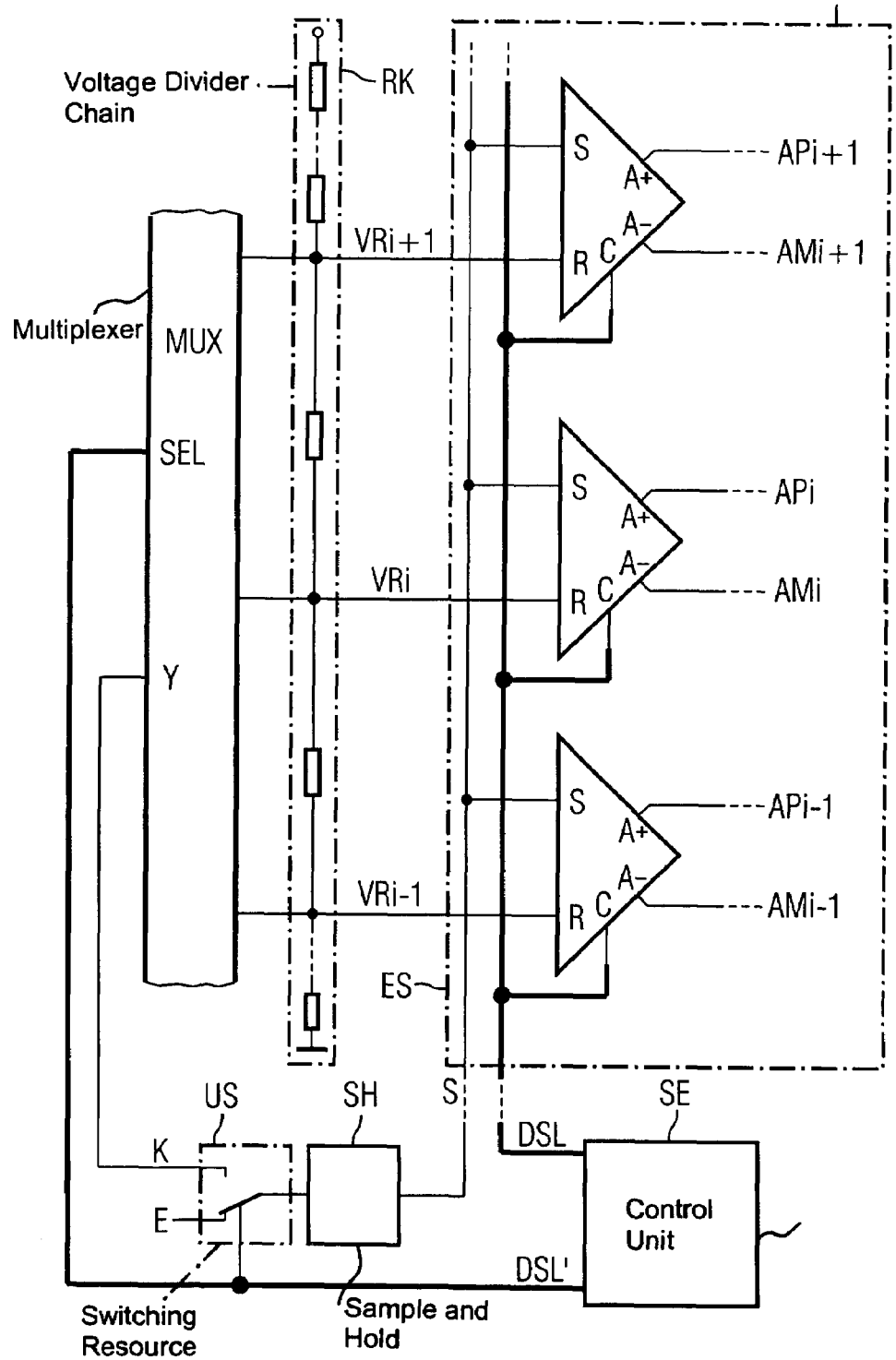

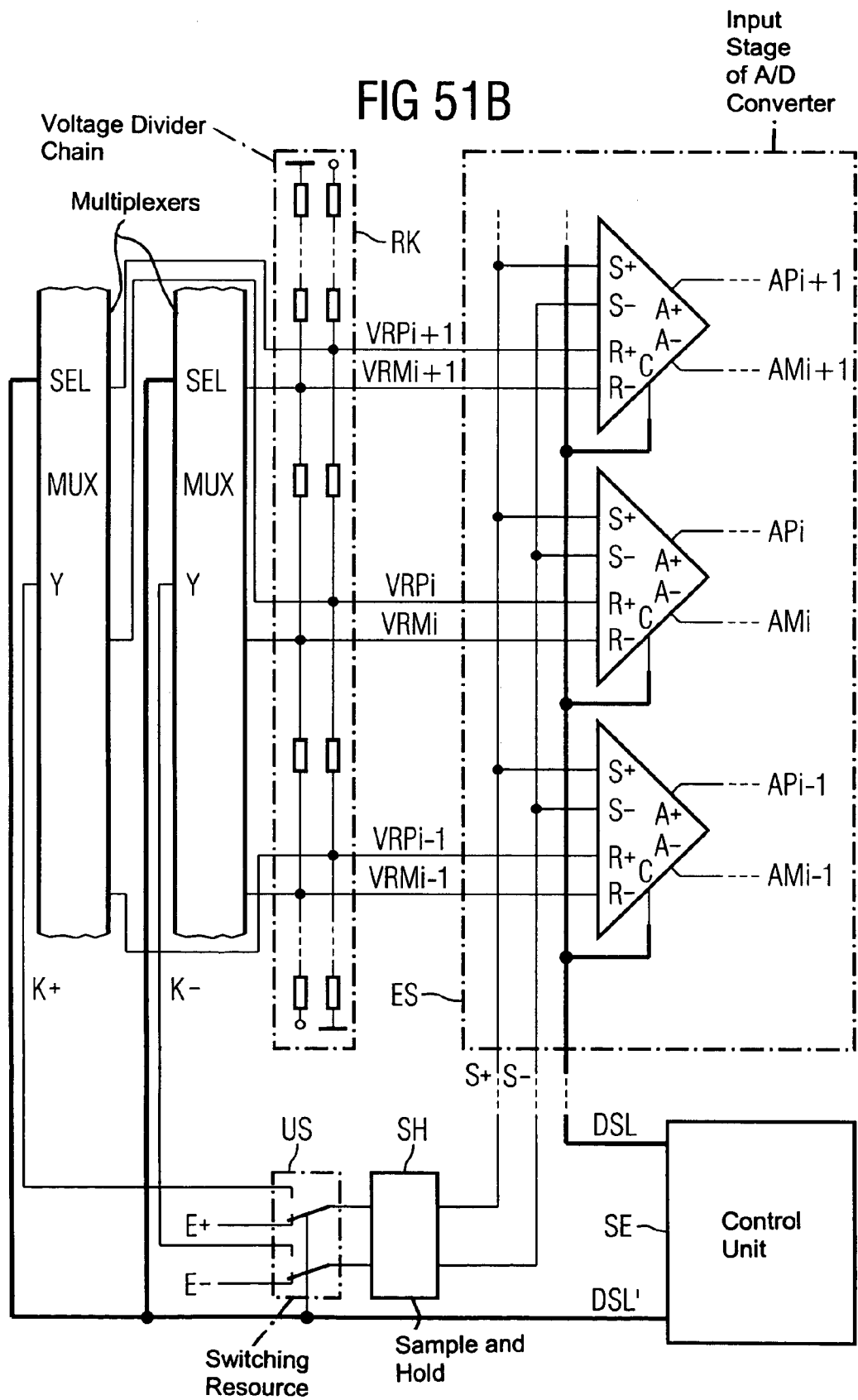

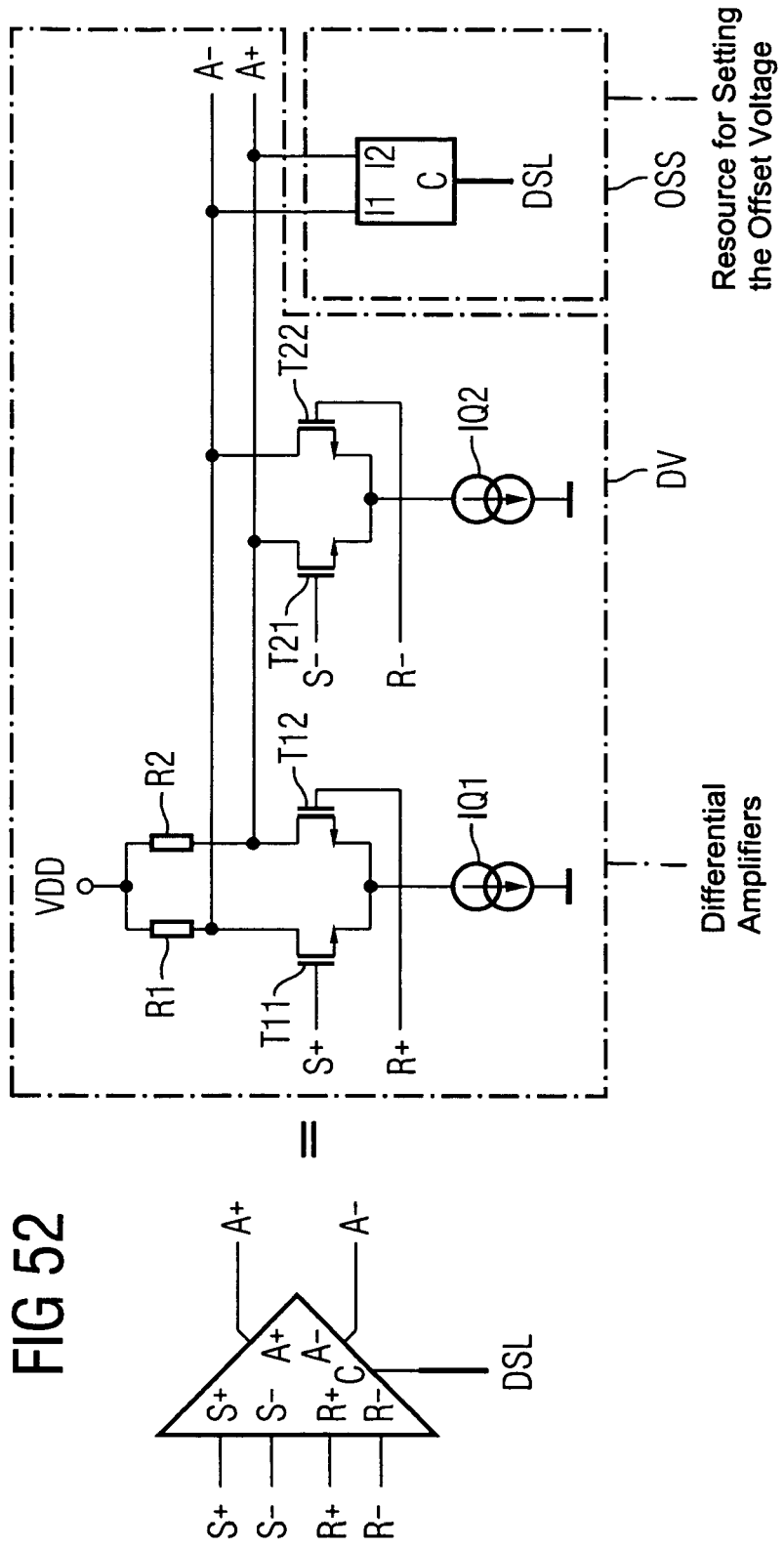

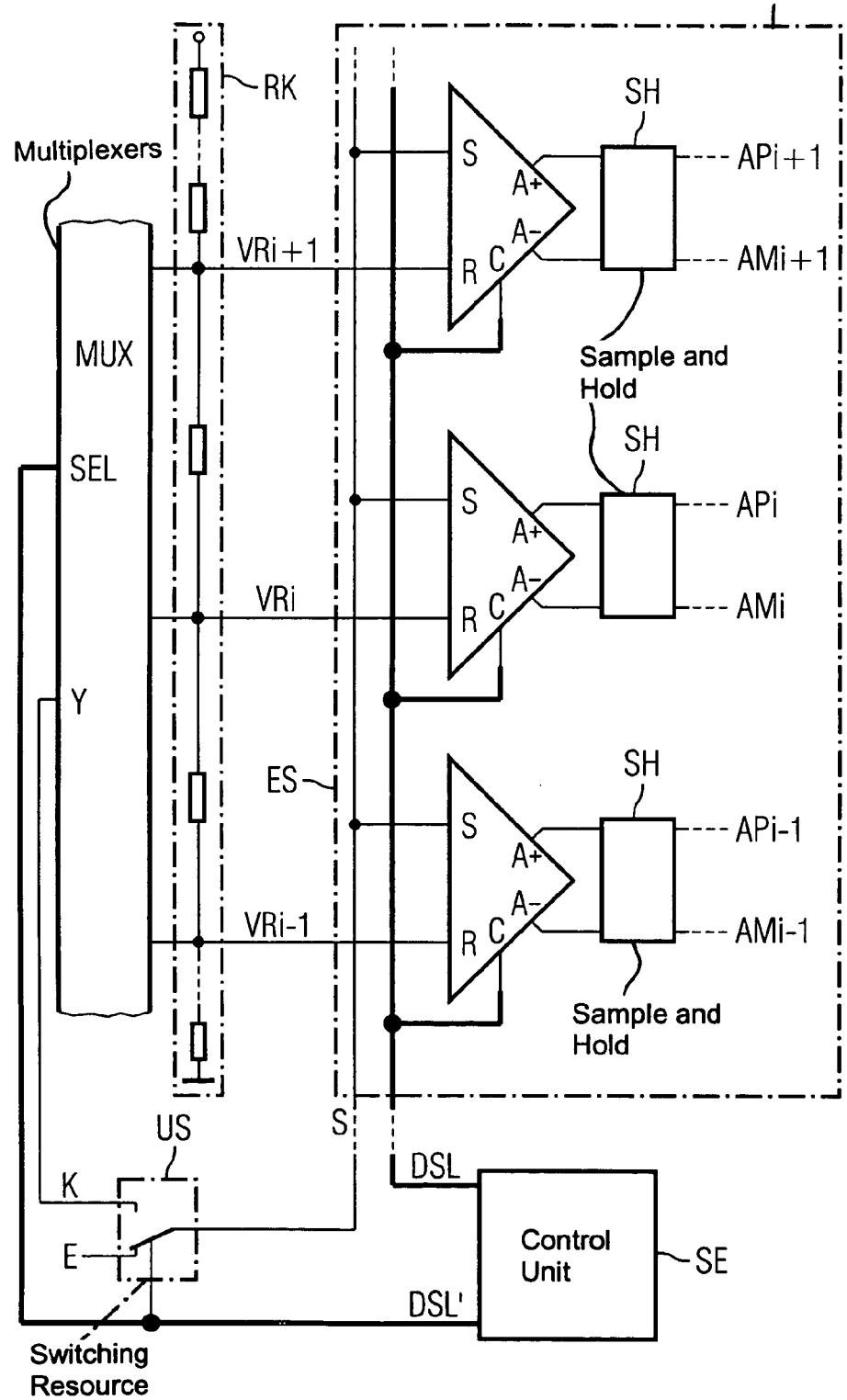

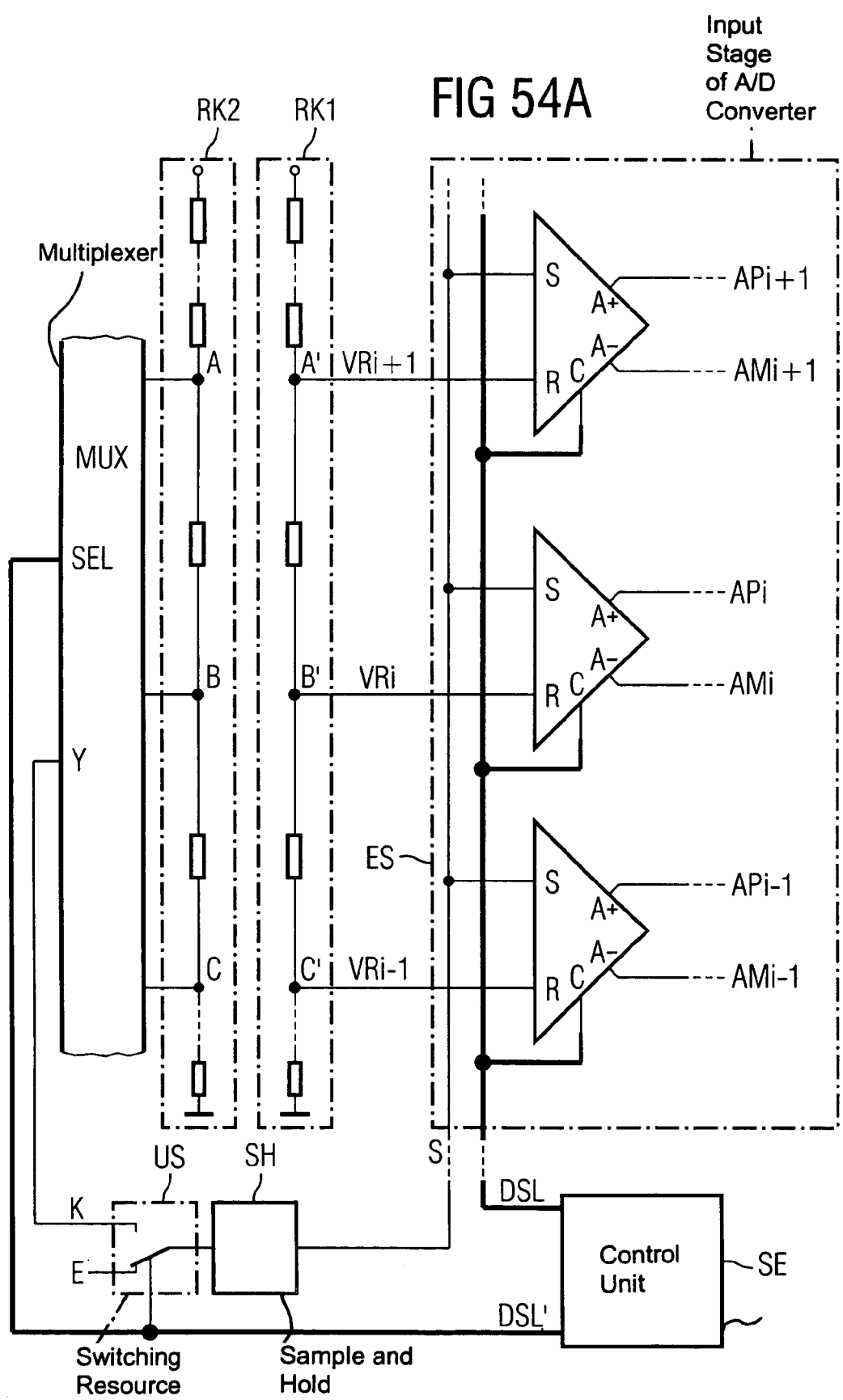

DEVICES AND METHODS FOR CALIBRATING AMPLIFIER STAGES AND FOR COMPENSATING FOR ERRORS IN AMPLIFIER STAGES OF SERIES-CONNECTED COMPONENTS

CROSS-REFERENCE TO RELATED APPLICATION

This application is a continuation of International Application No. PCT/DE01/00238, filed Jan. 19, 2001, which designated the U.S. and was not published in English.

BACKGROUND OF THE INVENTION

Field of the Invention

Devices and methods for calibration of amplifier stages and for compensation of errors in components connected upstream of amplifier stages The present invention concerns devices and methods for calibration of amplifier stages and for compensation of errors in components connected upstream of amplifier stages. Through these devices and methods, it is possible to eliminate or minimize, in particular, errors which are caused by statistical variations of the component parameters (mismatch) and/or by integral non-linearity (INL) or differential non-linearity (DNL).

Very many devices and methods of this kind are already known; a small selection of the documents concerning such devices and methods can be found in the attached reference list.

The known devices and methods have the disadvantage that they can only be implemented at very high cost, and/or that they do not work as quickly or precisely as would be desirable in many cases.

SUMMARY OF THE INVENTION

The present invention is therefore based on the object of finding devices and methods which are simple to implement and yet make quick, precise compensation and calibration possible, for calibration of amplifier stages and for compensation of errors in components connected upstream of amplifier stages.

According to the invention, this object is achieved by the devices and methods which are claimed in claims 1, 29, 60, 65, 70, 71, 72, 90 and 91.

Advantageous developments can be found in the subclaims, the description below and the figures.

The invention is explained in more detail below on the basis of exemplary embodiments, referring to the figures.

BRIEF DESCRIPTION OF THE DRAWINGS

FIG. 8 shows a circuit diagram of a third resource of FIG. 2, FIG. 25 shows a selection of groups, signal processing chains and signal processing trees which can be formed from such amplifier stages, FIGS. 42a and 42b show block circuit diagrams of a device to eliminate errors in a reference voltage divider chain, FIG. 51a shows an arrangement with a first exemplary embodiment of a device for compensation of errors which are contained in a sample-and-hold stage, FIG. 51b shows an arrangement with a device which is intended for other differential amplifiers, for compensation of errors which are contained in a sample-and-hold stage, FIG. 52 shows the structure of one of the differential amplifiers which are shown in FIG. 51b, FIG. 53a shows an arrangement with a second exemplary embodiment of a device for compensation of errors which are contained in a sample-and-hold stage, FIG. 54a shows an arrangement with a device for compensation of errors which are contained in a sample-and-hold stage, two different reference voltage divider chains being used.

DESCRIPTION OF THE PREFERRED EMBODIMENTS

Figure 1:
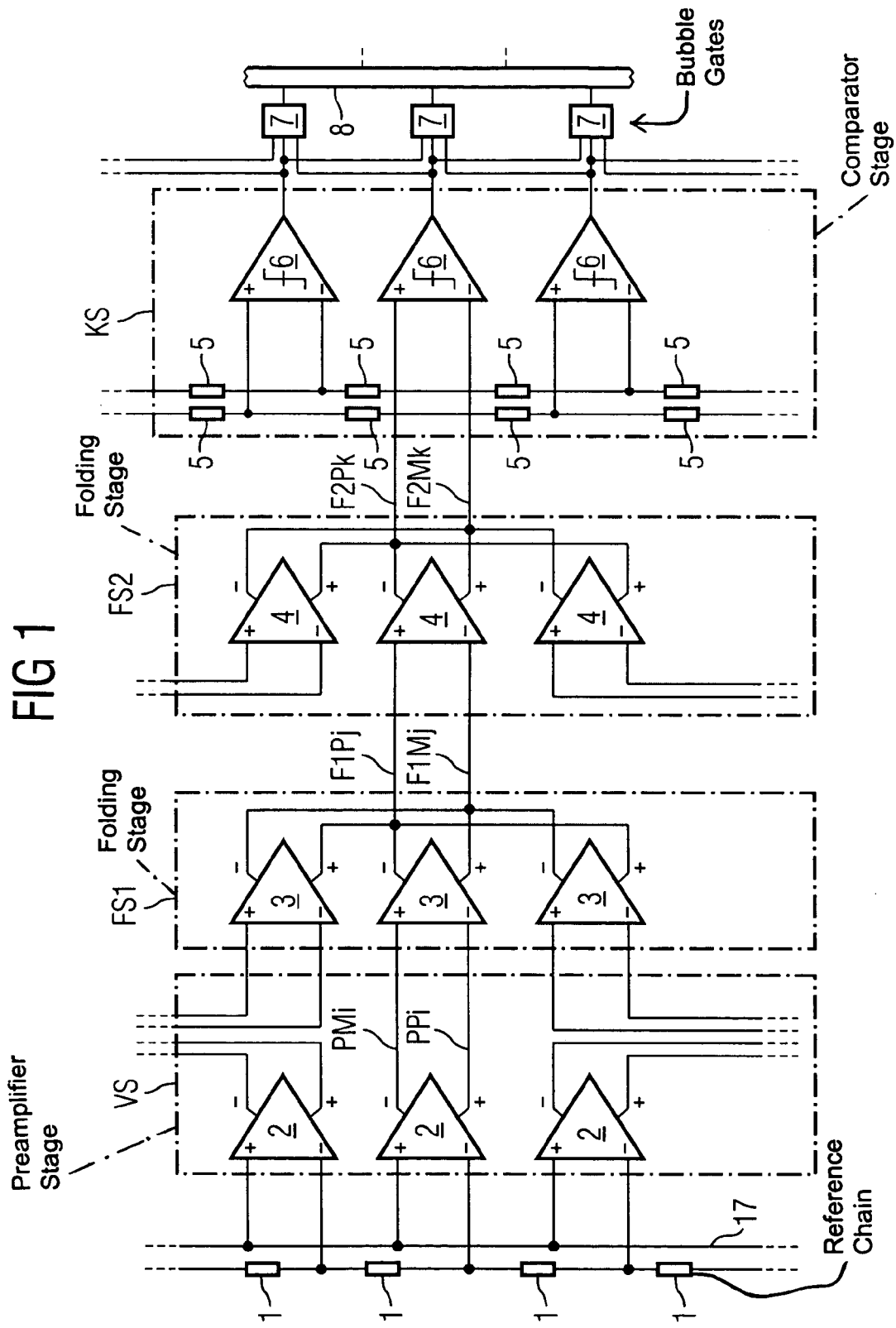
FIG. 1 shows a section of a known analog/digital converter which works on the folding principle (analog/digital converters which work on the folding principle are called folding converters or folding ADCs below)

The invention is first described with reference to FIGS. 1 to 23, on the basis of an analog/digital converter which works on the folding principle; for simplicity, analog/digital converters which work on the folding principle are called folding converters or folding ADCs below. The use of devices and methods according to the invention in folding ADCs or other fast ADCs, for instance in flash ADCs, is shown to be particularly advantageous, because these have a very large number of amplifier stages.

The devices and methods according to the invention are then explained in more general form, giving further advantageous developments and giving further possible uses, with reference to FIGS. 24 to 55.

FIGS. 1 to 23 and the description which refers to them concern a device and a method for calibrating a folding ADC, calibration meaning, for instance, minimizing errors through statistical variations of the component parameters (mismatch) and errors through integral or differential non-linearity (INL or DNL respectively).

Folding ADCs have a broad application field, which for speed mostly comes between so-called subranging ADCs and flash ADCs. The first usable folding ADCs, which were implemented in bipolar processes [1], were soon followed by folding ADCs which were implemented in CMOS processes [2]. However, MOSFETs have the disadvantage of a much greater offset voltage than bipolar transistors of the same area. In modern CMOS processes, matching constants of approx. 5 mV/μm are expected, which means that a MOSFET with 25 μm² gate area has a 3 sigma offset voltage of 3 mV. This follows from Vos(3s)=3*5 mV/μm: SQRT(25 μm²), i.e. the gate area increases quadratically to reduce the offset voltage linearly. This fact, which is known to the particularist as Pelgrom's law, represents a considerable restriction for the resolution (number of bits), speed and reduction of current consumption which can be achieved with CMOS folding ADCs. Although the averaging technique which was first introduced by Bult [3], [4] for CMOS folding ADCs, and which goes back to [5], was an important milestone for implementing high-resolution folding ADCs (here 10 bits) in CMOS with acceptable area and current consumption, for economical achievement of still higher resolutions a solution approach is desirable in which the offset of the MOSFETs is reduced not by a large gate area, but by active measures such as using a circuit which compensates for the offset.

Such circuits have long been known to the prior art, and are used above all for operational amplifiers. Since these circuits are in general based on feedback, and therefore a dominant pole, which guarantees its stability, is necessary in the transfer function of the offset compensation loop, this approach cannot be used as it stands in the case of folding ADCs, because their processing stages in general are designed as broadband differential amplifiers and work without feedback. So-called autozero techniques, which are known from the prior art, for comparators [6], cannot be applied to the folding stages because of their considerably greater amplification, since in this case stability is more difficult to achieve. A further complication results from the property of the architecture of folding ADCs, that the signal path as seen from the input of the ADC first diverges (as in the case of the flash ADC), but then converges again in the folding stages, so that their offset-affected MOSFET differential pairs cannot be assigned to a unique signal path, but to multiple signal paths, of which in the case of averaging [3] a plurality are even active simultaneously and influence each other. Additionally, in a folding ADC there are not only offset-affected differential pairs, but also other components such as resistors and current sources, which are also subject to a matching error, and can bring about both offset and amplification errors, so that these error sources must often also be subjected to compensation. A process in which all error sources of the ADC are systematically compensated for is usually called "self-calibration" in the literature, and this is very extensive for flash, subranging, pipeline, successive approximation ADCs etc. (e.g. [7] . . . [10]).

However, for folding ADCs, there has been until now no usable self-calibration method, presumably because this object has not been successfully achieved until now because of the factors mentioned above. Folding ADCs known in the literature which are of higher resolution, e.g. [11], therefore resort to the use of BiCMOS processes, to reduce the offset problem because of the bipolar transistors which are available there. However, [11] does not achieve more than 12 bits nominal resolution, so that it would be very useful for the designer, even in the case of use of such a BiCMOS process, and not just in the case of pure CMOS, to have a usable method of self-calibration, which can be applied quite generally to folding ADCs of the widest variety of architectures.

The basis of this invention is essentially that self-calibration or regulated calibration of a folding analog/digital converter takes place through first resources for sensitization, inhibition and release of signal paths through the folding converter, second resources to generate an equilibrium state of the stages which contain the first resources, third resources to interrogate states in these stages and fourth resources to form control signals depending on the interrogated states.

In FIG. 1, the previous prior art is represented by an example. This is a section from a folding ADC with cascaded folding, i.e. the folding takes place in more than one folding stage. This is intended to show that the invention is usable even for this more difficult case, eparticularly as most modern folding ADCs use cascaded folding. A reference chain 1 leads to preamplifier 2 of a preamplifier stage VS, the outputs of which, PPi and PMi, lead to a first folding stage FS1 with differential amplifiers 3. The outputs F1Pj and F1Mj of the first folding stage lead to a second folding stage FS2 with differential amplifiers 4, the outputs F2Pk and F2Mk of which lead to a comparator stage with interpolator 5 and subsequent comparators 6, which are followed by so-called bubble gates 7, which represent logic circuits to replace bits with the value "0" within bit sequences with the value "1" and are used to correct the folded thermometer code, and which affect a ROM or encoder 8, so that low-order bits of the quantized input value come out of its output. The method of functioning and working of these parts in themselves, and their circuit structure, can be assumed to be known to the particularist, and are described in detail in the relevant literature [1] . . . [5], [11]. Some fairly common variations of the represented basic circuit would be fitting an additional interpolator after the first folding stage [11] or an averaging network [3]. The invention can be used in all these cases, and obviously also for simple architectures with only one folding stage, or architectures in which the preamplifier is combined with the folding stage. In the last case, the preamplifier/folding stage combination should be considered as a folding stage for the purposes of the invention, and equipped with the resources according to the invention for folding stages.

As regards this and the following representations, it should be noted that the elements marked 2, 3, 4 are in general constructed as a broadband symmetrical differential amplifier which comprises a differential pair, a bottom-end current source and a pair of load elements, mostly resistors but also active circuits [3], and which inverts the input signal. In the case of folding stages, each second such amplifier is connected to exchanged outputs. This makes it more difficult to assign the correct polarities to the differential signals Pmi, PPi, F1Pj, F1Mj, F2Pk, F2Mk, etc. However, for the pictorial representation, the polarity of the signal names is more of a designer's convention, and therefore unimportant for the disclosure of the invention.

Figure 2:
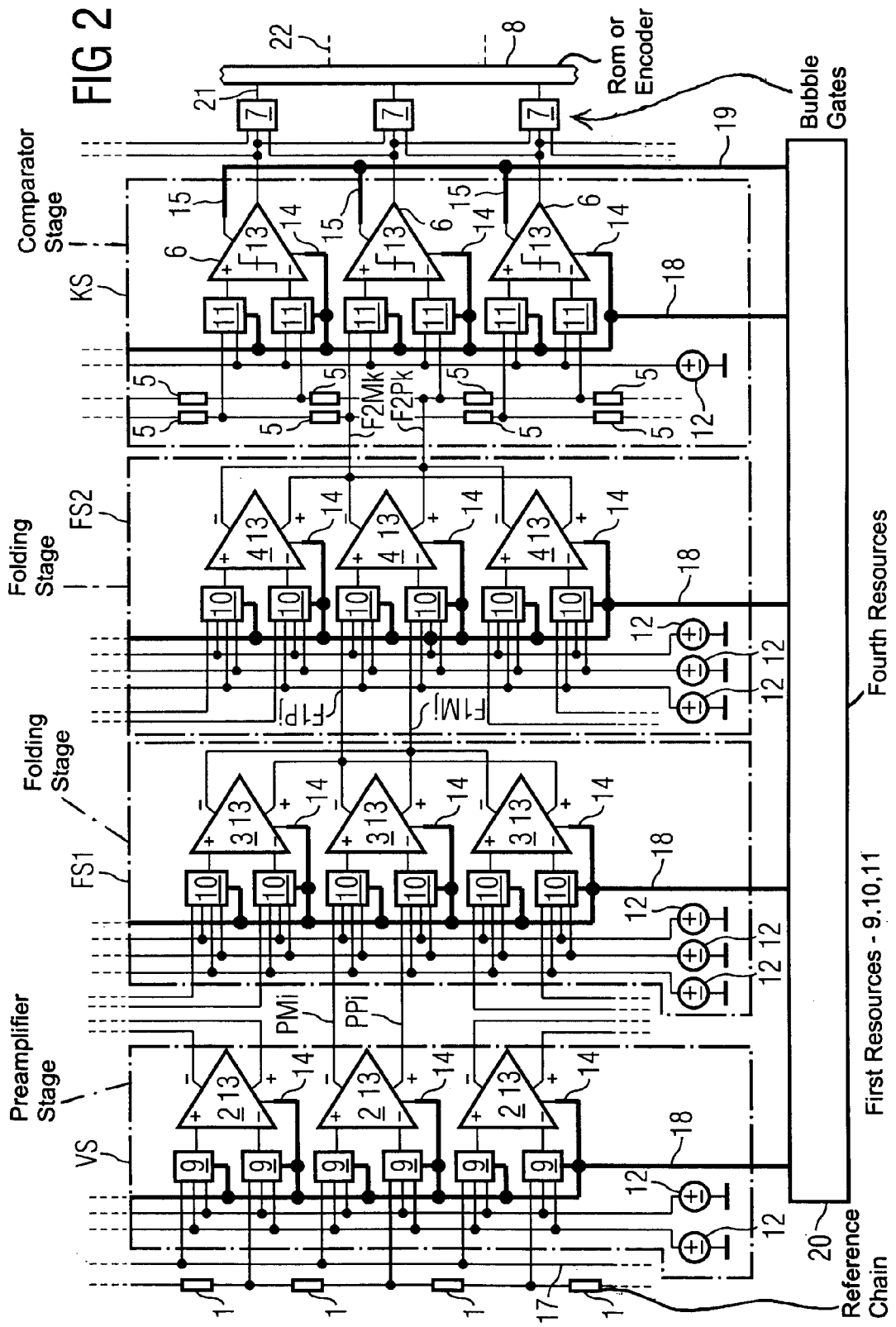
FIG. 2 shows a section of a version of a folding converter according to the invention.

In FIG. 2, a section of a preferred exemplary embodiment of the device according to the invention in a folding converter is shown. The same basic circuit as in FIG. 1 is present here, with the addition of first to fourth resources 9, 10, 11; 13; 15 and 20.

The first resources 9, 10, 11 make it possible to disconnect the inputs of circuit stages within the folding ADC from their normal sources and connect them to auxiliary potentials 12, which are fed to the resources. These auxiliary potentials are chosen so that the circuit stages can take specified operating points, which is explained later when the self-calibration method is described.

Although the auxiliary potentials are represented in FIG. 2 by voltage sources, they can be drawn at any points and in any way within the circuit, provided that the effects of the first resources according to the invention are thus achieved. These variations are represented below as examples. In particular, there are numerous variants for the possible implementation of the first resources 9 which affect the first stage.

The first resources 10, which are provided at the input of folding stages, have at least four operating states or effects. For other types of ADCs, which are not based on the folding principle, two operating states, one for normal operation and one for self-calibration, are usually enough for corresponding first resources.

Figure 3:
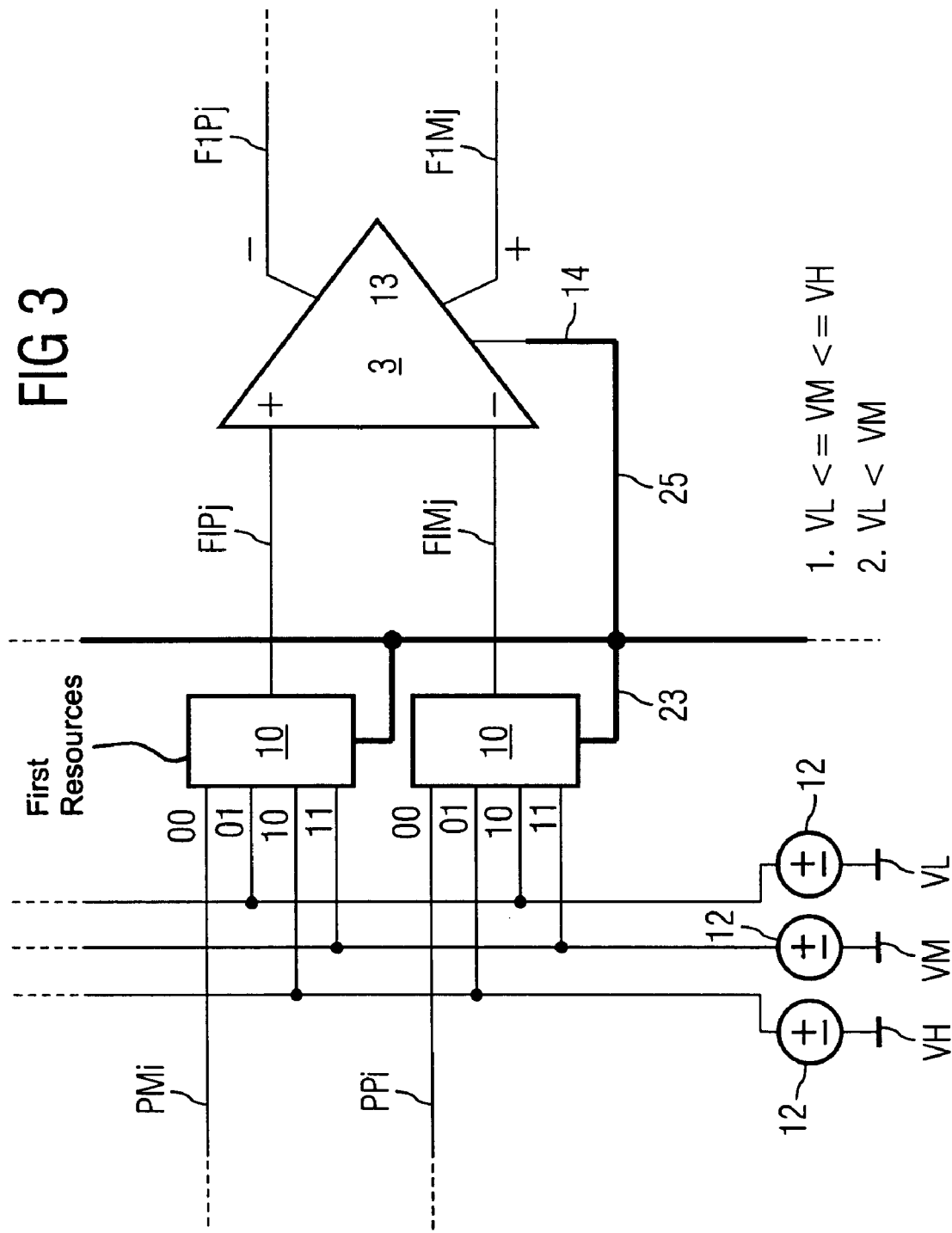
FIG. 3 shows a representation to explain the method of working of a first resource of FIG. 2 with corresponding signals.

The four operating states or effects in the case of the folding converter, and the assigned auxiliary potentials, are shown in FIG. 3 as an example. In the first operating state "00", inputs FIPj and FIMj of block 3, which is part of the first folding stage, are connected to the signals PPi and PMi coming from the preamplifiers, which is necessary for normal operation. The other three operating states are necessary for the self-calibration method. In the second operating state "01", FIPj is connected to VL and FIMj is connected to VH, so that the result is a negative control of the differential amplifier located in block 3. In the third operating state "10", FIPj is connected to VH and FIMj is connected to VL, so that the result is a positive control of the differential amplifier located in block 3. The purpose of these last two operating states is, during the self-calibration method, to bring those circuit parts which are not to be calibrated into defined states, in such a way that they cannot have a damaging effect on the signal path which proceeds from the circuit parts to be calibrated. At the start of the signal path, the state "11", in which FIPj and FIMj are connected to the same potential, is used, so that an equilibrium state, which can be brought to setpoint by the second resources, is created. This equal potential is VM here, which is fed via the fourth input of the first resources. However, such a fourth input is then unnecessary, for instance, if the common-mode rejection of block 3 is sufficiently good that in the fourth position of the first resources, instead of VM one of the two auxiliary voltages VH or VL can be used to set up an equilibrium state. The identifiers of the first resources can therefore be seen in the four different operating states or effects on the stage which they affect, and not in their input number. The fact that the auxiliary potential VM can be omitted and replaced by VL or VH also results from the relationships which are written in FIG. 3.

The second resources 13 within the circuit stages with first resources make it possible to reset the equilibrium state within the circuit stages via control inputs 14. The presence of the second resources within a symbol is shown by a smaller number "13" next to the larger type number of the symbol 2, 3, 4 or 6. However, even without explicit representation of the number "13", it should be assumed that all symbols of which the inputs are connected to first resources 9, 10, 11 have second resources according to the invention.

This convention makes it possible to omit the "13" in later representations, to avoid overloading them unnecessarily with details. Some particularly advantageous circuit implementations of these second resources are shown later.

The third resources 15 on or in the comparators make it possible to be able to analyze the state of the comparator without this information being falsified by the logic which follows the comparator. These third resources can be additional outputs on the comparator, or resources for direct observation of individual comparator outputs, e.g. a multiplexer which comprises tristate drivers, and which selects individual comparator outputs and feeds them to bus lines. Depending on whether the self-calibration method according to the invention is implemented using digital or analog actuators within the second resources, different versions of the third resources result, and some particularly advantageous examples of them are represented later. Not shown in the figure is the possible implementation of the third resources in the case of digital implementation of the calibration method, where the signals 19 are tapped within the logic which follows the comparators, e.g. at node 21, or at the output of the ROM or encoder, e.g. at node 22.

This variant assumes that the stated logic has additional links, which prevent the signals which are observed at 19 by the self-calibration method from being affected by unselected comparators. However, these additional links have the disadvantage that it becomes more complex and therefore slower. Arranging the third resources on the comparators is the best solution, since it results in the best possible total precision of self-calibration and the lowest cost. Conceivably third resources could be assigned to each calibratable stage, but this would have the disadvantage that the third resources themselves would then have to be calibrated to achieve the required precision.

The fourth resources 20 control the self-calibration method according to the invention, by setting the first and second resources via control lines 18 and receiving and analyzing the effect of the setting actions via signal lines 19. As is shown later, these fourth resources have a digital controller, which controls the sequence of the calibration method according to the invention, and further variant-specific aids which are each technically necessary for this purpose.

Depending on the requirements placed on the folding ADCs, the first and second resources must be provided at the preamplifiers only—low requirements—or at the preamplifiers and the first folding stage, or at the preamplifiers and the first and second folding stage, or at all stages including the comparators—highest requirements—, because if the errors of subsequent stages are sufficiently small to fulfill the requirements of the folding ADC even without these resources, the additional cost which is associated with them does not have to be incurred. This possibility of introducing the resources according to the invention only in the stages which are nearest to the input, and omitting them from a specified stage onward, results from the fact that in general the stages are designed so that they amplify the signal, so that, for instance, offset errors of subsequent stages have an effect which is reduced by the factor of the amplification of the preceding stages. Use is made of this fact even for the design of folding ADCs which are purely based on matching without self-calibration, so that it is unnecessary to introduce the resources according to the invention in every case in every stage. For instance, the resources according to the invention can conceivably be provided for preamplifiers and comparators only.

There are also folding ADCs with a single-stage structure of the folding stage [1], with a combination of the preamplifiers with the folding, etc., with cascaded folding with more than two folding stages, with and without an interpolator, with and without an averaging network, etc., and in all cases the invention can be used as it is.

Examples of implementations of the resources according to the invention are shown in FIGS. 4 to 10.

Figure 4:
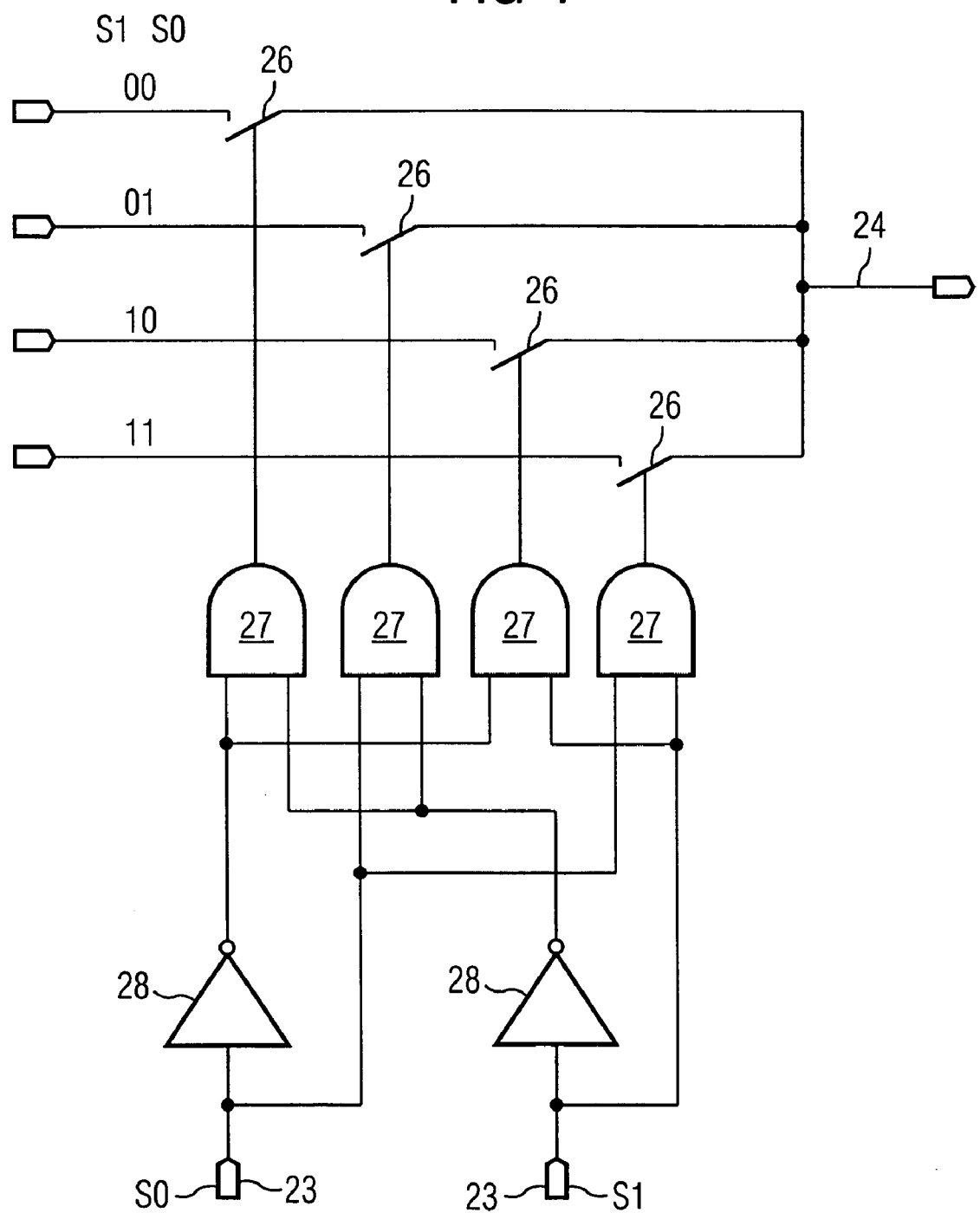
FIG. 4 shows a circuit diagram of a version of the first resource.

FIG. 4 shows as an example an implementation of the first resources for folding stages. Via digital control inputs 23, marked S0 and S1, one of the four effects is selected and decoded via the decoder, which comprises AND gates 27 and inverters 28. The outputs of the decoder are connected to controllable switches 26, so that for each effect, one of the four inputs of this first resource, which is an example, is switched to the output 24. As was mentioned above, the identifier of the first resources comprises the abovementioned at least four effects which can be set, so that even fewer inputs and controllable switches would be enough. A principle which is useful here is shown below using the example of the first resources for the first stage in FIGS. 13 and 14. According to this principle, the first resource from FIG. 4 can be implemented with less than four inputs or more than four effects, e.g. for further purposes for the production test.

Figure 5A:
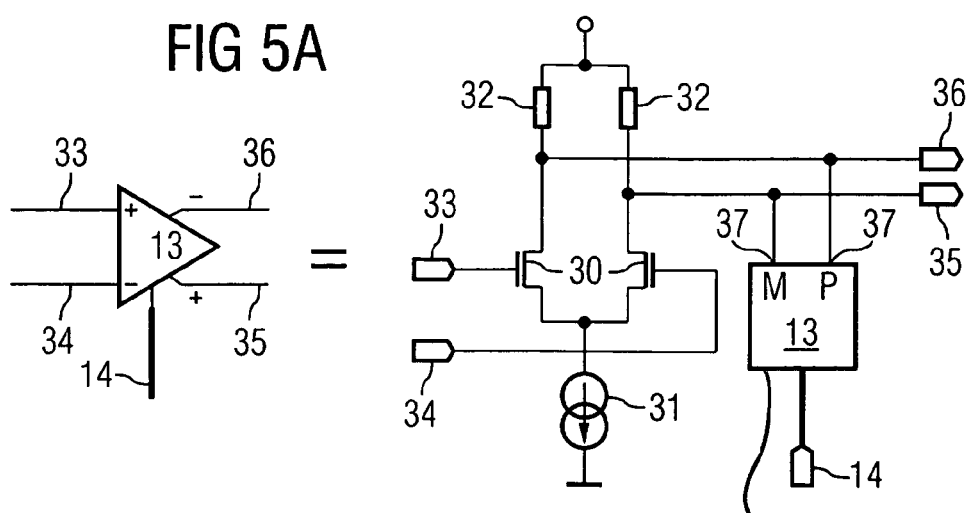
FIGS. 5a to 7 show circuit diagrams of differential amplifiers with second resources of FIG. 2.
Figure 5B:
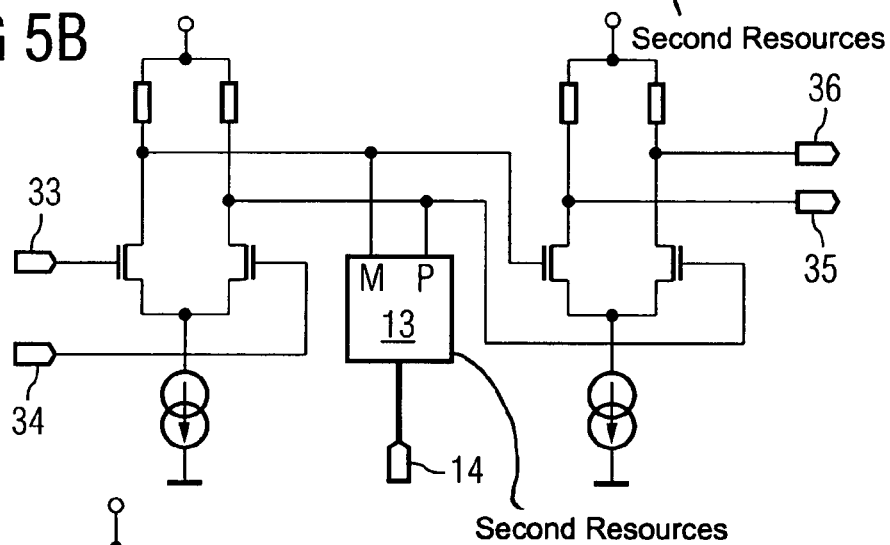
Figure 5C:
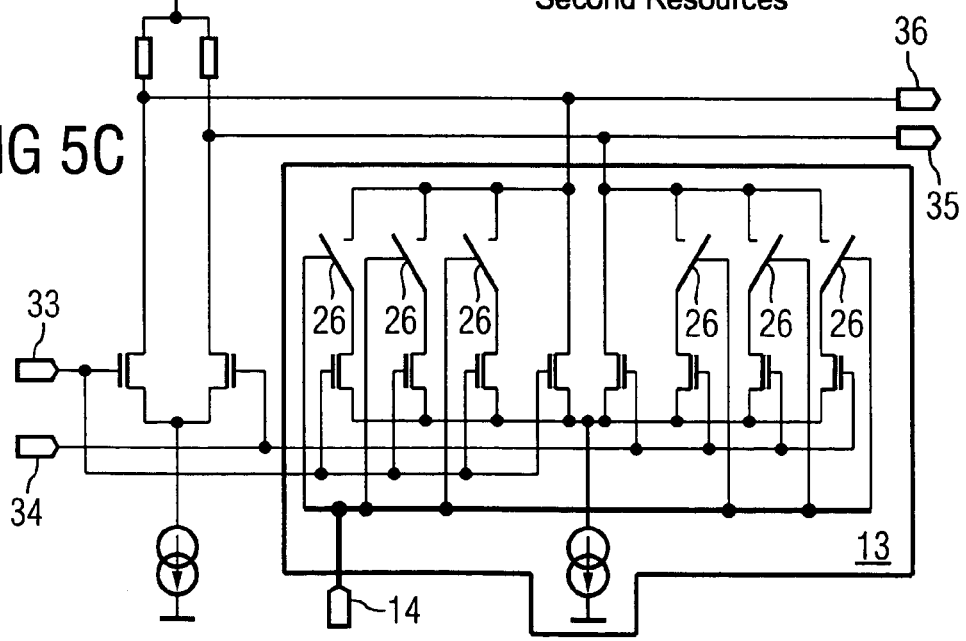

FIGS. 5a to 5c each show as an example a typical internal circuit of preamplifiers 2 and folding stages 3, 4 which are equipped with second resources 13 according to the invention. Inputs 33 and 34 of the preamplifiers according to FIG. 5a lead to a differential pair 30 with bottom-end current source 31. The outputs of the differential pair lead to load elements 32. Load elements may be resistors as shown in these figures or active circuits (e.g. [3]). The common nodes of the outputs of the differential pair and the load elements lead to the outputs of stage 35, 36. The second resources 13, with their outputs 37, are also connected to these nodes, which are connected to outputs 35, 36. Their function, controlled by the inputs 14, is to draw an adjustable current from the connected nodes at the outputs 37. Via the load elements, this current has the effect of displacing the equilibrium state of the stage, i.e. its equilibrium state can be set via the inputs 14. Since in the case of folding stages, a plurality of these basic circuits are connected in parallel to the outputs, it is necessary not to allow the second resources to affect the outputs directly in this case. FIG. 5b shows a particularly suitable circuit for folding stages, with the advantage that the process of setting the second resources has no effect on the total current through the load elements which are connected to outputs 35, 36, the result being the possibility of a simplified implementation of the second resources, as is shown later in FIG. 7. Typical variants of these exemplary basic circuits would be, apart from the previously mentioned use of active circuits as load elements, fitting cascodes to the output of the differential pairs, or for low supply voltages a folding of the circuit structure, as it is known in itself as "folded cascode", but solutions which do not include the second resource as a separate block, but combine it with the basic circuit, are also possible. FIG. 5c shows such an example, in which the second resource is implemented by a differential pair which can be digitally scaled via controllable switches 26.

Figure 6:
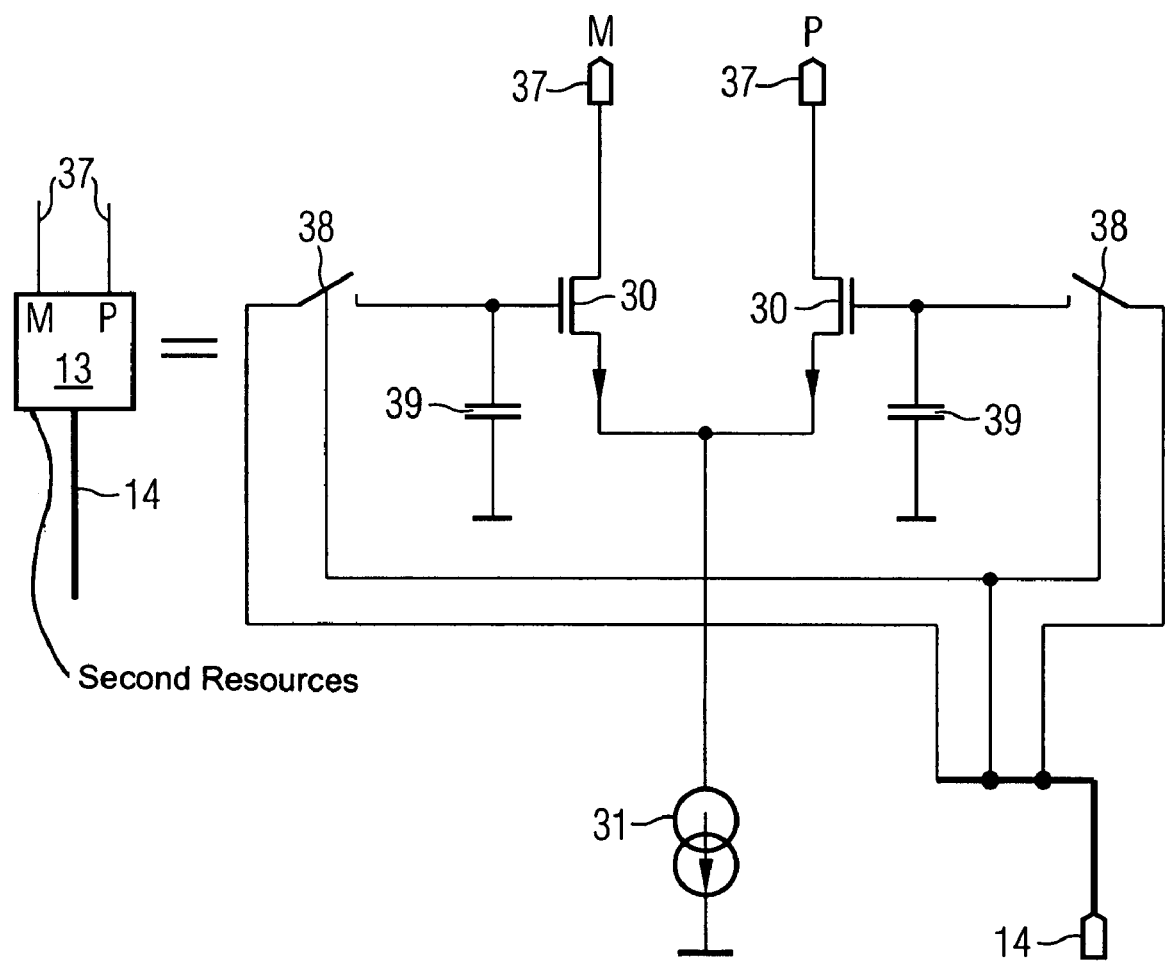

FIG. 6 shows as an example an implementation of the second resources according to the invention. It is particularly advantageous if the calibration information is not to be stored discretely as a digital value but as a continuous analog value. This also opens up the possibility of carrying out the part of the calibration process which brings the equilibrium to setpoint by closing a feedback loop as a transient phenomenon, which can be faster than the digital variant which is described later. In this analog variant, the second resources comprise a differential pair 30 with its bottom-end current source 31, the outputs of which lead to the outputs of the second resources 37. Holding capacitors 39 and sampling switches 38 make it possible to feed the analog signals fed from the inputs 14 to the holding capacitors and store them there. The two differential analog input signals can lead simultaneously to a large number of such stages, and a digital signal which is assigned to each stage takes over the closing and opening of the sampling switches of the stage which is being calibrated. As mentioned above for FIGS. 5a to 5c, this basic circuit can still vary, e.g. by cascodes being fitted.

Figure 7:
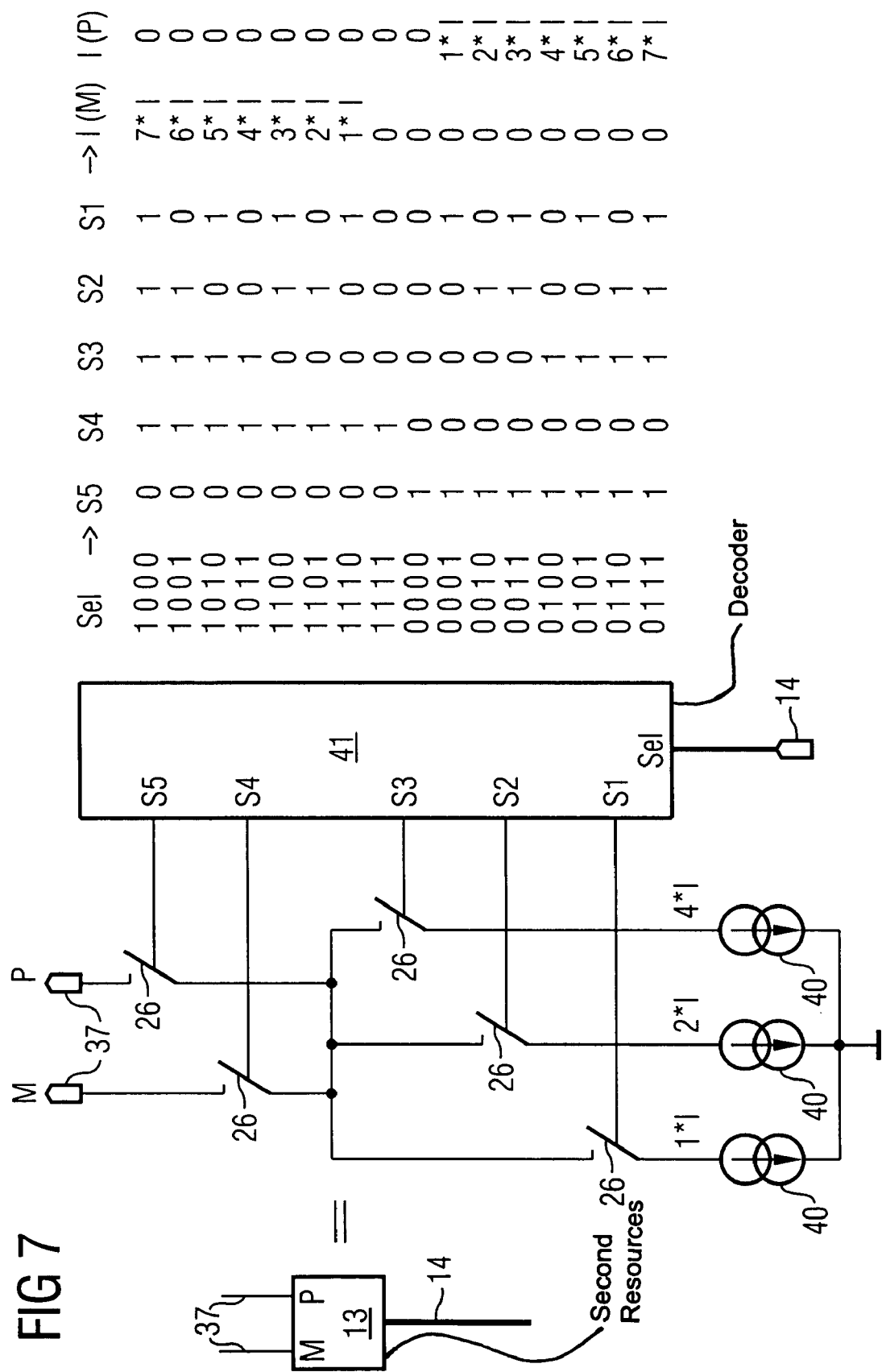

FIG. 7 shows as an example an implementation of the second resources according to the invention. It is particularly advantageous if the calibration information is to be stored digitally. This makes it possible to provide a relatively long operating time of the ADC between the calibration processes. Additionally, this digital variant makes it possible to carry out the calibration method in the background. For instance, every 100th quantization of the useful signal is suppressed, and instead, for one cycle, one step of the calibration method is implemented. In this way, the ADC can be calibrated continuously in operation, and effects such as temperature drift and 1/f noise on the equilibrium states are continuously compensated for. A system which is particularly suitable for this solution, comprising the self-calibrating ADC according to the invention and a digital filter which compensates for the gaps in the quantized data stream which result from the self-calibration steps, is the subject of a further patent application. The digital implementation of the second resources which is shown comprises weighted current sources 40, which can be switched to the outputs 37 of the second resource via controllable switches 26. A decoder 41, for which a truth table which is particularly advantageous because it is simple to implement is also given in the figure, decodes the digital input signals 14 and controls the controllable switches 26 (1=on) in such a way that a current which is adjustable in eight steps is switched to one output or the other (marked M and P in the figure) of the second resource. In this way, the equilibrium state can be reset in either direction. The current I of the weighted current sources must be chosen so that the expected errors in the equilibrium state can be set to setpoint in every case. In general, this current is less by orders of magnitude than the current of the bottom-end current source of the differential pair of the stage which the second resources affect. The digital setting signals can be stored at a central point, e.g. within the fourth resources, or locally at the second resources, by adding a register which is not shown in the figure because of these two existing possibilities. The solution with local storage of the calibration information is above all particularly advantageous if a large number of second resources have to be operated, so that in total a large number of signal lines to the inputs 14 would be required. Addressable registers, which are arranged locally near the second resources in each case, and are operated via a common address, data and control bus, for digital storage of calibration information, are in this case the most advantageous solution. The prior art knows the further resources and methods necessary for this from the technology of read/write memory (RAM), so that these do not have to be represented further here. Variants of this basic circuit can comprise additional current sources, switches or an arrangement of current mirrors, to obtain, instead of the asymmetrical currents which are implemented in the example because one is always zero, a symmetrical current, in which the sum of the currents is always equal. This action would be advantageous if the common-mode rejection of the subsequent stage was too bad, so that this would be detuned by the calibration of the preceding stage. However, in practice this is rarely the case, so that the basic circuit which is represented as an example is enough. Since the 2×8 stages of the example can reduce the error of the equilibrium state to ⅛ of the uncalibrated case, and thus reduce the area of the elements of the differential amplifier which is necessary for matching to 1/64th, in practice the four-bit adjustment range of the example is generally sufficient.

FIG. 8 shows an implementation of the third resources as an example, which is particularly advantageous if the calibration information is to be stored in analog form. In this case, it is useful to create an analog feedback loop, to bring the respective equilibrium state, to be calibrated, via the second resources according to FIG. 6 to setpoint. For this purpose, the differential analog signal which resides in the comparator must be tapped before the clocked part 42 of the comparator. Usually the comparators contain, before the clocked part, a differential amplifier stage 30, 31, 32, the bandwidth of which is a limiting factor for the overall performance of the ADC, and therefore as far as possible should not be made worse by additional capacitive loads. Additionally, if the differential signal was directly connected to a bus 19, via which it would be fed to the second resources, the effect would be a harmful pole in the transfer function, which can make the compensation of the frequency response of the feedback loop very difficult. A particularly advantageous circuit solution to this problem is shown in FIG. 8. The bus 19, which leads from the third resources to the fourth resources, to be subjected there to the frequency response compensation which is shown later, and which affects the second resources after this compensation circuit, is fed here via particular, switchable source followers, which form the third resources 15. Their feed current sources 47 can be arranged at a central point, so that a pair of these current sources is enough. The particular switchable source followers comprise MOSFETs 44, 45 and 46, and are operated via a control line 55, which in the example branches away from the inputs 14 which lead to the second resources 13 of the stage only because this is the appropriate bus in the circuit diagrams of the higher levels; otherwise, the control signal could be fed in any other way. If this control line 55, which leads to the gates of 45 and 46, is at a high potential, the P-channel MOSFETs 45 block, and the N-channel MOSFETs 46 pull the gate of the source follower MOSFETs 44 to low potential, so that they block and do not affect or load the bus 19. Since in this case the MOSFETs 45 do not form a channel, the capacitive load of the internal nodes of the comparator is very low, eparticularly as these MOSFETs 45 are designed to be as small as possible. The result in normal operation is no negative effect on the comparator. In calibration operation, on the other hand, the control line 55 for the comparator to be selected is set to low potential. In this case, the MOSFETs 46 block and the MOSFETs 45 conduct, so that the gate of the source follower 44 is connected to the internal nodes of the comparator. These are thus connected via the source follower 44 to the bus 19.

Figure 9:
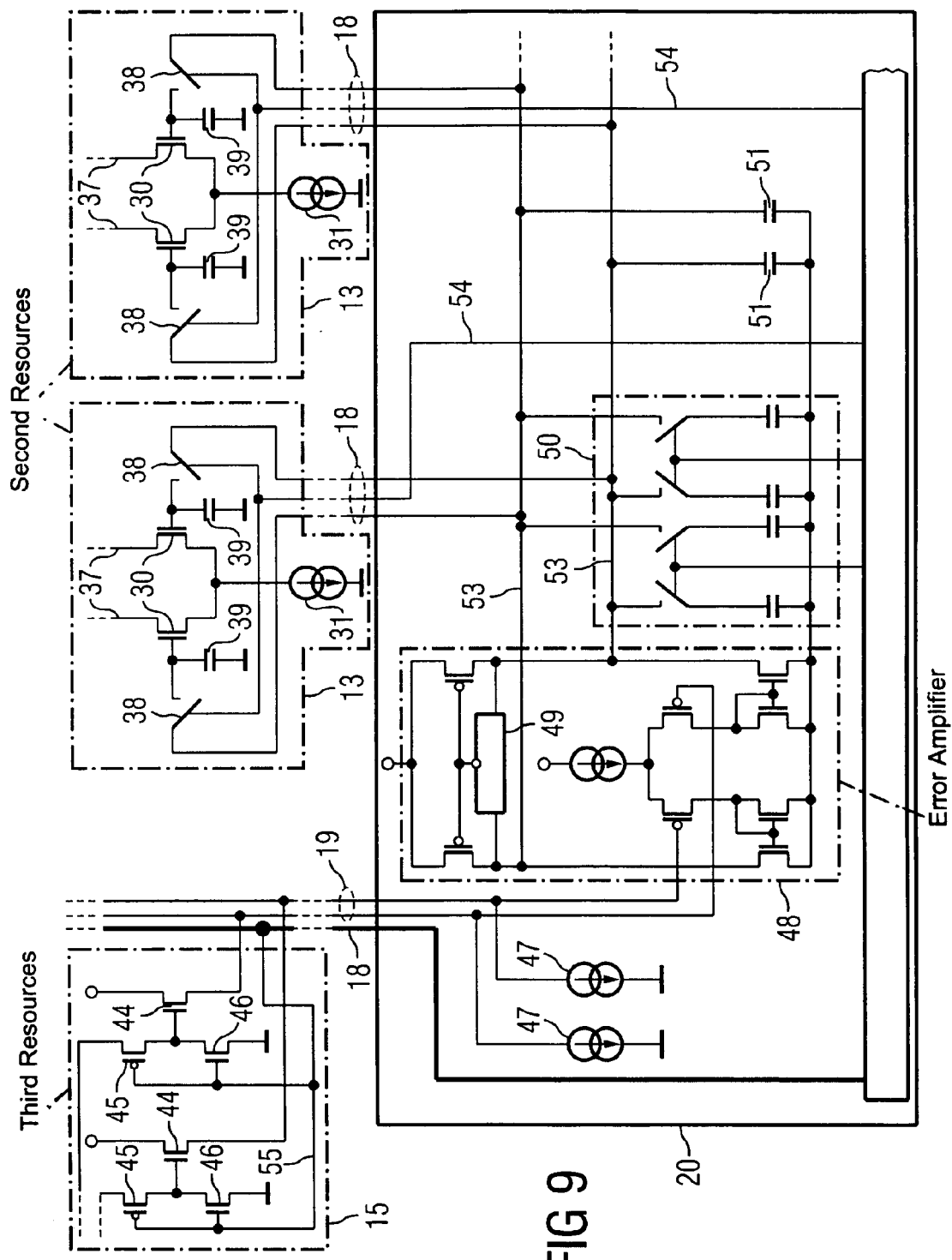
FIG. 9 shows a circuit diagram to explain an analog self-calibration method.

FIG. 9 shows as an example how the analog self-calibration can be implemented in a particularly advantageous way. Here, within the fourth resources 20, all auxiliary circuits which are necessary for this purpose are arranged. A fully differentially constructed error amplifier 48 with common-mode regulation of the outputs 49 (common-mode feedback) processes the differential signal which is fed via the bus 19 from the third resources 15, and which is connected to the bus 19 by the control lines 55 which lead to the third resources 15 from a control bus 18. Switchable compensation capacitors 50 and fixed compensation capacitors 51, together with the high output impedance of the error amplifier at its outputs 53, generate the dominant pole which is required for the stability of the feedback loop. Even the otherwise parasitic capacitance of the buses 18 which lead from the fourth resources to the second resources contributes its share advantageously to the compensation in this circuit arrangement. The purpose of the switchable compensation capacitors 50, depending on the number of stages in the feedback loop and thus a changeable total amplification in the feedback path, is to make the compensation necessary in each case adjustable, so that the result in every case is an optimized settling time constant. It should be pointed out that the error amplifier and its compensation capacitors are necessary in any case, and that it is impossible to close such a feedback loop directly without both these resources being included in it. It is therefore particularly advantageous for reasons of area to implement both these resources once at a central point for each feedback loop to be operated simultaneously, instead of having to add them to each second resource, and only the inventive total arrangement of these resources and their particularly advantageous basic circuits according to FIGS. 6, 8 and 9 make this possible, and are the basis of a subclaim of the invention. As well as these analog auxiliary circuits, there is among the fourth resources a digital controller 52, which internalizes the self-calibration method according to the invention and controls its execution by the first, second and third resources. The sampling switches of the second resources are controlled via the control lines 54, which are assigned to the buses 18.

Figure 10:
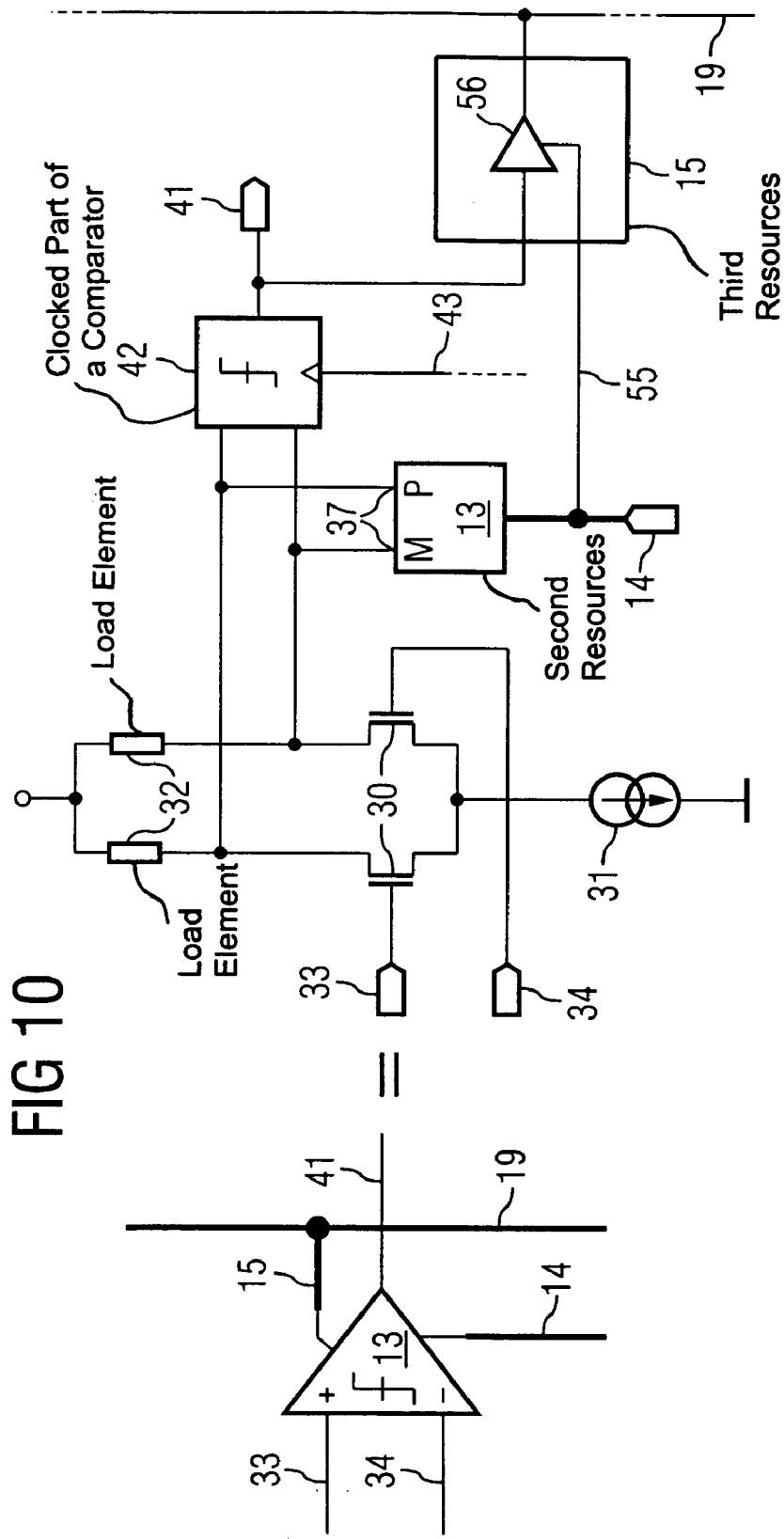
FIG. 10 shows a circuit diagram of the third resource in the case of digital storage of the calibration values.

FIG. 10 shows as an example how the third resources 15 can be implemented particularly advantageously in the case of digital storage of the calibration values. In this case, it is useful to use all stages of the comparator, to clock them, and to tap the digital signal after the clocked part of the comparator 42 at its output 41. Here a tristate bus driver 56, the output of which leads to the bus 19 and which is connected via control line 55 to bus 19, is connected. If this bus has multiple signal lines, for instance, then multiple stages can also be calibrated simultaneously, provided that these have unique signal paths to the comparators, but for contemporary architectures of folding ADCs this is only possible in individual cases. A possible way, which was mentioned above, of implementing the third resources according to the invention after the outputs of the bubble gates, ROM or encoder is not as advantageous as the solution in FIG. 10, because in each case it means an additional cost, and complicates and slows down the bubble gates, ROM or encoder, because these must then have additional links to prevent other comparators from frustrating the intended observation of the output of the selected comparator in calibration mode.

FIGS. 11 to 19 show as an example how the first resources of the preamplifiers can be implemented. For this purpose there are numerous variants, which depending on the situation can be particularly advantageous or not. In the simplest case, which will not be represented by a figure because of its triviality, it would be sufficient that these resources would only be capable of bringing the preamplifiers into an equilibrium state because their first input, which is connected to the input signal of the ADC, can be switched to a node which corresponds to the potential of their second input, the second input remaining permanently connected to the reference chain.

This trivial case can be implemented, for instance, by a controllable switch, which connects the first input to either the input of the ADC or the second input, corresponding to two effects of the first resources.

For the case that the preamplifiers are combined with the folding stage, the first resources of the preamplifiers must, as already mentioned further above, be provided [lacuna] the first resources according to the invention for folding stages. This follows because here the preamplifiers also carry out a folding operation. However, the first resources according to the invention for folding stages have the identifying property of the at least four effects. In the case of the preamplifiers, the first stage of the folding ADCs, compared to the implementation of the first resources for pure folding stages according to FIG. 4 here different possibilities for advantageous reduction of the circuit cost have been found, however, and are expressed in a subclaim of the invention.

Figure 11:
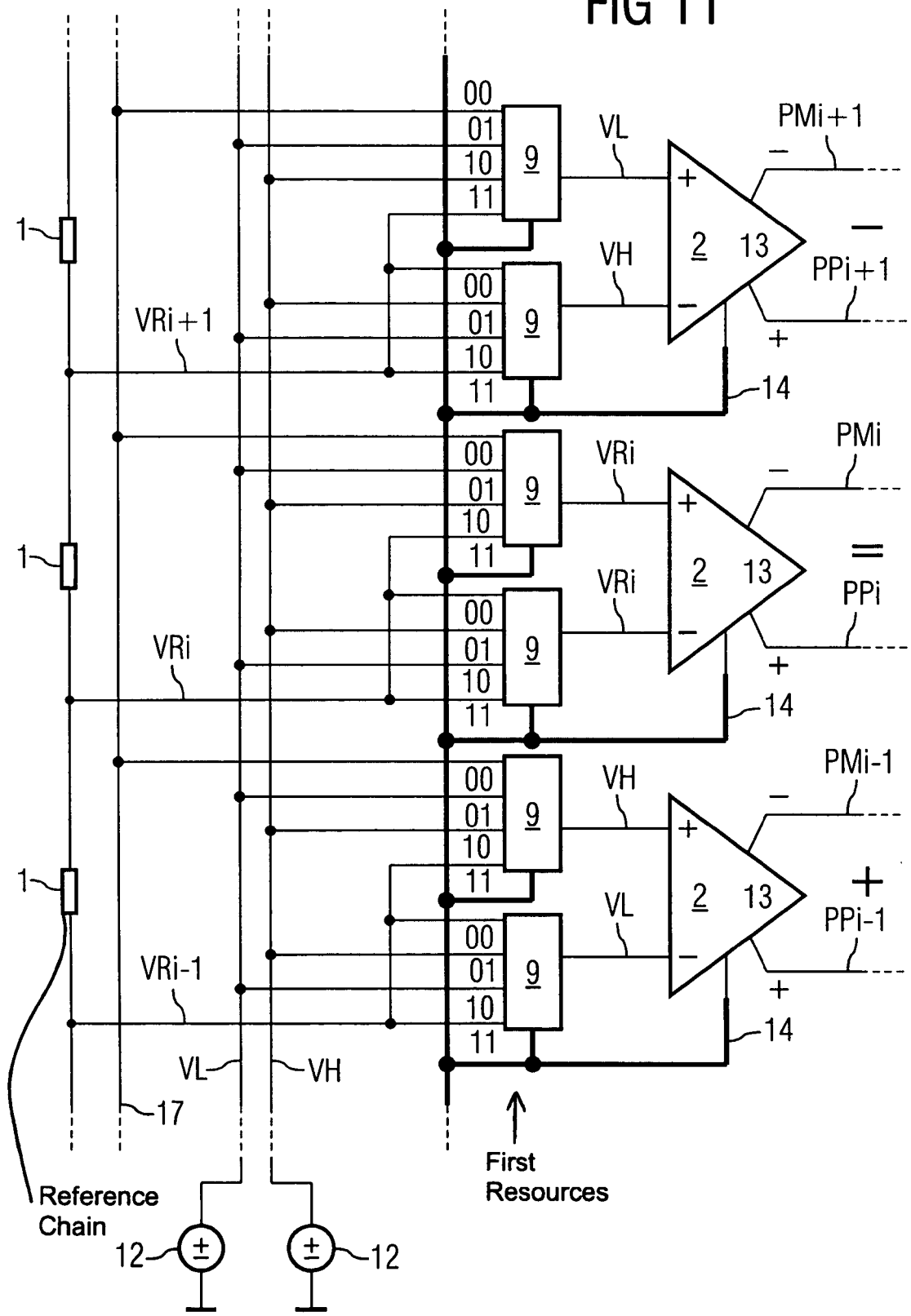
FIGS. 11 to 19 show circuit diagrams of further versions of the first resource.

FIG. 11 shows as an example how the direct, linear implementation of the invention according to the teaching which has been disclosed previously could be implemented without attempting to reduce the circuit cost. The first resources which are known from FIG. 4 are before the preamplifiers, but are marked 9, because here they are assigned to the preamplifiers.

In a first operating state 00, they connect the first input, marked plus, of the preamplifier 2 to the input signal 17 of the ADC, and the second input, marked minus, to the tap VRi+1, VRi or VRi−1, which is assigned to the preamplifier, of the reference voltage divider 1. This operating state implements the first effect of the first resources, which is used for normal operation and during the calibration process.

In a second operating state 01, the first input is connected to a low auxiliary voltage VL, and the second input is connected to a higher auxiliary voltage VH, which are both derived from voltage sources 12. In this case, the result is a negative control of the differential outputs PMi+1 and PPi+1 of the preamplifier, symbolized by minus in the figure. This implements the second effect of the first resources, which is used during the calibration process.

In a third operating state 10, the first input is connected to a higher auxiliary voltage VH, and the second input is connected to a lower auxiliary voltage VL. In this case, the result is a positive control of the outputs PMi−1 and PPi−1 of the preamplifier, symbolized by plus in the figure. This implements the third effect of the first resources, also for the calibration process.

In a fourth operating state 11, the first and second inputs are connected to the tap VRi+1, VRi or VRi−1, which is assigned to the preamplifier, of the reference voltage divider 1, resulting in an equilibrium state at the outputs PMi and PPi, symbolized by an equals sign in the figure. This implements the fourth effect of the first resources, which is used during the calibration process, if this equilibrium state is to be taken to setpoint by the second resources.

In this figure, it is assumed that the first resources of the stages, from top to bottom, are in operating states 01, 11, 10. This variant is the easiest to understand, and is particularly suitable for disclosing the principle, but a practical implementation is particularly advantageous only if all stages of the folding ADC are to be constructed identically on the modular principle, to save drafting and layout costs. Otherwise, its circuit cost is greater than necessary.

Figure 12:
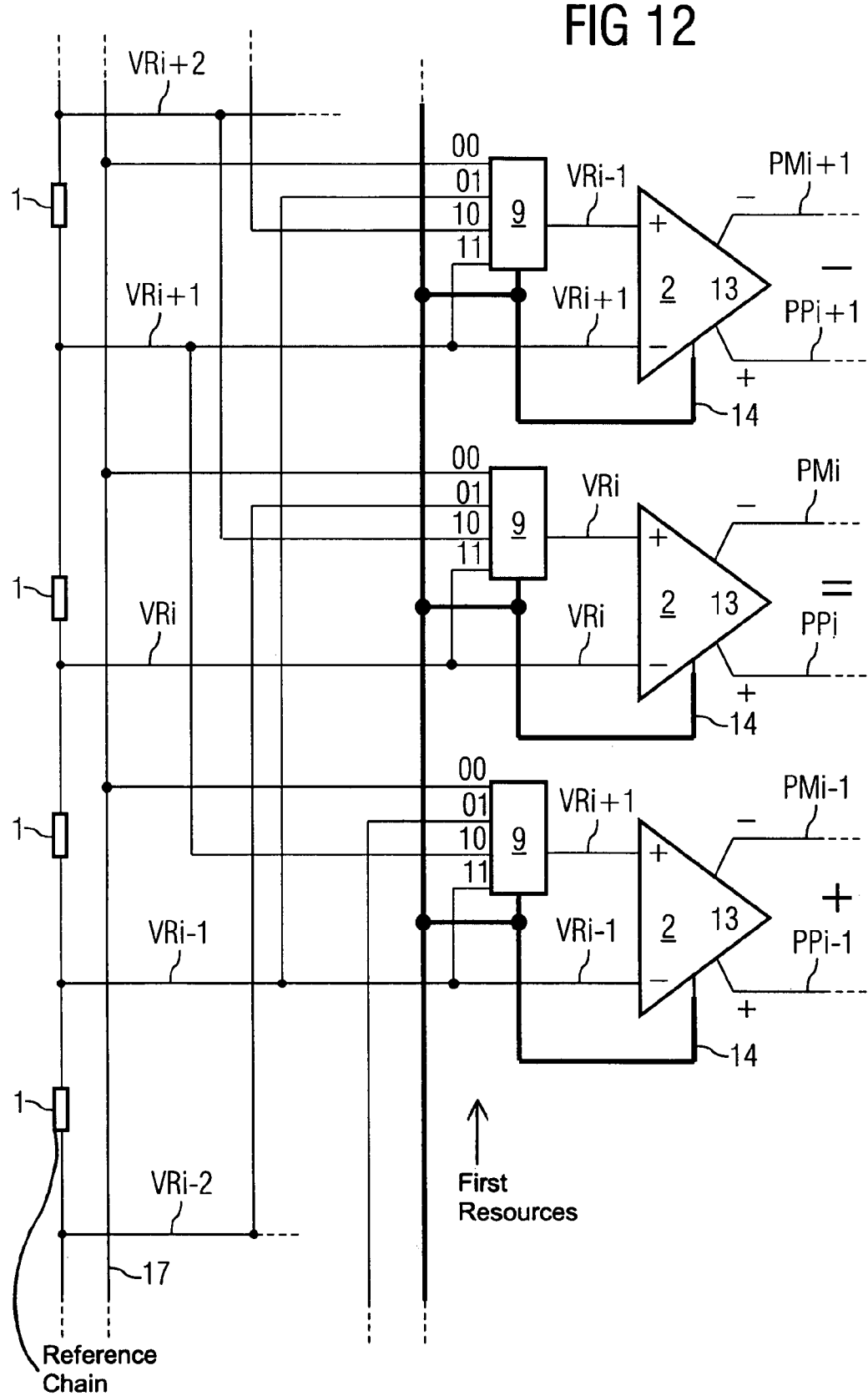

FIG. 12 shows as an example an implementation possibility with lower cost, which represents a particular advantage. Here, the implementation of first resources on the second input of the preamplifier has been omitted. Instead of the auxiliary voltage sources 12 of FIG. 11, which are also omitted, for each stage respective suitable potentials are tapped from the reference chain, to achieve the four effects of the first resources. A possible variant would be the use of even more distant taps in each case, e.g. VRi–2 or VRi–3 instead of VRi–1 for the top preamplifier, and correspondingly for the others, to achieve stronger control.

Figure 13:
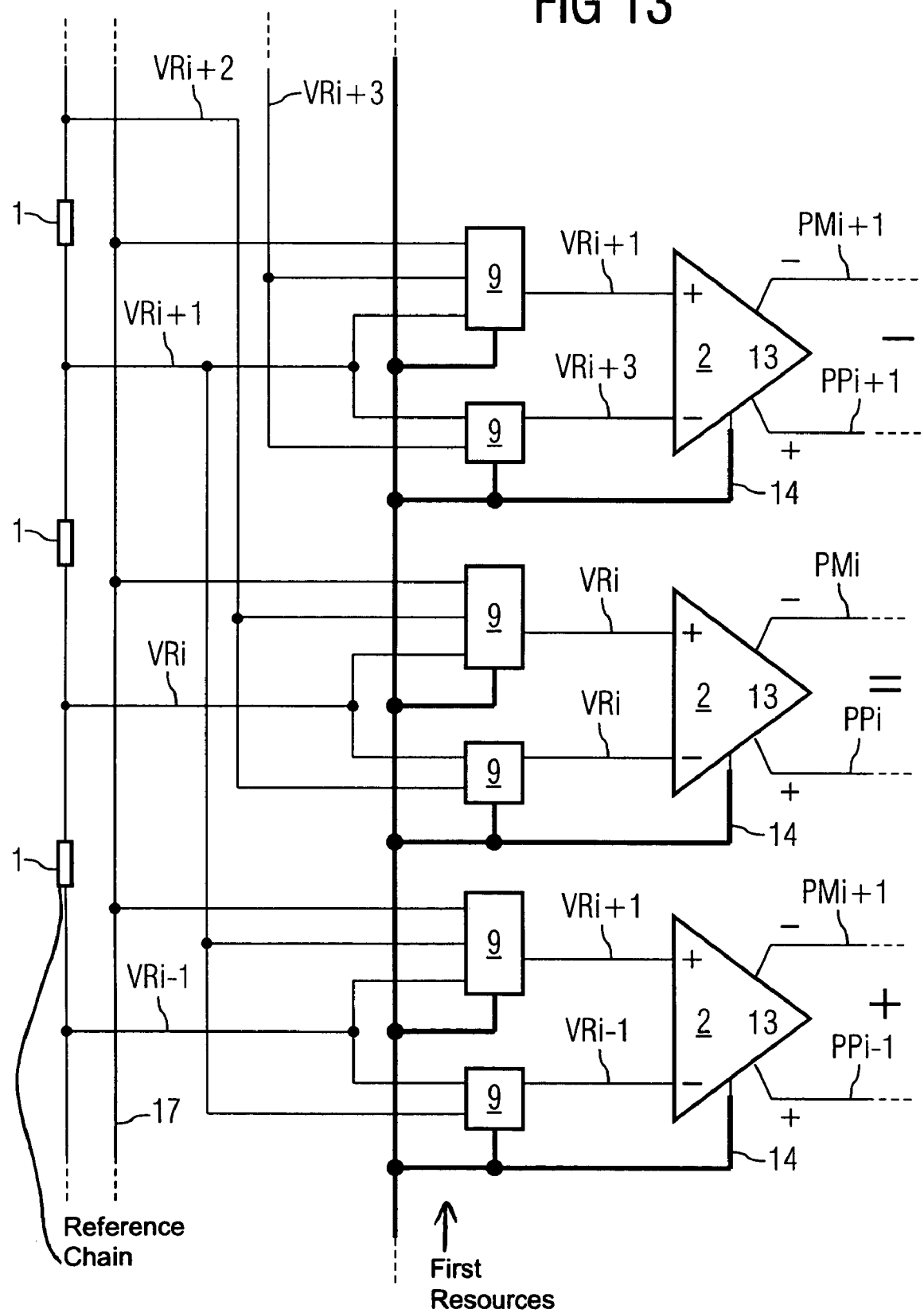

FIG. 13 shows a possible variation of FIG. 12, in which first resources with less than four inputs are used to achieve the at least four effects which identify them. This example is admittedly not advantageous in practice because it is more expensive than the previous example, but it illustrates the possibility in principle of managing with fewer than four inputs for the first resources, so that the number of their inputs cannot be an identifying property of the first resources, but only the number of their operating states or effects.

Figure 14:
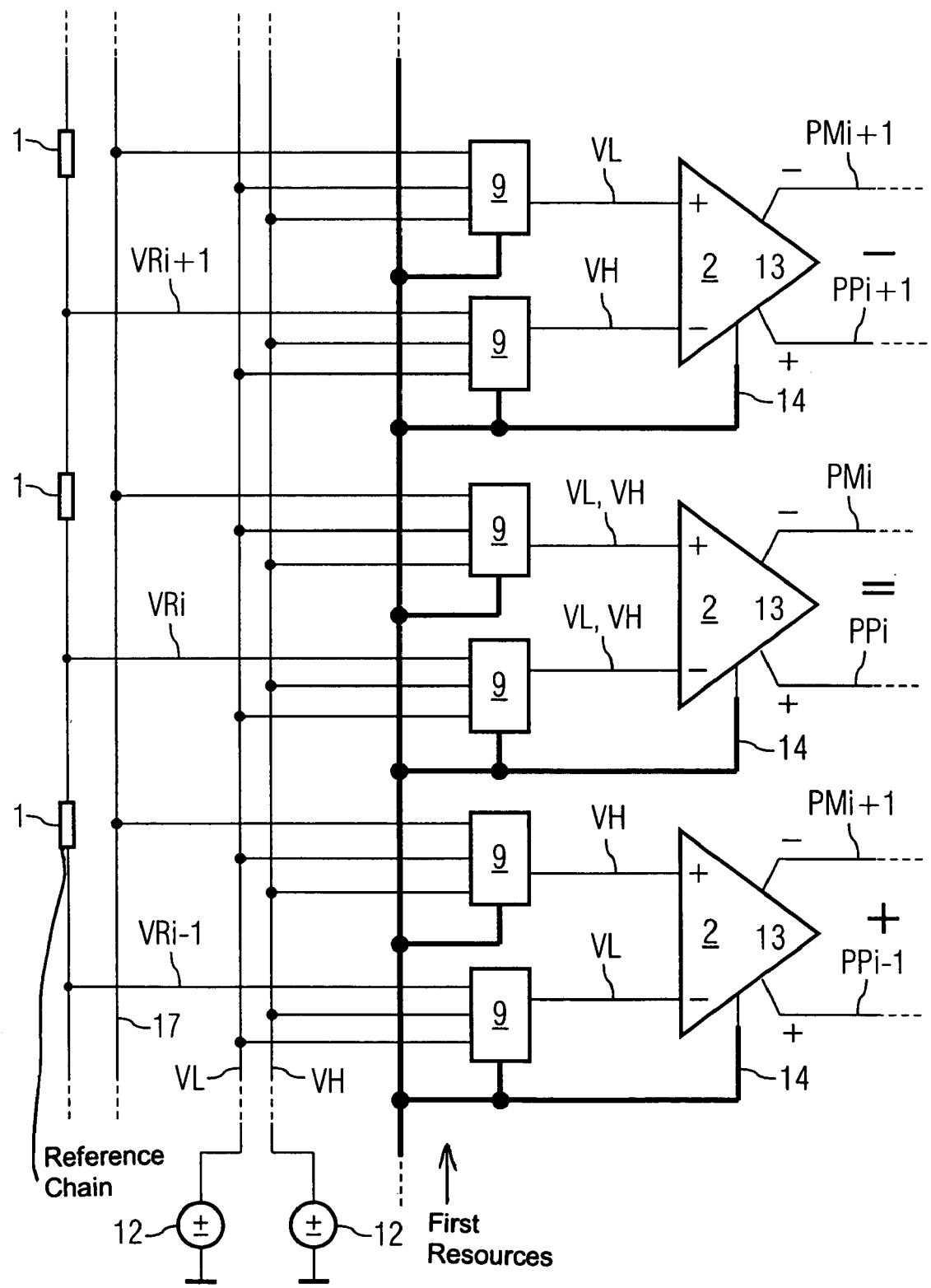

Finally, FIG. 14 shows, on the basis of a section from FIG. 2, the variant which was shown there of the version of the first resources with three inputs each. The equilibrium states are achieved here by simultaneous feeding of either VL or VH to both inputs of the preamplifier. This variant leads to a particularly simple and therefore advantageous layout, but it requires preamplifiers with high common-mode rejection of the inputs.

Figure 15:
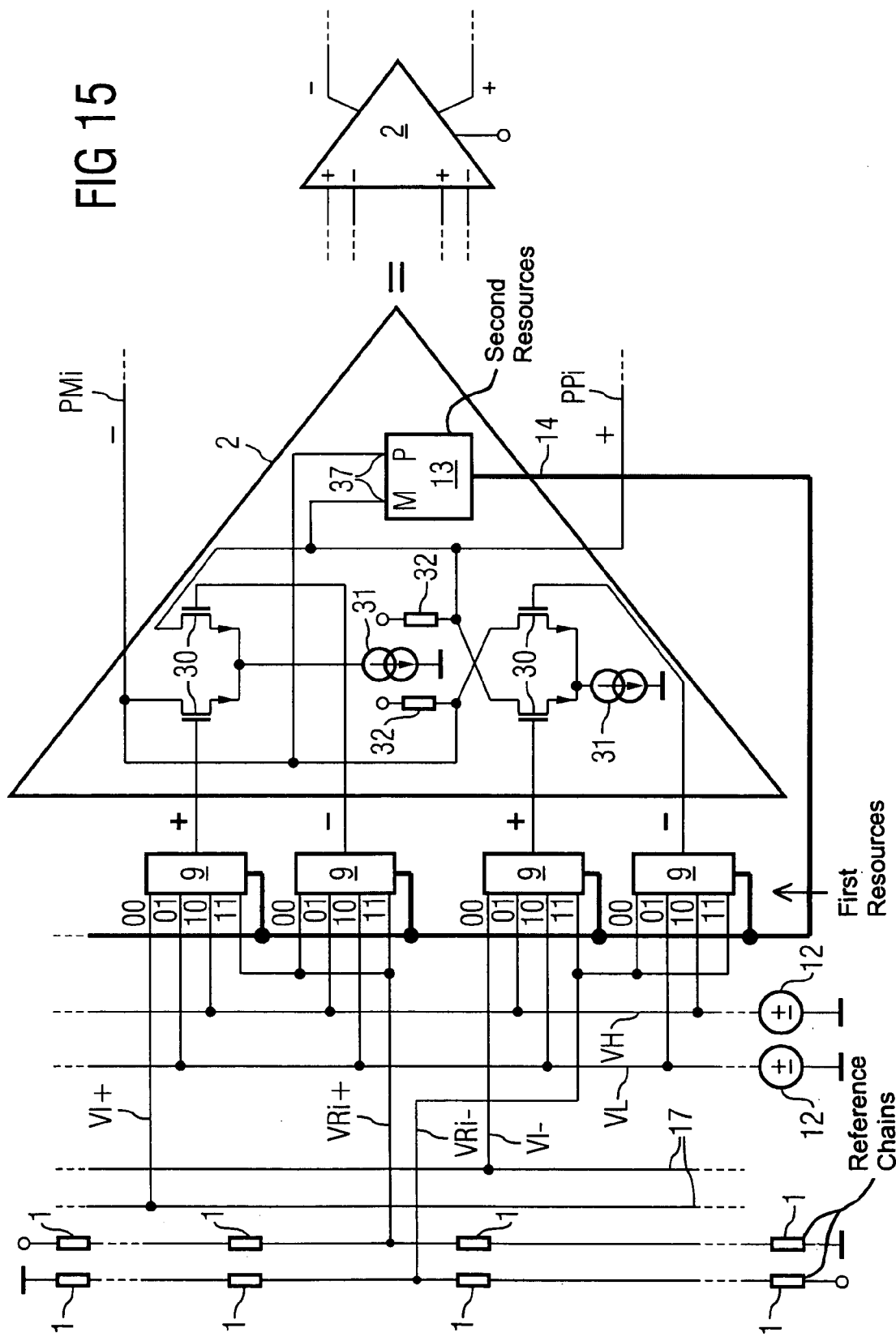

FIG. 15 shows as an example how the basic circuit of FIG. 11 can be extended in the case of a folding ADC with two differential inputs 17. For this purpose a duplication of the reference chain with opposite voltages is advantageous, which contributes to a suppression of linear gradients within the reference chain. If this is unnecessary, the opposite reference potentials could also be tapped at a single reference chain, which however would result in a high wiring cost in the circuit diagram and layout, which is not advantageous. The preamplifiers 2 receive a pair of differential inputs, i.e. an additional differential pair, which affects the same load elements 32 as the first differential pair, is added with its bottom-end current source. This is a method, which has long been known to the prior art, of implementing fully differential input stages of ADCs. However, for the present invention it is relevant, and must be precisely observed, that the second differential pair usually affects the load elements in the opposite sense to the first differential pair, so that the inputs of the first resources 9 must correspondingly be connected in the opposite sense, so that the four effects according to the invention can be produced in the correct way. The purpose of FIG. 15 is to represent this complication, and illustrate the applicability of the invention even in this case. Corresponding to this example, the variants according to FIGS. 12 to 14 can also be extended to differential inputs.

Figure 16:
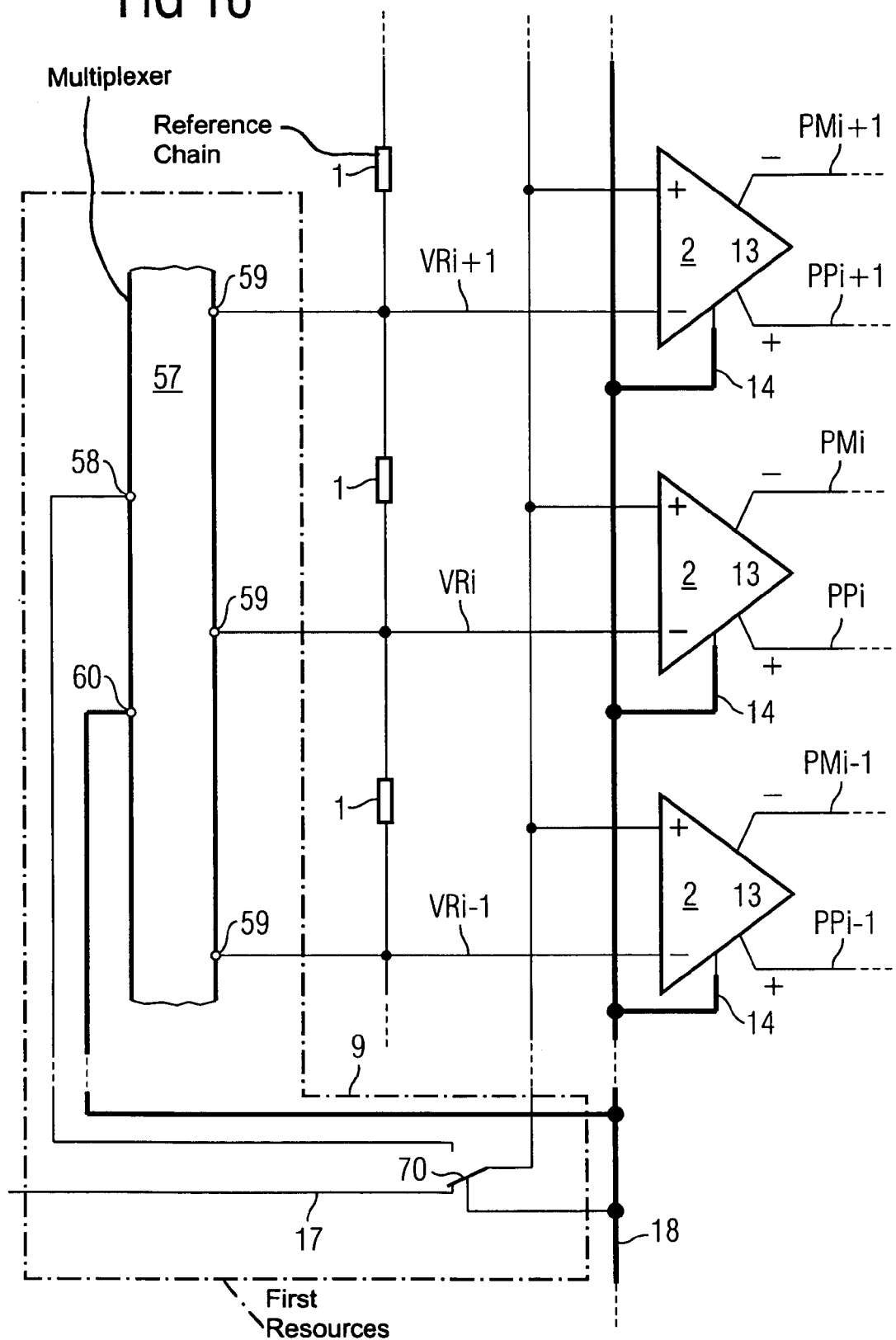

FIG. 16 shows as an example how the first resources according to the invention can be implemented in a particularly advantageous way at low cost in the case of genuine preamplifiers, which are restricted to this task, and therefore do not also have to carry out a folding operation, since this takes place exclusively in subsequent folding stages. The inputs 59 of a multiplexer 57 are connected to the taps of the reference voltage divider. The output 58 of the multiplexer is connected to a first input of a controllable switch 70. The second input of the controllable switch is connected to the input 17 of the ADC, and the output of the controllable switch leads to the first inputs of the preamplifiers 2, the second inputs of which are connected to the taps of the reference voltage divider. Via the multiplexer control input 60, which is connected to the control lines coming from the fourth resources out of bus 18, which also includes a control line for the controllable switch, in calibration mode a suitable potential can be selected from the reference voltage divider and connected to the second inputs of the preamplifiers via the multiplexer and switch. In this way, the equilibrium state to be calibrated can result for each preamplifier.

Figure 17:
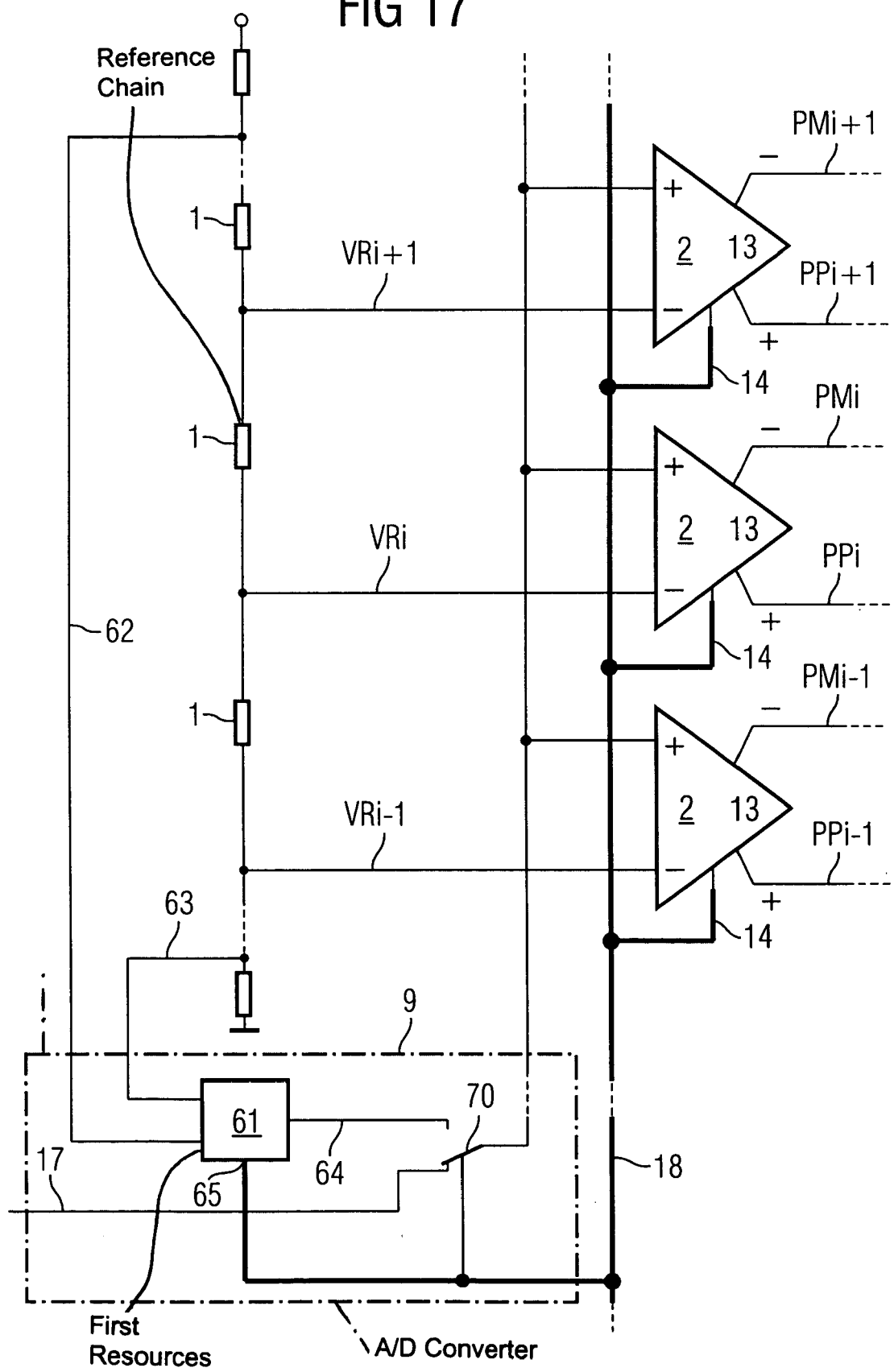

FIG. 17 shows a particularly advantageous and inventive variant of the idea from FIG. 16, the particular advantage of which is that mismatch errors of the individual taps of the reference chain can also be corrected by self-calibration. In contrast to a gradient, which can be largely suppressed by suitable layout actions, these errors are characterized in that the individual resistances between the taps are subject to statistical variations around a mean, and therefore—again according to the known matching laws—are not allowed to be less than a certain area. If the reference chain itself is to be designed with optimally minimized area, the resulting error quickly becomes too large, and can only be returned to the low value required by including the reference chain in the self-calibration. This occurs in an inventive way by using a digital/analog converter 61. This DAC obtains its top reference voltage 62 from the highest potential in the reference voltage divider chain 1, and its lower reference voltage 63 from the chain's lowest potential.

The output 64 of the DAC leads to a first input of the controllable switch 70. The input 17 of the ADC leads to the second input of the controllable switch. The output of the controllable switch leads to the first inputs of the preamplifiers 2, the second inputs of which are connected to the taps of the reference voltage divider. Via the control input 65 of the DAC, which are [sic] connected to the control lines 18, which also include a control line for the controllable switch, coming from the fourth resources, the DAC can be instructed in calibration mode to apply a correspondingly precise calibration potential via the controllable switch to the first inputs of the preamplifiers. The statistical errors, caused by mismatches, of the reference potentials at the taps of the reference voltage divider can then be minimized via the second resources, like any offset voltages of the input differential pairs and together with them. Implementing a sufficiently precise DAC is no problem to the prior art, since it does not have to work at high speed, and can therefore use slow but highly linear circuit technologies. In the case of calibration in the background, it is possible, for instance, that the DAC generates its output value over a longer period, in which the ADC works in normal operation, so that the output value is available immediately for an inserted self-calibration step.

Figure 18:
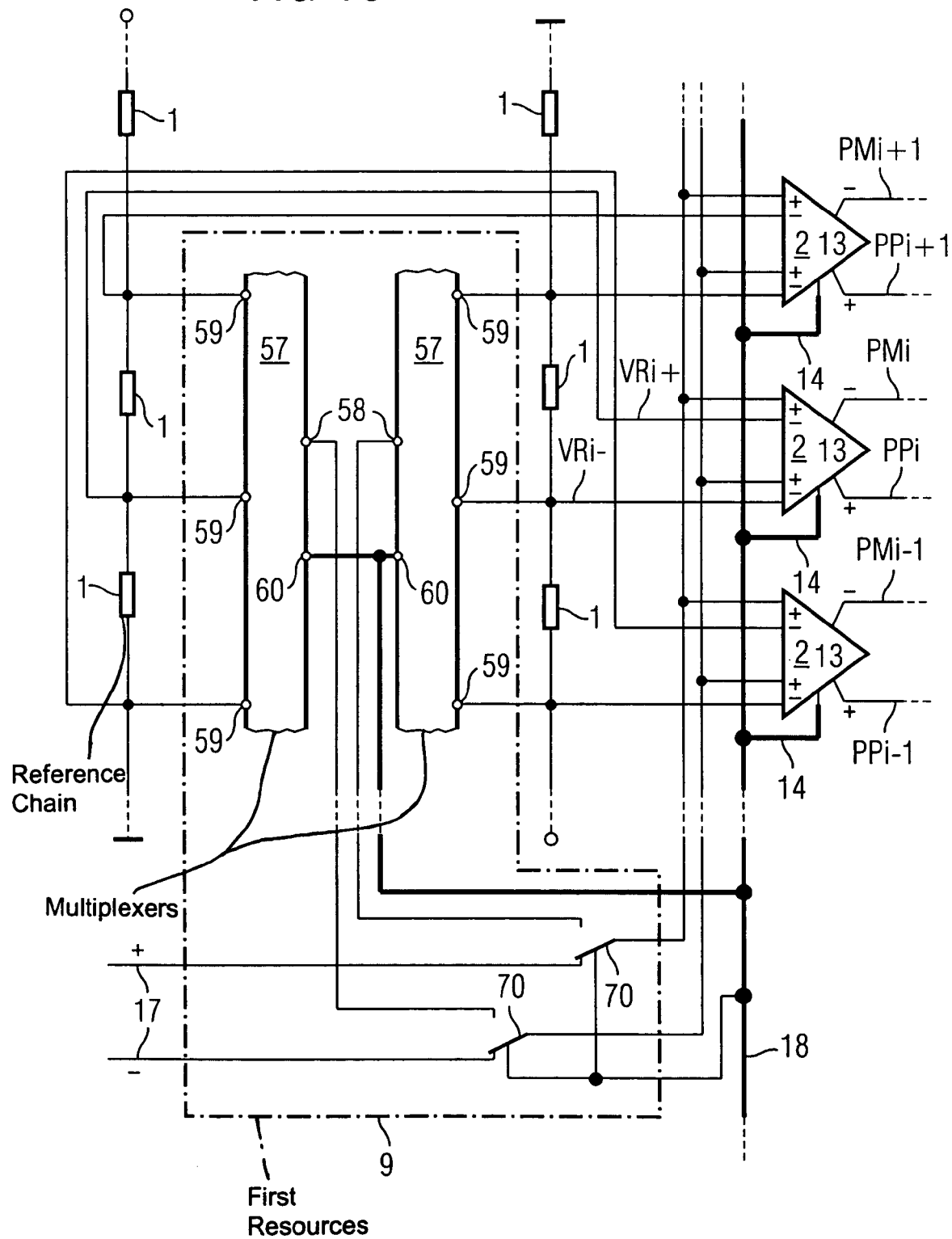

FIG. 18 shows a possible implementation of the circuit from FIG. 16, if the ADC is to receive a differential input. The basic methods of the duplicated reference chain and the necessary preamplifiers with two differential input pairs are already known from FIG. 15. Correspondingly, at the transition from FIG. 16 to FIG. 18, the multiplexers 57 and controllable switches 70 must also be duplicated, i.e. for each of the now two input signal paths of the ADC these resources must be provided corresponding to FIG. 16. It is particularly advantageous here to implement the decoder which is included in the multiplexers in common for both multiplexers, which is not shown in the figure for reasons of clarity.

Figure 19:
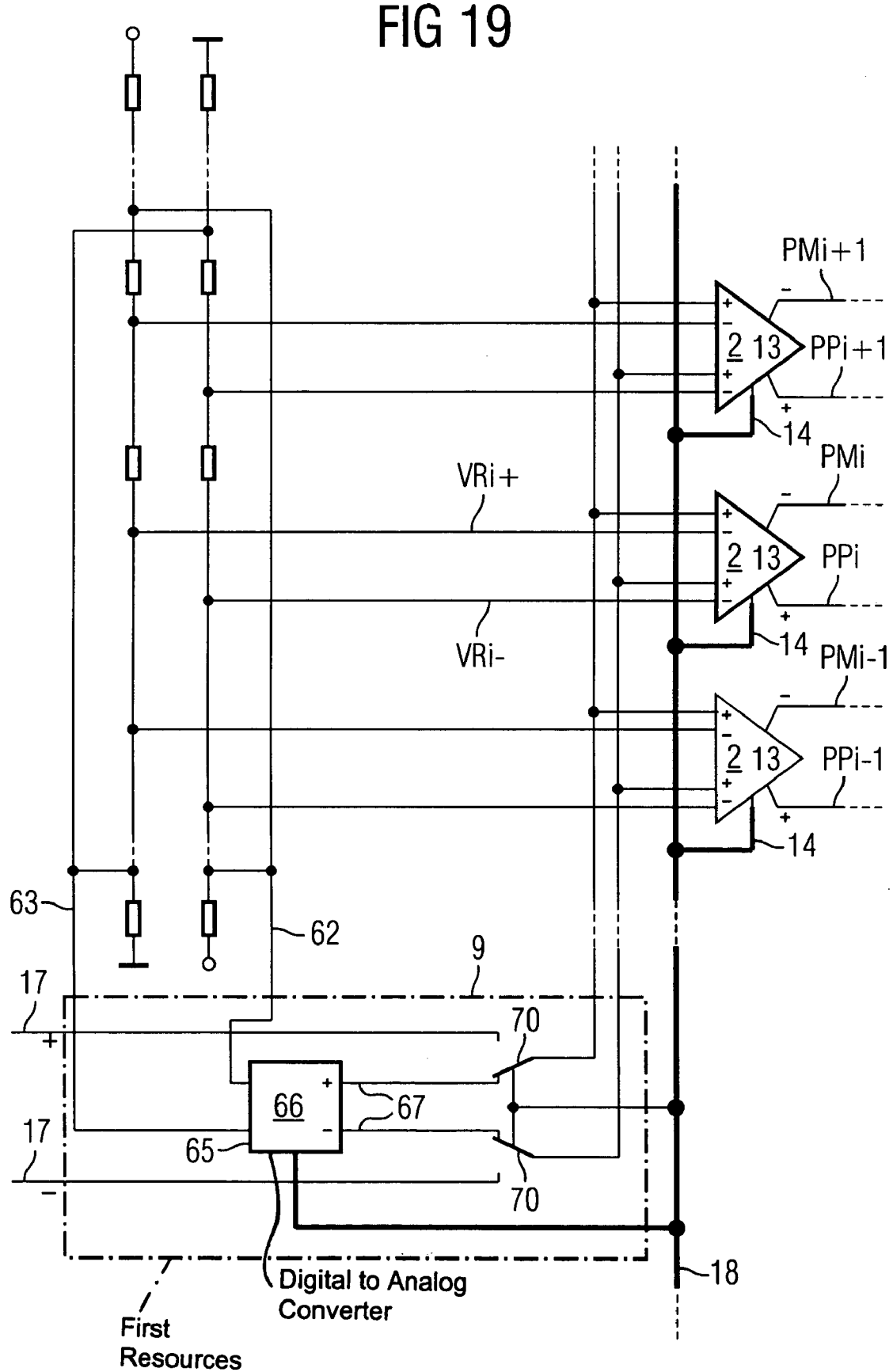
Figure 20:
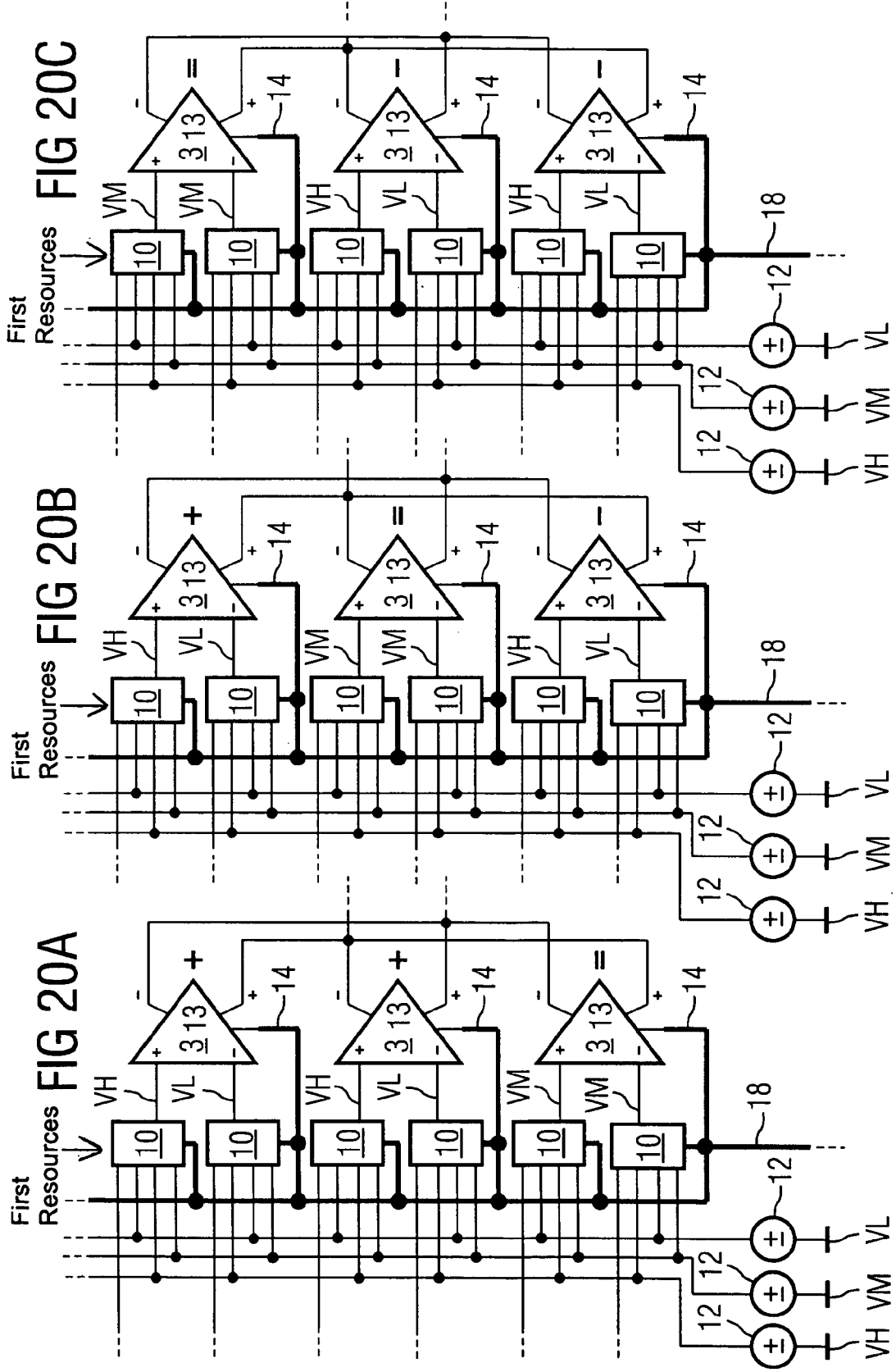
FIGS. 20a to 20c show circuit diagrams to explain the effects of the first resources.

FIG. 19 shows the particularly advantageous version from FIG. 17 for the case of a differential input of the ADC. Correspondingly, here too the resources in the signal paths must be duplicated, but the DAC 66 should be implemented as a balanced, fully differential DAC, i.e. with differential outputs which are balanced around the reference voltage center, and not just as a simple interconnection of two DACs with a single output. A further refinement for the best possible results is the interconnection with as low a resistance as possible of the ends of the two opposite reference chains which are fed to the DAC as the reference voltage, as shown in the figure.

FIGS. 20a to c represent as an example the four identifying effects of the first resources for folding stages and their use during the calibration process. For folding stages, the outputs of a number of differential amplifiers are interconnected in alternating senses, i.e. the internal working of the symbols 3 or 4 is not necessarily different from the internal working of a preamplifier, and is to be found, for instance, in FIG. 5. For the folding process, an odd number of differential amplifiers is always interconnected, since otherwise the folding cannot be closed circularly. For folding ADCs, the principle is that only one differential amplifier of an interconnected group is in or near equilibrium, whereas the remaining differential amplifiers of the group are controlled so that their effects cancel each other out, so that only the one differential amplifier which is in or near equilibrium has an effect on the outputs. It is these reconvergent signal paths which have made self-calibration of the folding ADCs impossible for the prior art until now, before this invention disclosed how individual paths and thus individual differential stages can be deliberately selected and shielded against other paths by the first resources according to the invention. How this is managed is shown in the individual phases in FIGS. 20a to c as an example. If more than three differential stages were to be interconnected, e.g. five or seven etc., the following applies correspondingly. In what follows, the convention applies that the arrangement of the differential stages within the folding stages is such that in normal operation they are activated from bottom to top with increasing input voltage of the ADC.

FIG. 20a shows how the bottom differential stage can be selected and shielded against the two top ones. The equilibrium state is forced for this one differential stage by the fourth effect of the first resources, by connecting both inputs to the same potential, here VM. The inputs of all differential stages in the sequence above it are controlled using the third effect of the first resources so that their outputs are fully controlled in a first direction. Because of the alternating interconnection of the outputs in the same and opposite senses, the effects of all stages of which the outputs are controlled cancel themselves out, and only the bottom differential stage has an effect on the outputs.

FIG. 20b shows how the middle differential stage can be selected and shielded against the two top ones. The equilibrium state is forced for this one differential stage by the fourth effect of the first resources, by connecting both inputs to the same potential, here VM. The inputs of all differential stages in the sequence above it are controlled using the third effect of the first resources so that their outputs are fully controlled in a first direction. The inputs of all differential stages in the sequence below it are controlled using the second effect of the first resources so that their outputs are fully controlled in a second direction, which is opposite to the first direction. Because of the alternating interconnection of the outputs in the same and opposite senses, the effects of all stages of which the outputs are controlled cancel themselves out, and only the middle differential stage has an effect on the outputs.

FIG. 20c shows how the top differential stage can be selected and shielded against the two others. The equilibrium state is forced for this one differential stage by the fourth effect of the first resources, by connecting both inputs to the same potential, here VM. The inputs of all differential stages in the sequence below it are controlled using the second effect of the first resources so that their outputs are fully controlled in the second direction. Because of the alternating interconnection of the outputs in the same and opposite senses, the effects of all stages of which the outputs are controlled cancel themselves out, and only the top differential stage has an effect on the outputs.

For construction of a signal path by the folding ADC via subsequent stages, the above applies precisely, except that in the case of the differential stage via which the signal path is to lead, the first effect of the first resources is set instead of the fourth effect, so that the resulting signal path is via the regular inputs of the stage as for normal operation.

Figure 21:
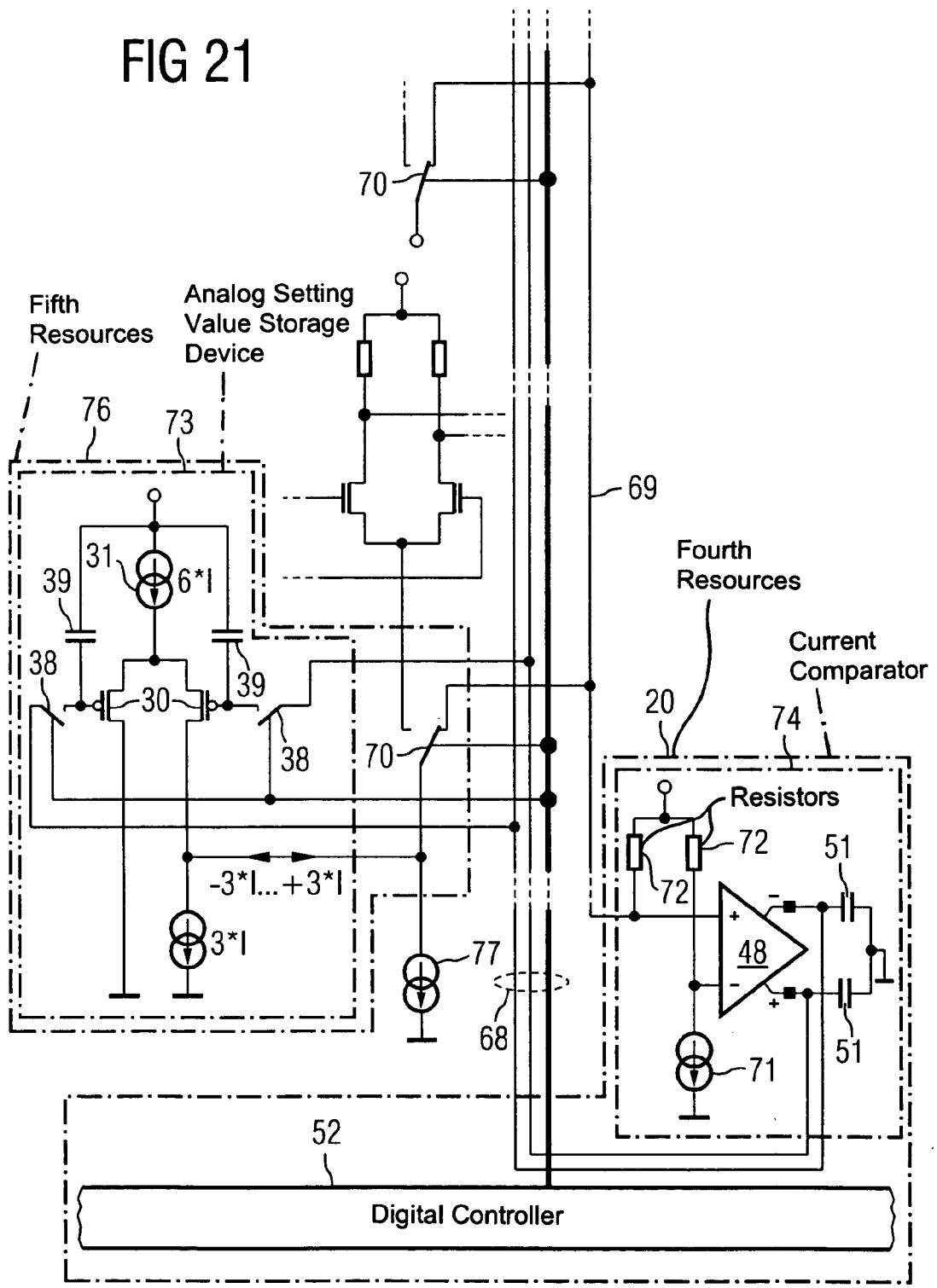
FIG. 21 shows a circuit to explain the calibration of individual current sources.

In FIG. 21, an arrangement is shown as an example. Even individual current sources within the folding ADC can be calibrated to a setpoint value. This can be necessary with some architectures of folding converters, particularly those with interpolators. The prior art knows the so-called dynamic current copier, which can also be used to implement numerous current sources of the same current, but this solution has disadvantages, such as insufficient precision because of excessively low amplification and limited storage time. A particularly advantageous version of how numerous current sources of the same current can be implemented, and which does not have these disadvantages, is shown in FIG. 21, in which fifth resources, with which the calibration of thus equipped current sources to a setpoint current which is supplied by a setpoint current source is made possible, are added to each current source to be calibrated, the currents being compared in a current comparator, which is implemented in such a way that only as many current comparators are required as there are current sources to be calibrated simultaneously.

The fifth resources 76 can be implemented using a controllable switch 70, and an analog-adjustable current source, with analog setting value store 73, which is constructed in a similar way to the second resources according to FIG. 6. The difference between block 73 and FIG. 6 is firstly that the circuit is complementarily constructed, i.e. with p-channel MOSFETs instead of n-channel MOSFETs, because this is expedient for a current source 77 leading to ground as in the figure. For a current source leading to the supply voltage like 31, the circuit of 76 could remain with n-channel MOSFETs. The second difference is that one output of the differential pair leads to ground, and the other to a current source which leads to ground, and which derives a current 3\*I to ground which is half as great as the current 6\*I which the bottom-end current source 31 of the differential pair 30 supplies to it. According to the control of the differential pair via its inputs, which are connected to the holding capacitors 39 and can be controlled via the sampling switches 38, the result from block 73 is an output current of from +3\*I to −3\*I, which is added to or subtracted from the current of the current source 77, so that this can always be brought to the setpoint current, if the amount 3\*I is large enough to be able to override the mismatch error range of current source 77. A possible variant would be to omit the current source which is marked 3\*I, and to include the corresponding derivative action in the current source 77, but then it would not be possible to represent the method of functioning so clearly. To achieve the purpose of the circuit, it is also necessary to be able to compare the abovementioned corrected current, which results from the addition of the currents from block 73 and the current source 77, with the setpoint current. For this purpose, the fifth resources include the controllable switch 70, which feeds this current to either the load, here the unlabeled differential stage, or via a bus line 69 to the fourth resources 20, where, similarly to FIG. 9, there are further auxiliary circuits for the calibration process at a central point. This location for the auxiliary circuits is a matter of convention, and obviously does not necessarily have to be in the fourth resources to have the same function according to the invention. However, for the purpose of clarity of representation, this convention is useful, eparticularly as the fourth resources are those which internalize the self-calibration method and contain the central resources which are necessary for it. In the case of calibration of current sources, these additional central resources comprise at least a current comparator 74, which in turn comprises a setpoint current source 71, a pair of comparison resistors 72 and a differential error amplifier 48 with its compensation capacitors 51. The purpose of the latter is to introduce the dominant pole which is necessary for stability into the feedback loop. The principle of closing the loop is the same as for FIG. 9, and occurs via a control bus 68 which leads from the fourth resources to the fifth resources, and from which two analog differential signal lines lead from the current comparator 74 to the signal inputs of the sampling switches 38 within the fifth resources. The control bus 68 also includes a number of digital control lines, which proceed from the digital controller 52 within the fourth resources and which close and open the sampling switches 38 of one of the fifth resources. Switchable compensation capacitors as in the case of FIG. 9 are mostly unnecessary in the case of the current calibration loop, since the additional amplification within the loop depends only on the transconductance of the MOSFET 30 of the current source 73 and the value of the comparison resistor 72, and to keep the product of the two parameters and thus the amplification equal, it is enough to design the transconductance of all adjustable current sources 73 to be approximately equal. If this is impossible, an approximately equally great amplification can be achieved by very simple extensions to the circuit, e.g. by implementing the resistor which leads to the bus line 69 with taps and switching the input of the error amplifier 48 via one of 52 adjustable multiplexers to the appropriate tap in each case, at which the desired amplification results. A further, equally simple alternative would be to provide multiple comparison resistor pairs 72 with different values, and to make them switchable, so that the amplification can be chosen to be always equal. These actions are not represented pictorially because of their triviality.

Figure 22:
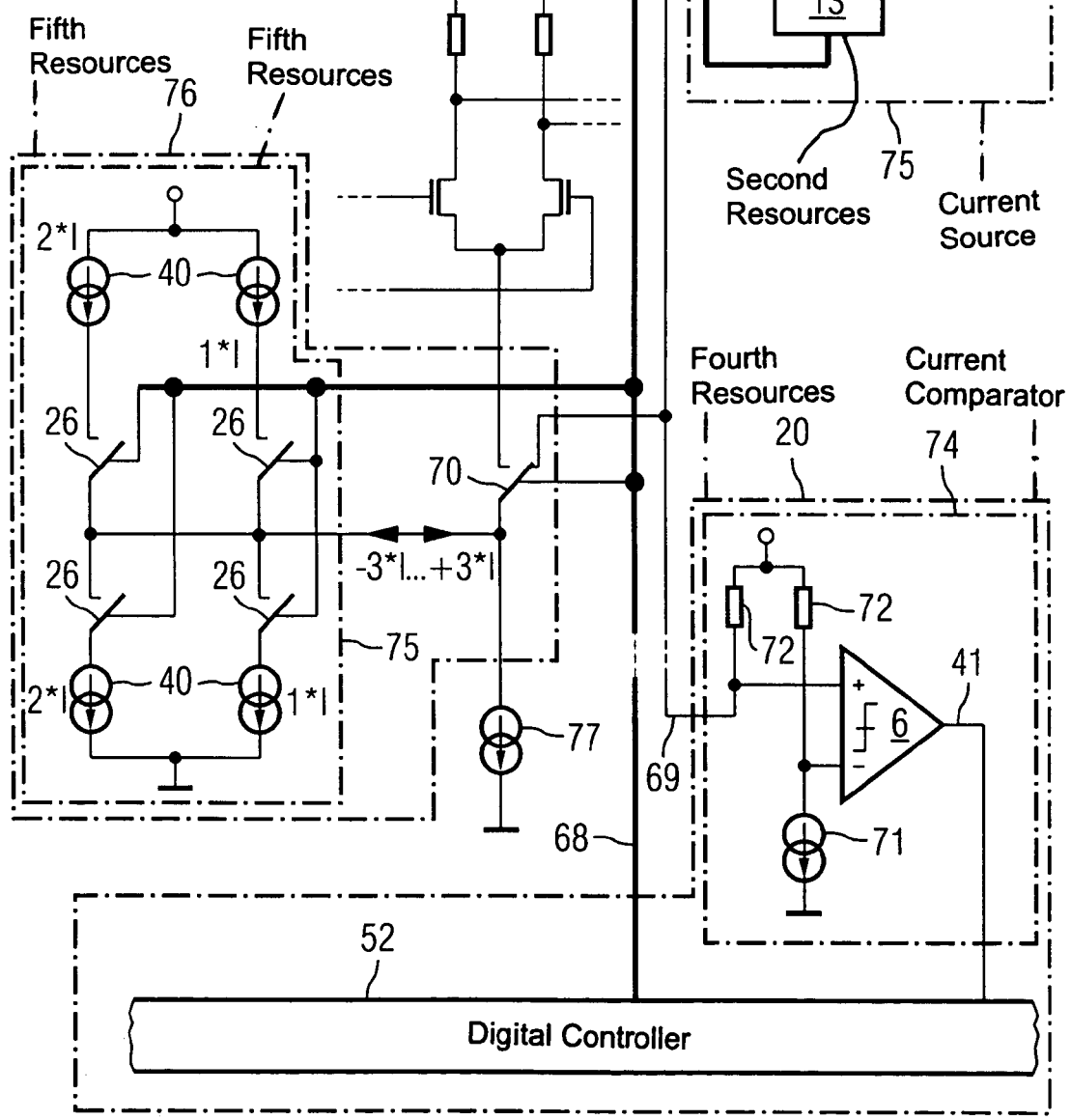
FIG. 22 shows a further version of FIG. 21.

FIG. 22 shows a variant of FIG. 21, in which the current sources can be trimmed digitally to the setpoint value. This variant was derived from FIG. 21 by replacing the analog-adjustable current source 73 with a digitally adjustable current source 75 within the fifth resources 76. Additionally, the error amplifier in the current comparator 74 was replaced by a comparator 6, the output 41 of which leads to the digital controller 52 within the fourth resources. This controller searches for that position of the controllable switch 26 within the digitally adjustable current source 75 at which the comparator just switches. In this case, the total current which flows via the controllable switch 70 to the bus line 69 agrees optimally with the setpoint value which is specified by the setpoint current source 71. The remaining residual error corresponds to the smallest current of the weighted current sources 40 within the digitally adjustable current source 75. This is only sketched here in principle. In particular, neither a decoder nor a register for storing the digital calibration value has been included in the drawing, to avoid inflating the representation unnecessarily. In practice, these parts obviously have to be provided, and it is recommended that for the implementation of block 75 a circuit similar to the basic idea of FIG. 7 should be taken, to halve the number of current sources. One output leads to a current-balancing circuit, to make output currents in both directions possible, and an additional MOSFET 78 helps to switch off the current-balancing circuit. This implementation, which is particularly advantageous in practice, of the digitally adjustable current source 75 for the fifth resources is shown in FIG. 22b, but was not shown, for instance, in FIG. 2, because it is less clear than the chosen representation.

Figure 23:
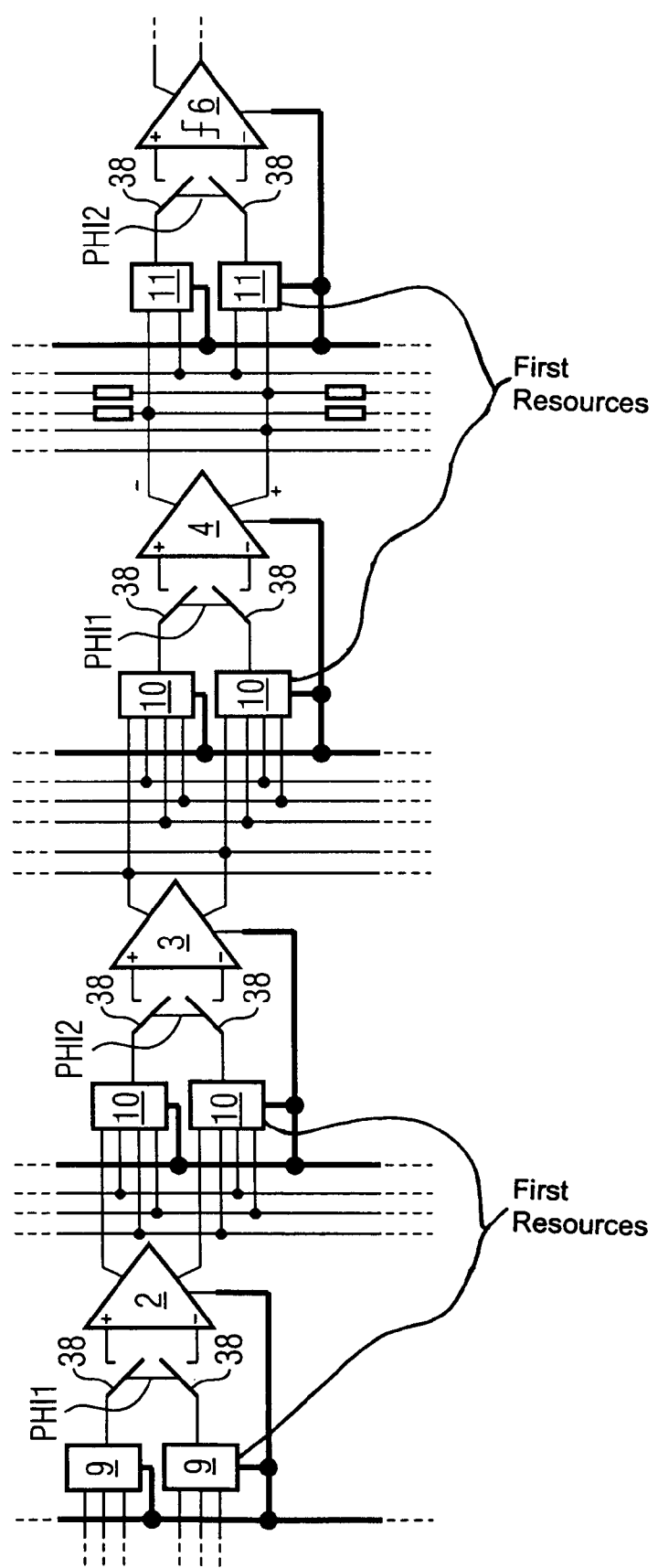
FIG. 23 shows a circuit with sampling switches between the stages for pipeline operation.

Finally, the last figure, FIG. 23, shows a section from the circuit of a self-calibrating folding ADC, in which between the stages additional sampling switches 38 are arranged, and are controlled by a non-overlapping two-phase cycle PHI1 and PHI2 in such a way that the result is so-called "pipeline" processing like an assembly line, which gives a considerable speed advantage, since at each cycle only one stage must act, and not a chain comprising multiple stages. This principle in itself has been known for a long time, and is used, for instance, in so-called pipeline ADCs. For folding ADCs, the application of this principle was impossible until now, because errors through asymmetrical charge injection at the sampling switches falsified the signals. However, through the use of self-calibration of the folding ADC according to the invention, it is possible to correct these errors—as well as other mismatch errors—through the self-calibration. It is only necessary, before the calibration decision, to open the sampling switches 38 of the stage to be calibrated, so that its error becomes manifest, and thus also influences the calibration decision and is also calibrated out.

After the implementations above, which have disclosed in detail all resources according to the invention, their effects and practical implementation possibilities, the self-calibration method according to the invention can be described below. In a first step—if this is provided—all current sources are brought to the setpoint value, for which the fourth resources use the fifth resources. In the subsequent steps, one differential stage is calibrated after another, the differential stage to be calibrated being brought to an equilibrium (sensitized) by the fourth effect of the first resources, the non-participating differential stages being prevented (inhibited) by the second and third effect of the first resources from affecting the signal path, and the signal path via all the differential stages which follow the sensitized differential stage as far as the third resources being released by the first effect of the first resources, corresponding to normal operation. At this point, the digital controller which is contained in the fourth resources makes the calibration decision about how the second resources are to be set, to bring the equilibrium state to setpoint, or causes the circuit to do this independently through a released analog feedback loop. After the settling of the analog feedback loop or after the establishment of the digital setting value, during which the equilibrium state is reversed, this calibration information, about the sensitized differential stage, which is gained in this way is stored. In the case of the analog implementation, this occurs by the digital controller opening the sampling switches in the second resources which are assigned to the differential stage. In the case of the digital implementation, the determined value is stored in a register which is contained in the second resources or at another suitable place. The self-calibration method begins with the stage which is furthest from the input of the ADC and which is equipped with the first and second resources according to the invention. If all stages have these resources, the self-calibration method begins with the calibration of all differential stages of the comparators. The calibration of all differential stages of the last folding stage follows. When they are calibrated, it is the turn of the preceding stage as seen from the input of the ADC, until the first stage is calibrated. The invention has disclosed several variants as to how this first stage can be calibrated, including those variants which also calibrate out the mismatch errors of the reference chain. At the end of the self-calibration process, an almost ideal folding ADC is ready, and it remains almost ideal for as long as the stored self-calibration information remains valid. In the case of analog storage of this information, it is generally the leakage currents of the sampling switches which affect the temporary validity of the calibration. But even in the case of digital storage there is a time limit, since the operating points of the circuit are displaced by thermal effects. In both cases, the calibration information must be refreshed from time to time, which can also happen in the background. For this method, every N conversions of the regular input signal, a cycle is inserted in which a partial step of the self-calibration method is executed. This then causes a slow incorporation and adjustment of the self-calibration values during the normal operation of the ADC. An inventive system, in which the interference, which occurs every N cycles, with the quantized data stream is suppressed using a digital filter, is the subject of another patent application. A simpler solution for carrying out a calibration in the background is to carry out a regular quantization of the input signal at every second cycle of the ADC, and a partial step of the self-calibration at every other cycle of the ADC. Admittedly this reduces the maximum possible effective data rate to a half, but the ADC becomes so much faster because of the considerably smaller areas which the self-calibration method according to the invention allows, and thus lower capacitive loads, that in general this more than compensates for the loss.

The invention can be applied generally to self-calibration of structures with convergent and reconvergent signal paths.

Now that all bases and methods of working of the invention have been disclosed, it should immediately be possible for the average particularist to implement the invention. It is immediately possible for the particularist to derive variations of the represented circuits and solutions, differing from the pictorial representation but with the same or similar method of working. In particular, it is possible for the particularist to improve circuit details, e.g. by fitting cascodes, or to derive complementary circuits, to introduce bipolar transistors in some places instead of the MOSFETs, etc. It is also possible to calibrate multiple signal paths simultaneously, if the fourth resources according to the invention are designed accordingly and the control and signal line bundles leading to and from the fourth resources are designed to be correspondingly extensive.

The devices and methods described above for self-calibration of a folding analog/digital converter can also be used—after appropriate adaptation to existing conditions if necessary—with other analog/digital converters and other circuits which include one or more amplifier stages, a sample-and-hold stage, and/or a reference voltage divider.

The devices and methods described are described again below in more general form giving possible variations, advantageous developments and further possible uses.

We begin with the device and method for calibrating a group of amplifier stages, where:

"group of amplifier stages" is understood to mean circuit structures of chains or trees of amplifier stages, the group of amplifier stages can (but not must) be part of an integrated circuit, and calibration means, for instance, minimization of errors caused by statistical variations of the component parameters (mismatch), or the adjustment of a specified property, e.g. the amplification of the stages.

Circuit structures comprising chains or trees of amplifier stages are denoted by the overall term "groups of amplifier stages" in the text, since a very wide variety of topological variants can occur, and are found, for instance, in so-called flash or folding analog/digital converters (ADCs), which can include many individual amplifier stages, in some cases hundreds or thousands, which are connected to form groups of amplifier stages in a meaningful way.

Figure 24:
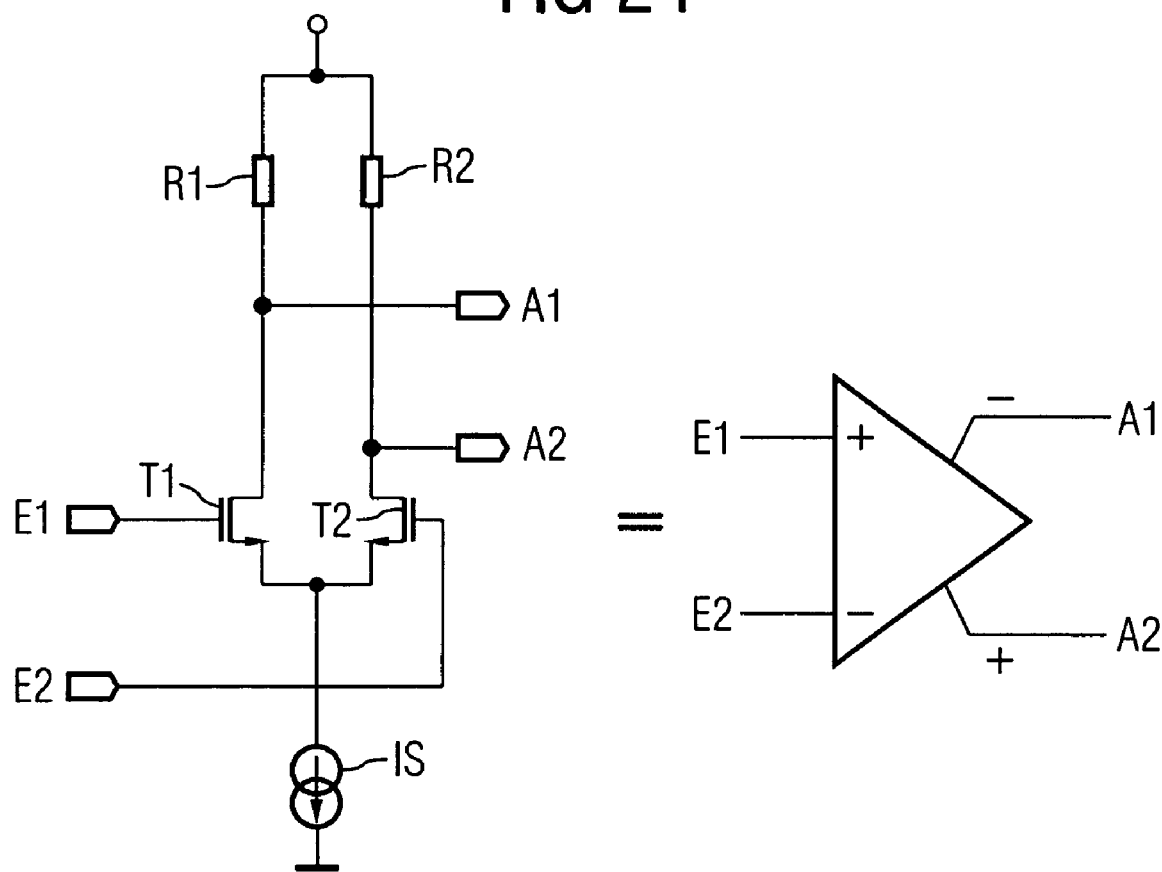
FIG. 24 shows a known amplifier stage, more precisely a differential broadband amplifier.

FIG. 24 shows a typical example of an amplifier stage for ADCs for which the invention is particularly suitable, and the symbol which is used for it in the later figures.

It should be pointed out already at this stage that the invention can also be used beneficially with many other types of amplifiers, if a fairly large number of them, i.e. a group, is present, and it is necessary to calibrate their parameters.

On the other hand, the devices and methods which are described below can also be used with individual amplifier stages, i.e. amplifier stages which are not part of a group of amplifier stages, and that the amplifier stage to be calibrated [lacuna].

The amplifier stages to be calibrated also do not have to be part of an ADC, but can be included in any other devices.

In FIG. 24:

E1, E2 indicate differential inputs which lead to the gates of MOSFETs T1, T2, IS indicates a bottom-end current source of the differential pair thus formed, RI and R2 indicate load elements of the MOSFETs, which are shown here as resistors as an example, but both here and in the arrangements which are shown in the other figures can be replaced by MOSFETs or other active circuits (see, for instance, [4]), and A1 and A2 indicate the differential outputs of the amplifier stage.

Since amplifier stages according to FIG. 24 generally work without negative feedback and also include no compensation of the frequency response, operational amplifiers are not involved. By the same token, their signal processing bandwidth is generally very high, and the amplification per stage is relatively low. A typical value for fast ADCs in the range of a few 100 MHz signal bandwidth is an gain factor of only four.

Conventional offset compensation methods for operational amplifiers such as [12], or the significantly more precise variant according to [13], and the refinements which have previously arisen from these roots, are unsuitable for these amplifier stages simply because of the considerable circuit cost, and the absence of a high-impedance node in the amplifier stages makes compensation of the frequency response of an analog autozero feedback loop difficult, even if extensive additional circuits are added. Additionally, analog storage of the correction information as in cases [12] and [13] is disadvantageous, since the information disappears quickly because of leakage currents and the area cost for the analog memories is generally high. A digital solution would be preferable, since digital memories can store information without errors with a lower area cost and over a longer period.

However, modern digital offset compensation methods according to [14] cannot be used on the abovementioned amplifier stages, since in general the gain factors are too low to establish a clear changeover point. Additionally, the method according to [14] is not flexible enough, since after all the object of calibration may be, instead of an offset correction only, to bring other parameters of the circuit to a setpoint. In particular in differential input stages of ADCs, it can be necessary to equalize the amplifications of individual groups of amplifier stages to each other. The device and method according to the invention is [sic] intended to be usable for this purpose as well.

As has already been explained in detail above, and as will be described more precisely later, in the case of ADCs there is also, for instance, the additional possibility of compensating for non-linearity errors because of statistical variations of the resistances within the reference voltage divider chain by deliberately setting offset errors in the first stage of the ADC to compensate for the errors of the reference voltage divider chain.

This is not possible with pure offset compensation, which can only minimize the offset of the amplifier.

On the other hand, in the case of the calibration device according to the invention an offset can not only be minimized, but deliberately set to arbitrary values within a calibration range.

Structures which include groups of amplifier stages are found in many other circuits, e.g. in the fields of parallel signal processing, keywords neural network, silicon retina, integrated sensor fields, etc., and here too it is desirable to have a method of allowing efficient calibration of a group of amplifier stages.

No systematic methods of calibrating a group of amplifier stages, meaning many amplifier stages, for instance hundreds to thousands, efficiently to setpoint values have been known to the prior art until now. The prevailing approach tries, above all, to obtain a smaller statistical variation of the component parameters by increasing the area. For instance, for a quarter of the offset voltage sixteen times the area is required, which quickly becomes uneconomical, limits the speed and increases the power consumption.

The described calibration device contains:

first resources to be able to bring an amplifier stage into an operating state which is useful for calibration, second resources to make those properties of the amplifier stage which are to be calibrated adjustable, third resources to make it possible to set up a unique signal path from the amplifier stage to be calibrated to at least one comparator unit, at least one comparator unit which can establish agreement with a setpoint value or the presence of an equilibrium state, and a control unit which analyzes the output of the comparator unit and controls the sequence of the calibration method, it being shown to be particularly advantageous if:

the first, second and third resources can be set digitally, a digital memory unit, which for every calibratable amplifier stage stores all or part of the setting values of the first to third resources, and is in such a form that the storage cells which are assigned to a calibratable amplifier stage are in or near the calibratable amplifier stage, there are data, control and selection or address lines, which connect the control unit to the memory unit so that it can select, read from and write to cells from the memory unit, the device and method make it possible to carry out a cascaded step-by-step calibration, in which previously calibrated amplifier stages are used to amplify, during the calibration, signals of amplifier stages which precede them in a signal path, before they reach the comparator unit.

In simplified form, the invention can be seen as a digital read/write memory which is systematically distributed over the integrated circuit, and the storage cells of which, instead of just storing information, use this information to set analog parameters within amplifier stages which are interlaced within the memory array with it.

The content of the storage cells is manipulated by the control unit so that the parameter, which is measured via a comparator unit, of a selected amplifier stage is brought to a setpoint value, the described method managing this in a particularly efficient way, by—if possible—previously calibrated amplifier stages being used to lead signals from the amplifier stages which precede them to the comparator unit, so that overall a lowest possible additional cost and a high precision result.

The proposed calibration device is thus clearly different from known calibration devices.

This also applies to the calibration device according to [15], which has meanwhile become known. Whereas the method according to [15] separates individual folding stages from the running system and then measures and calibrates the offset error using a slow delta-sigma modulator, while the ADC continues to operate, in the case of the device described here no separation of stages to be calibrated is necessary, so that chains of amplifier stages can be used to increase the precision of the calibration without additional cost. This happens through a cascaded step-by-step calibration, which is impossible in the case of the device according to [15].

A further advantage of the described calibration is that in this case it is unnecessary to fit transfer switches between the individual stages. This is admittedly possible and convenient in principle, particularly for implementation of the first resources, but in the case of the modern 0.12 μm CMOS processes typically with 1.2 V supply voltage, transfer switches in general have such poor transmission properties that the maximum speed of the whole system suffers if they are in the signal path for normal operation. On the other hand, the described calibration makes it possible to connect the signal paths between the amplifiers permanently, without interconnecting transfer switches. These are used only at non-critical points of the circuit and for calibration operation, which does not have such high speed requirements as normal operation.

Further advantages of the present invention result from the purely digital storage of the setting values for calibration in a distributed memory unit, which is interlaced with the amplifier stages in such a way that the wiring cost is low, and from the high flexibility of the device, to be able to reprogram the calibration mode of numerous amplifier stages during normal operation, and then by switching only one global signal to be able to change immediately into calibration mode and back into normal operation.

After the above general implementations of the proposed amplifier stage calibration, this is described in more detail below, referring to FIGS. 25 to 40. The description is based on the ADCs which are shown in FIG. 25.

FIG. 25a shows a chain circuit, which is typical of flash ADCs, of the amplifier stages which are shown in FIG. 24. The input of the ADC is here marked E, and the reference voltages from the reference divider chain RK are marked VRi−1, VRi, VRi+1. The arrangement which is shown in FIG. 25a includes multiple amplifier stage chain circuits, e.g. one of the chain circuits comprises the amplifier stages V1 and V2 and the comparator CMP1.

FIG. 25b shows a tree structure, which is typical of folding ADCs, of amplifier stages which are shown in FIG. 24, in which, in contrast to a flash ADC, multiple amplifier stages V4, V5, V6 are connected to the outputs, to make a folding operation possible. The result is a tree of amplifier stages, within which there are chain circuits as a subset, here e.g. V3, V5, CMP2.

The described device and the described method are capable of calibrating such structures in a particularly efficient way; in such cases, no great additional cost for additional analog circuits is required to implement the calibration. But the device and method can also be used with any wiring of a group of amplifier stages.

Figure 26:
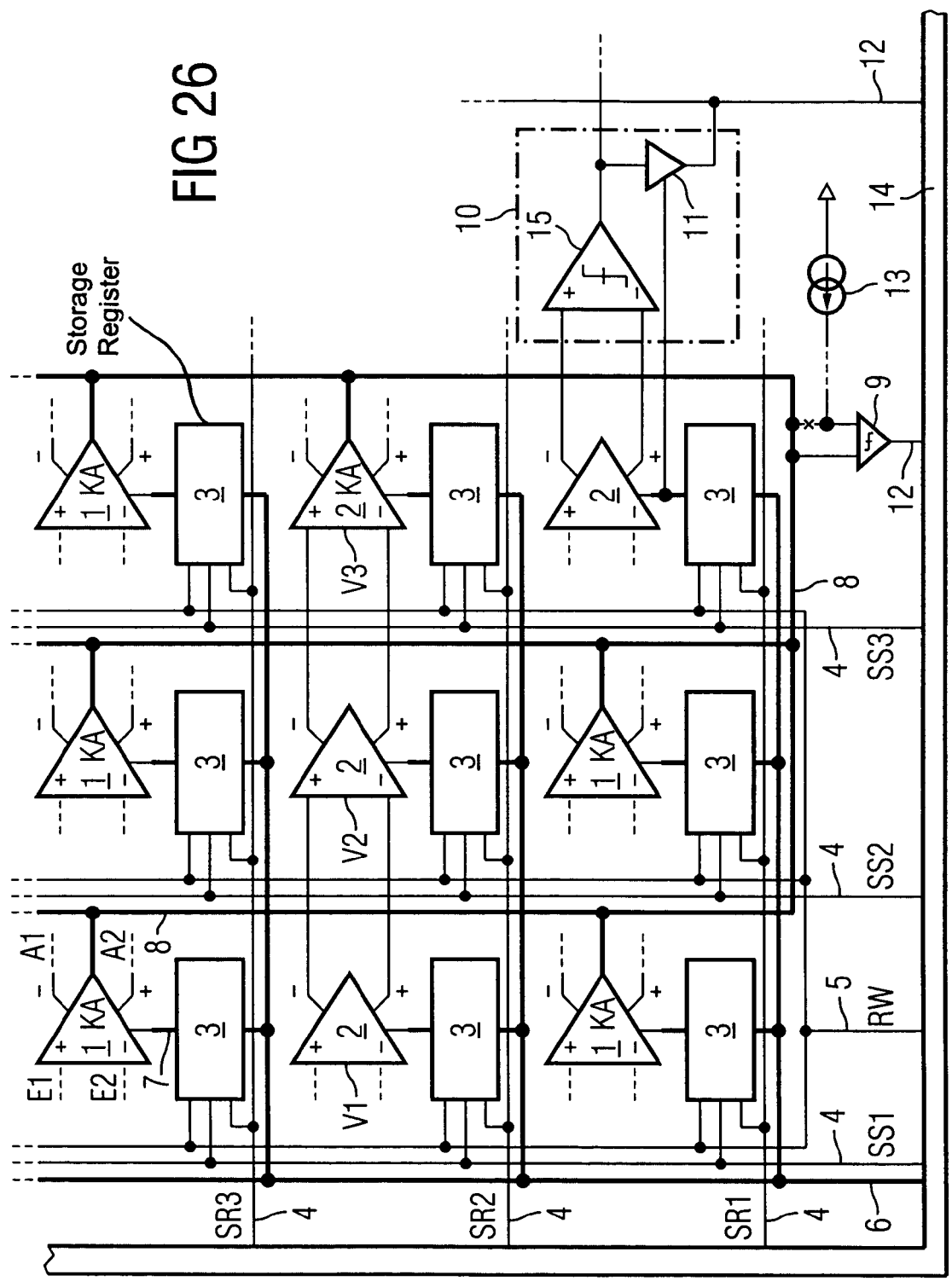
FIG. 26 shows an outline circuit diagram to represent the device according to the invention.

FIG. 26 represents the device according to the invention on the basis of a basic circuit diagram.

The usual amplifier stages according to FIG. 24 are replaced here by calibratable amplifier stages 1, 2. Both variants of calibratable amplifier stages have setting inputs 7, which make it possible to affect first, second and third resources for calibration in or near the calibratable amplifier stages, which is considered later. The universally usable main variant of the calibratable amplifier stage 1 also has at least one additional calibration output KA, which is connected to a measurement line network 8.

A digital storage register 3, which contains setting values which are fed to the setting inputs 7 of the assigned calibratable amplifier stage and can be read and written via a data bus 6, is assigned to each calibratable amplifier stage. Admittedly, as was described initially with reference to FIGS. 1 to 23, analog storage is also possible in principle for the setting values, but in general, because of the low area requirement for practical implementation of the memory and the non-existent or negligibly small risk of the stored data changing (loss of information because of leakage currents), digital storage is to be preferred.

As well as the data bus 6, selection lines 4 and control lines 5, which make it possible to select storage registers deliberately and to control a read or write process, are connected to the digital storage registers, so that the result is a memory unit.

In this case, the structure of the memory unit which is formed from the storage registers and their selection circuits essentially corresponds to a read/write memory (RAM) which is known per se to the prior art, or a so-called "register file" with individually selectable storage registers. Since the outputs of the storage registers lead to setting inputs of resources according to the invention in the case of the amplifier stages, it is useful to arrange the individual storage registers and the resources according to the invention spatially near to each other and near to the calibratable amplifier stages which are assigned to them, and to implement a decoder for selecting the individual storage registers as a distributed circuit.

If the semiconductor technology which is used and the temperature, supply voltage and long-term drift of the integrated circuit allow it, the memory unit can also be implemented as a programmable non-volatile memory, e.g. as PROM, and the calibration can be done once, for instance during the manufacture of the integrated circuit. It is then possible in the process to shift a comparator unit 9, which is described more precisely later, and a control unit 14, which is also described more precisely later, from the integrated circuit to the automatic test machine. On the device described, only the place at which the comparator unit and control unit are found changes as a result.

Even though the invention sets no particular requirements for the arrangement of the calibratable amplifiers and storage registers, in practice it is advantageous to arrange a respective calibratable amplifier and its assigned storage register spatially near to each other. In a preferred implementation, they are combined into one unit. It is also useful to arrange the calibratable amplifiers and their assigned storage registers, or the units which are formed out of them, in a matrix as shown in FIG. 26, which simplifies selection and results in a regular layout. The generality of the chains, trees or other groups of amplifier stages which can be implemented is thus not restricted, because the usual inputs and outputs of the amplifier stages (e.g. E1, E2, A1, A2) can be connected in any way. However, in certain cases, the calibration method can use properties of these usual connections for its purposes in a particularly advantageous, because it is cost-saving, way, which is considered later.

The data bus 6 of the memory unit and its selection lines 4 and control lines 5 (depending on the implementation, there may be more or fewer than are shown in the figures, and an additional address bus is conceivable) are connected to the previously mentioned control unit 14, which controls the sequence of the calibration method.

For calibration, this control unit 14 requires information about whether the parameter to be calibrated is at setpoint. This information is supplied to the control unit 14 by the [sic] by at least one comparator unit 9 or 10 via signal lines 12.

The calibratable parameter, a current, a voltage or a time-dependent signal, is fed to the comparator unit via the measurement line network 8 in a first variant, for which purpose the selected calibratable amplifier stage contains third resources to feed the desired parameter via its calibration outputs KA to the measurement line network.

In the second variant, which is shown in the middle row as an example, there is a chain circuit of calibratable amplifier stages V1 to V3, and it is then possible in the amplifier stages at the beginning of the chain to do without third resources added there and the calibration output KA. The previously calibrated subsequent amplifier stages themselves are used by the calibration method according to the invention as third resources to feed the parameters of the amplifier stages which precede them to the comparator unit.

If, for instance, see FIG. 26, the calibratable amplifier V3, which is equipped with third resources and a calibration output KA, was calibrated first, and if its signal transfer function has thus become sufficiently precise, the calibratable amplifier V2, which is implemented without its own third resources and without a calibration output, can be calibrated, by the previously calibrated amplifier V3 being put into effect as the third resource, to feed the output signal from V2 via its outputs KA to the measurement line network 8, and thus to the comparator unit 9. The additional amplification by V3 is desired here, because it also amplifies the errors of V2 which are to be calibrated out, and thus a significantly more precise calibration of V2 is made possible.

When V2 is also calibrated, V2 and V3 can be used as third resources to calibrate V1. The advantageous effect of this second variant of the invention also appears here, that because of the amplification by V2 and V3 any errors of V1 can be resolved significantly more precisely than would be possible by feeding internal parameters or the output values of V1 directly to the comparator unit. If for instance, every amplifier stage has an gain factor of 4 and the comparator unit has a precision of 1 mV, which can typically be achieved at moderate cost within the comparator unit with offset compensation methods which are known to the prior art, then the achievable precision of the calibration of the chain of V1, V2, V3 in relation to the input of the chain in the ideal case (sufficiently fine step width of the second resources and no noise) is 1 mV/(4*4*4)=15.6 µV. Even if this ideal case is not achievable in practice, this example shows what high precision in principle the method according to the invention has.

Through this cascaded step-by-step calibration, which can be used in particular in the case of analog/digital converters of the flash or folding type, which is only made possible by the device according to the invention, and which represents the main variant of the calibration method according to the invention, chains or trees of amplifier stages can be calibrated to a precision which was accessible to the prior art until now only with great circuit cost.

Such chains of amplifier stages are found above all in flash ADCs, whereas trees of amplifier stages are found above all in folding ADCs.

In the case of analog/digital converters, but also of many other circuits with groups of amplifier stages, at the end of a path through the amplifier stages which are connected to each other there is in any case a comparator, which can be used for many parameters to be calibrated as a suitable comparator unit for the purposes of the invention, in particular for time constants and voltages, this last being made possible above all if these comparators can be suitably clocked.

If such a structure exists, in which there are comparators at the end of signal paths, and which is represented as an example in FIG. 26 within the dashed box 10, this comparator can be used during the calibration process as a comparator unit, whereas in normal operation it has its original task within the circuit.

The additional cost for the implementation of the comparator unit according to the invention is then reduced in most cases to adding a selectable driver 11 to the existing comparator 15, the driver being selectable by a signal of a storage register, as shown in the figure, or from a logical linkage of the selection and/or control lines, so that in the selected state it feeds the output of the comparator, and thus the result of the comparison, via a signal line 12 of the control unit 14.

If the digital logic which usually follows the comparators is in an appropriate form, the function of the selectable drivers can also be undertaken by the digital logic.

If there are already comparators at all ends of the amplifier chains to be calibrated, it is then possible to use a variant of the invention in which it is possible to omit the addition of a comparator unit, since with the comparators all necessary comparator units are already present. This mostly applies in the case of the abovementioned ADCs.

A comparator unit 9 which is particularized for calibration is useful in particular if currents are to be calibrated, or gain factors, since in these cases conventional comparators would find it difficult to establish the presence of a setpoint value.

In the case of calibration of currents to a setpoint value, a reference current must be fed to the comparator unit 9, which is shown in FIG. 26 by a current source 13 as an example. Here then, the dashed line from the current source to the first terminal of the comparator unit must be closed, and the point marked "x" must be disconnected. At the second input of the comparator unit 9, the current which is tapped within the calibratable amplifier stage is fed via one of the measurement lines 8, and compared by the comparator unit with the setpoint value which comes from the reference current source 13. If the calibration of currents and voltages is to take place, it is expedient to provide at least two comparator units, one for currents and one for voltages, or to make the comparator unit(s) switchable between current comparison and voltage comparison, which should cause no problem for the particularist.

In the case of calibration of amplifications to a setpoint value, the amplifier to be calibrated by the first resources is controlled with a known input value, e.g. with a known voltage difference, and the amplification is compared with a setpoint value by the comparator unit. This setpoint value can be fitted into the comparator unit as a trigger threshold. However, the comparator unit can also be implemented as a subtracting or summing amplifier followed by a switching threshold. These variants of the comparator unit are not shown pictorially, because the particularist is capable of implementing them in the sense of the invention.

Further calibratable properties of amplifier groups are their frequency response or phase response. With a suitable version of the comparator unit to measure amplitudes or phases and a suitable version of the first resources to feed calibration signals, which are derived, for instance, from an adjustable sine-wave generator, it is possible for the device according to the invention to also carry out a calibration of the frequency and/or phase response of amplifier groups, for instance by capacitors being switched to a suitable value within the amplifier stages, or by the transconductance of transistors being adjusted, resulting in suitable time constants. Here it is expedient that the third resources should be in the form of a buffer stage, in such a way that the switching of signals which originate in the amplifier stage to the measurement lines 8 does not, or does not significantly, affect the frequency response of the amplifier stage.

It should be pointed out that calibration of the comparator unit can also be provided. In this way it is possible to ensure that the comparator unit supplies results with sufficient precision. However, because of the device according to the invention, the often considerable analog circuit cost for these calibration circuits within the comparator unit is incurred advantageously only once per group of calibratable amplifier stages which are connected to it, and not once per amplifier stage, as would be the case without the device according to the invention. The first, second and third resources of the invention can in general be implemented at low cost, for instance by a few controllable switches per calibratable amplifier stage.

The simplest and most frequently encountered object of the device according to the invention and the method is calibration of offset voltages to as small a value as possible. This is particularly useful with flash and folding ADCs, to increase their linearity and thus their spectral purity. For offset calibration, it is enough to:

connect both inputs of the amplifier stage to be calibrated via first resources to auxiliary potentials, so that the result at the output of the amplifier stage is the amplified offset voltage, use the comparator unit to test the outputs for equality, and set the setting values of suitable second resources which affect the equilibrium within the amplifier stage so that the result at the output of the amplifier stage is a minimum differential voltage.

This minimal differential voltage, divided by the amplification of the amplifier stage, is then the remaining residual offset. The requirements made of the precision of the comparator unit are correspondingly high. The prior art knows numerous solutions for implementing high-precision comparator units, but their circuit cost and area cost is relatively high.

This cost for high-precision comparator units is the basis of the advantage of the invention that it can minimize the number of necessary comparator units, and the device according to the invention also makes it possible to use an inventive main variant of the calibration method: cascaded step-by-step calibration, in which previously calibrated amplifier stages are connected, during calibration of an amplifier stage which precedes them, between it and the comparator unit, so that the output voltage difference of the amplifier stage to be calibrated is further amplified via almost error-free, because they have already been previously calibrated, amplifier stages, so that the precision requirements made of the comparator unit are reduced corresponding to the product of the gain factors of the individual stages. If this product of the gain factors is sufficiently large, the precision of conventional comparators at the end of such chains or trees of amplifier stages is enough to make it possible to use these comparators as a comparator unit. Suitable circuit structures for this particularly advantageous implementation of the invention include, for instance, flash and folding analog/digital converters.

Cascaded step-by-step calibration for such analog/digital converters which are constructed from amplifier stages has not been known to the prior art until now. Instead, the known prior art tries difficult tricks, such as autozero feedback loops of the comparators while including the preceding amplifier stages in the autozero feedback loop, which can cause considerable stability problems, or even autozero is omitted and the considerable area cost required for low offset is implemented.

In contrast to these methods of the previous prior art, this invention provides an area-optimized systematic solution without analog feedback loops, and thus without stability problems, with high possible precision even with low amplification per stage, and by virtue of the digital storage of the setting values, robustness of the calibration against leakage currents.

At first sight, the invention may admittedly seem to be costly and complex compared to the previous prior art, but it is important to consider that most of the necessary additional circuit parts for the implementation of the invention are of digital type, e.g. decoders, registers and switches, and can therefore be implemented with minimally small transistors, which are of little consequence compared to the analog components in the amplifier stages, given the present structure sizes of modern 0.12 μm processes. With the invention, it is possible also to reduce the size of the analog components radically, since the statistical variations, which increase quadratically with the linear reduction of the area, of the component parameters can be compensated for again by the calibration. The fineness of the calibration, which increases by the factor 2 with every bit in the digital setting values, an exponential law, is in every case more powerful than the quadratic area law, which is known to the particularist as Pelgrom's law, so that the area saving can reliably be achieved.

With the invention, the area requirement of typical ADCs can be drastically reduced—with the same precision—compared with the prior art, and because of the parasitic capacitances which have been minimized in this way, the result is a much more favorable ratio of speed to power consumption. These advantages of the invention also result for any groups of amplifier stages in which parameters must be calibrated efficiently.

Figure 27:
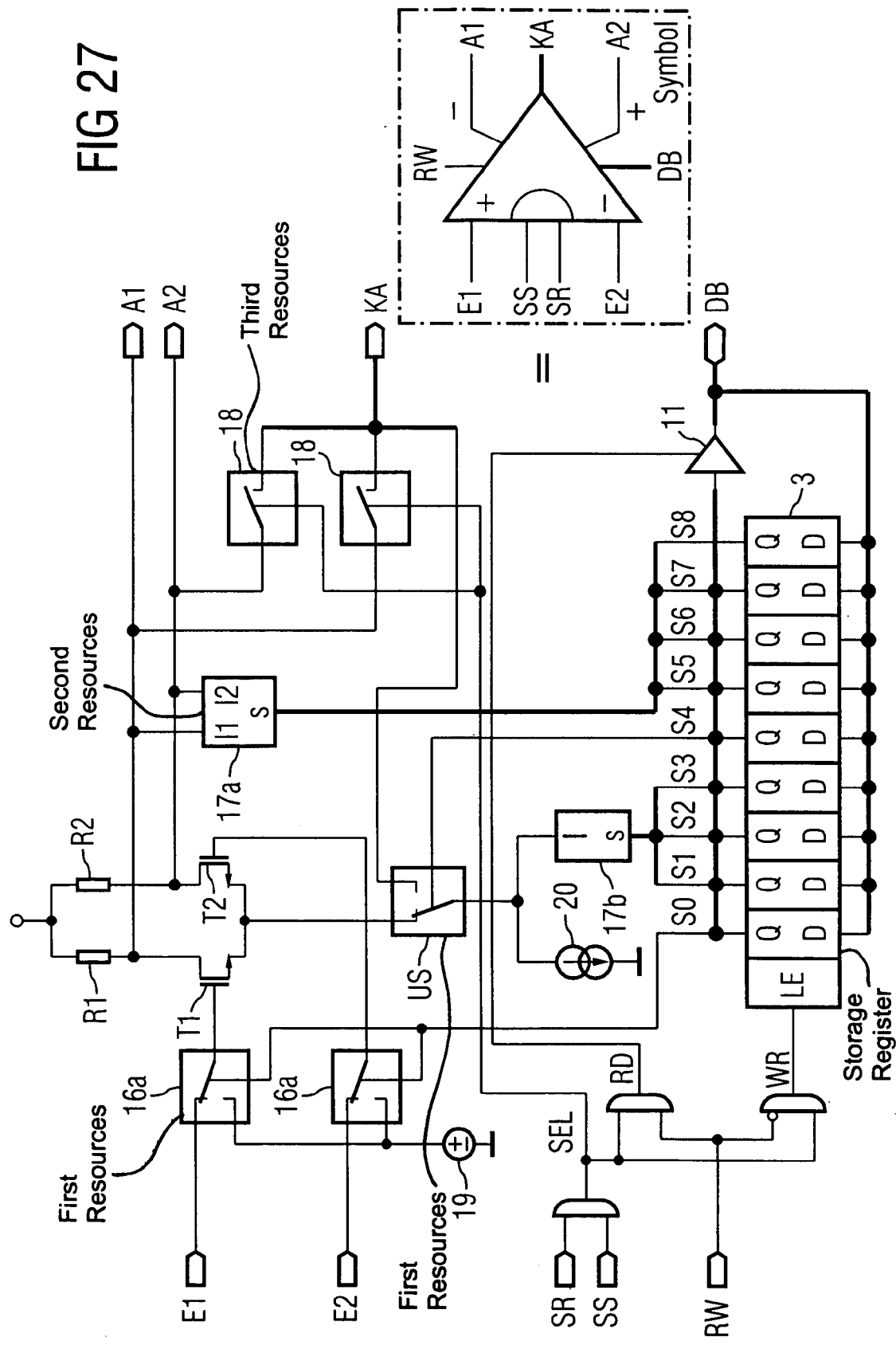
FIG. 27 shows, as an example, an implementation of a calibratable amplifier stage, which contains parts of the memory unit which are responsible for it.

FIG. 27 shows one possibility for the practical implementation of a device which is suitable for calibration of the amplifier stage which is shown in FIG. 24.

Various resources are arranged around the amplifier circuit which is shown in FIG. 24, i.e.:

first resources 16a, US, to bring the amplifier stage to be calibrated to a defined state, in which it can be calibrated (these first resources can, for instance, affect the inputs of the amplifier stage or disconnect current sources from their sinks, so that the current becomes observable), second resources 17a, 17b, to be able to change parameters of the amplifier stage to be calibrated via setting inputs of the amplifier stage to be calibrated, for instance by changing currents from current sources or voltages at actuators, or by connecting or disconnecting, or activating or deactivating, circuit elements which can be switched on or off by switches, such as transistors, capacitors, etc., third resources 18, US, to switch electrical quantities of the amplifier stage to be calibrated to calibration outputs KA which are connected to the lines which lead to the comparator unit.

To put it simply and briefly in summary, the first resources have the task of preparing the amplifier stage for the calibration, the second resources set the parameters to be calibrated to the setpoint value, and the third resources finally make the parameter to be calibrated accessible to the control unit, using a comparator unit with which agreement of the parameter to be calibrated with a setpoint value is tested, by setting up a signal path from the source via the comparator unit to the control unit.

Multiple resources can also be functionally combined. In FIG. 27, the switch marked US includes a first and a third resource simultaneously, since it firstly separates the current source 20 from the sink T1, T2, and secondly feeds the current to the calibration output KA. A clear classification of individual transistors of the switch US into first or third resources would only be possible here at transistor level.

The third resources are in the form of previously calibrated subsequent amplifier stages or contain such amplifier stages. If amplifier stages with sufficient basic precision from the factory are present, they can be used without calibration as third resources.

The basis of this flexibility is that if a chain circuit of amplifiers is present, an additive error, e.g. an offset error, of a subsequent amplifier appears in a manner reduced by the gain factor of the preceding amplifier, if the error is related to the inputs of this preceding amplifier.

A similar flexibility often exists for the first resources. In the case of calibration of the offset voltage, for instance, the inputs of the amplifier stage to be calibrated are connected to each other and brought to a defined potential. In some cases, for instance, this can be effected by disconnecting the bottom-end current source of a preceding amplifier stage, because the load elements then pull the outputs of this amplifier stage and thus the inputs of the amplifier stage which is connected to it to the same potential, which can be used for that in the case of offset calibration. See FIG. 24, assuming that the bottom-end current source IS1 is disconnected.

It should be clear, and requires no further explanation, that there are numerous possibilities for implementing the first, second and third resources according to the invention.

In the arrangement which is shown in FIG. 27, the first resources 16a, US are implemented by controllable switches. The first resources 16a which are connected to the inputs E1, E2 make it possible to connect the gate terminals of the transistors T1, T2 to an auxiliary potential 19 instead of to the inputs E1, E2, so that the offset voltage of the amplifier stage appears in a manner amplified by its gain factor at the outputs A1, A2. This switching takes place in the figure via a control line SO, which comes from the storage register 3. However, the switching could also be initiated differently, e.g. depending oh the result of a combinational decoding of selection lines.

The second resource 17a, which is connected to the outputs A1, A2, for instance a controllable current source, which at each of its outputs 11, 12 draws a current which can be set via its control inputs S, can now be used through the calibration method to minimize the offset of the amplifier stage. This second resource is controlled in the figure via four control signals S5 . . . S8 coming from the storage register 3. In the ideal case, this makes it possible to reduce the amount of the offset voltage which is predetermined by the statistical variations of the components by the factor 8, since one control signal is used as the sign, and thus $2^3=8$ correction steps are possible. Because the correction range in every case must cover the expected maximum offset voltage, it is recommended in practice that a certain reserve should be built in, or the correction range should be made adjustable at a central point, which is easily possible in the case of the proposed examples, by the current sources which are used in the second resources being controlled by a central, adjustable current source, which for instance can be set by the control unit.

As an example, the third resources 18 which are provided in FIG. 27 to feed the outputs A1, A2 to calibration outputs KA are implemented as controllable switches. Their control input is connected in each case to a signal SEL, which is formed combinationally from the selection signals SR and SS. However, this control input of the switches could also be connected to the storage register.

As an example, the storage register 3 in FIG. 27 is in the form of a D latch, which accepts information which is fed from a data bus DB to the inputs D of each storage cell, as soon as the write signal WR which leads to the input LE of the storage register is activated. The storage register can be read under control by the signal RD via a set of selectable drivers 11, which can switch the outputs Q of the storage register to the data bus DB. The signals WR and RD are generated by linking the signal SEL with a read/write signal RW. The selection signal SEL results from linking row selection signals SR and column selection signals SS, which is particularly advantageous with a matrix arrangement of calibratable amplifier stages, but the invention can also be implemented with other selection methods, e.g. with an address decoder.

For the storage register 3 too, various implementation options are conceivable, e.g. a shift register which is connected to a latch register.

The first, second and third resources according to the invention which are presented here enable the calibration method to minimize the offset voltage of the amplifier stage. For this purpose:

by writing to the storage register, it brings the control unit to a state in which the gate inputs of T1, T2 are connected to the auxiliary potential 19, it observes the amplified offset voltage using the comparator unit, to which the states of the outputs A1, A2 are fed via the third resources, and by writing to the storage register, it adjusts the second resources in such a way that the offset voltage is minimized.

A current source is calibrated to setpoint value similarly. In FIG. 27, the bottom-end current source 20 of the differential amplifier is connected for this purpose to T1, T2 via the controllable switch US which is connected to it, and which simultaneously implements the first and third resources, the unique assignment resulting only at transistor level; that part of the switch which can connect the current source to the common source node of T1 and T2 is the first resource, and that part of the switch which can connect the current source to the calibration output KA is the third resource. The second resource 17b, which is connected to the same bottom-end current source 20, can be, for instance, a controllable current source, and the total current from the current source 20 and the second resource must be calibrated to the setpoint value. In calibration mode, this total current is led to a comparator unit, which compares this total current with a setpoint current which is fed to it, via one of the calibration outputs KA, instead of to T1, T2.

In this way, the calibration method can calibrate a large number of current sources to a uniform setpoint current, which is useful, for instance, for a uniform gain factor of the amplifier stages, but making a frequency response calibratable using such calibrated current sources is also conceivable, in the case of special amplifier circuits, so-called GmC circuits.

In FIG. 27, a symbol for an amplifier stage with fitted storage register and column/row decoding via inputs SS, SR is also given. This symbol is used below for amplifier stages which are as described or in a similar form.

Figure 28:
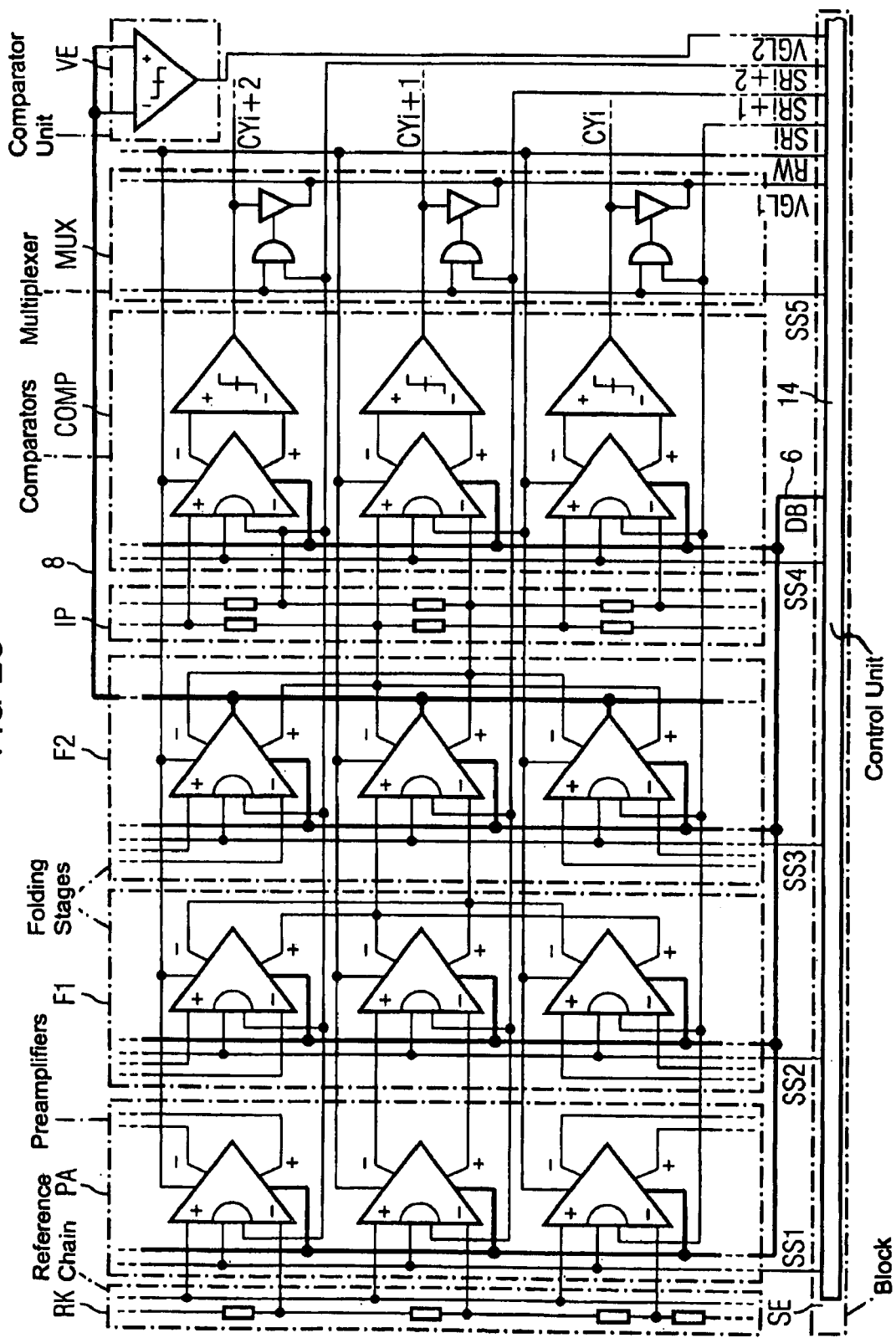
FIG. 28 shows a section from an ADC, which is based on the calibratable amplifier stage according to FIG. 27.

FIG. 28 shows a section from an ADC, including calibratable amplifier stages according to FIG. 27. A folding architecture, which is known per se to the ADC particularist, and which has been equipped with the calibration device which is described above, is involved here. Starting from a reference chain RK and so-called preamplifiers PA, a first folding stage F1, a second folding stage F2, an interpolator IP and comparators COMP follow. Each of the comparators COMP comprises a differential amplifier stage and a comparator which is connected downstream thereof, mostly in the form of a so-called regenerative latch. The amplifier stages of this ADC are in the form of calibratable amplifier stages according to FIG. 27. In the example, the calibratable amplifier stages which are included in the blocks PA, F1 and COMP contain no third resources of their own and no calibration outputs. Instead, in the cases of PA, FI, a cascaded step-by-step calibration is carried out, starting with the amplifier stages in block F2, which are equipped with third resources and calibration outputs. In the example, the comparators in block COMP are assumed to be good enough to be able to be used as comparator units for calibration of the amplifier stages which are also included in block COMP. The additional cost of selecting and feeding the signal which is observed during calibration to the control unit is restricted here to the multiplexer marked MUX, which contains driver stages which can be decoded via row and column signals.

The block marked MUX contains a logic by which it is possible to specify which comparison result (the comparison result of which comparator) is fed via a signal line VGL1 of the control unit. For the other calibratable amplifier stages, PA, FI and F2, the comparator unit VE, to which the electrical quantities to be compared are fed via the measurement lines 8, is provided.

If the architecture and detail design of the overall system made it possible to connect signal paths from each of the amplifiers to be calibrated through to one of the comparators in block COMP, and if these were precise enough, they would be able to take the role of the comparator unit VE, and the block marked VE in FIG. 28 could be omitted, and also the network 8. Additionally, none of the calibratable amplifier stages would need calibration outputs and their own third resources, because it would be possible to use the amplifier stages which are present in any case as third resources for the purposes of the invention. However, because of the interpolator IP, in the arrangement which is shown in FIG. 28 no use is made of this possible simplification, but it can be applied, for instance, to non-interpolated ADCs (ADCs of flash type).

In block SE of FIG. 28 there is the control unit 14, which carries out the calibration method. The resources according to the invention are controlled in the calibratable amplifier stages via the data bus DB, column selection signals (SS1 . . . SS5 in the example under consideration), row selection signals (via SRi, SRi+1 and SRi+2 in the example under consideration), and the read/write signal RW. As far as this control and the data transfer are concerned, the storage registers within the matrix of calibratable amplifiers appear to the control unit SE functionally similar to a RAM. Comparison results are fed via the two inputs VGL1 and VGL2 to the control unit, and by using them it can establish whether those properties of the amplifier stages which are to be calibrated are already at setpoint or not; if this is not the case, the setting values of the second resources are corrected accordingly.

Figure 29:
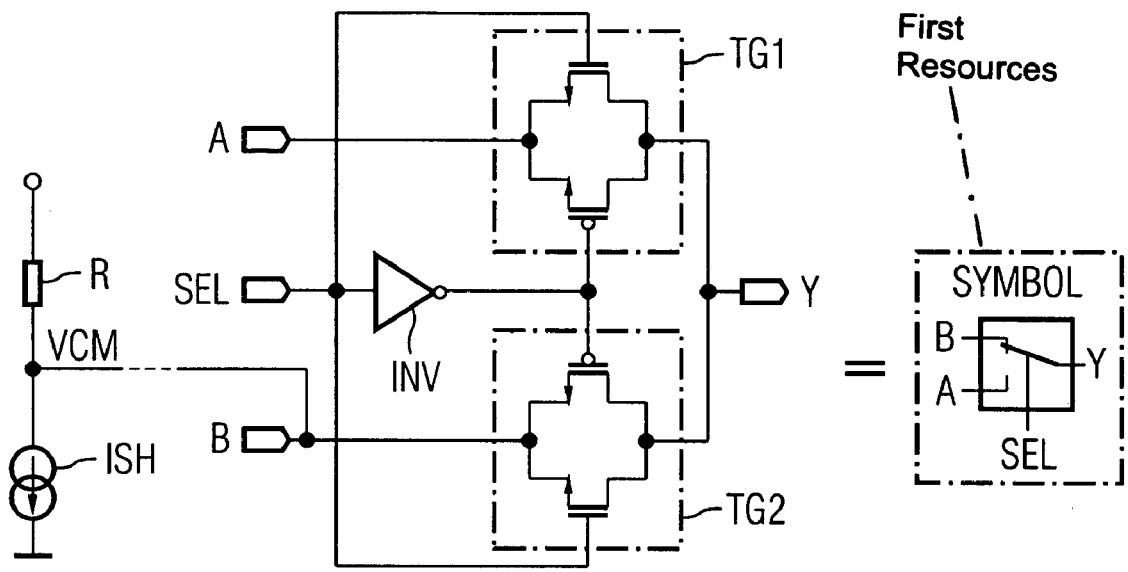
FIG. 29 shows a simple example of the circuit implementation of first resources with transfer switches.
Figure 30:
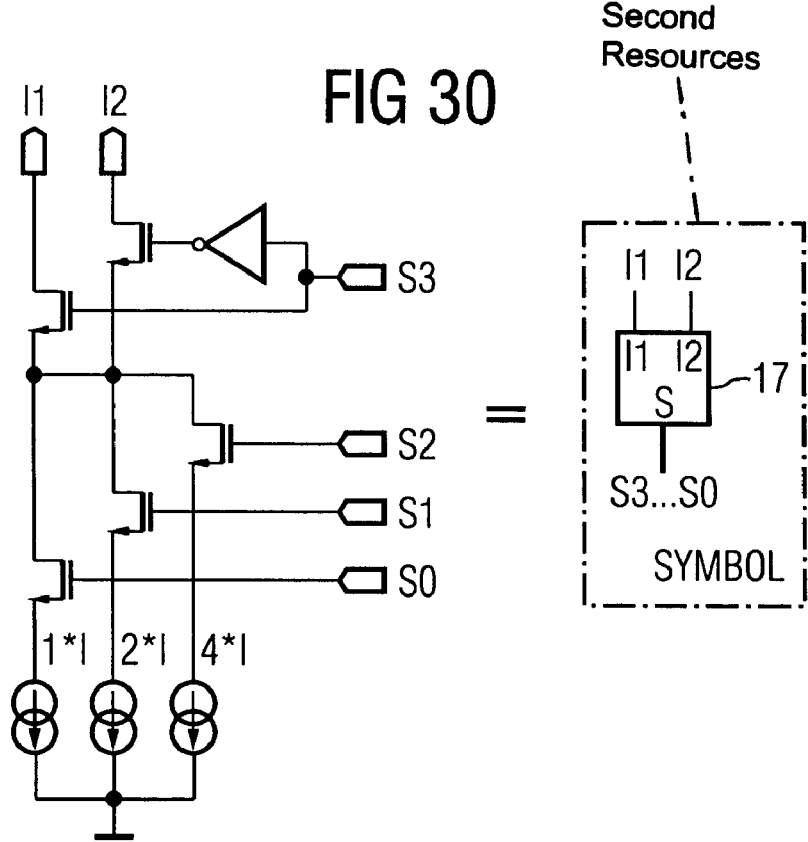
FIG. 30 shows a simple example of the circuit implementation of second resources.
Figure 31:
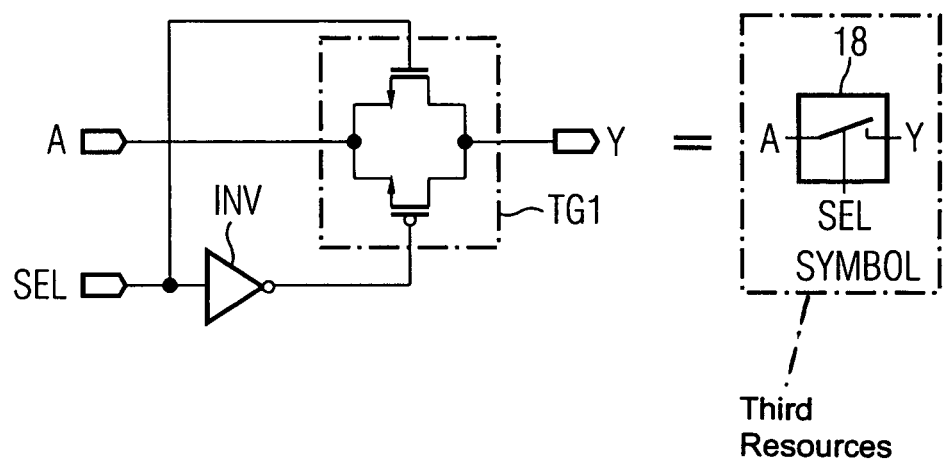
FIG. 31 shows a simple example of the circuit implementation of third resources.

Particularly simple implementations, which are suitable for practical use, of the first, second and third resources are shown as examples in FIGS. 29 to 31, whereas FIGS. 32 to 39 show as examples of particularly advantageous implementations of such resources for particular areas of use of the invention.

FIG. 29 shows a simple example of a circuit implementation of the first resources and the associated symbol for it. This involves two transfer gates TG1, TG2, which are controlled via a control input SEL and an inverter INV in such a way that if SEL=L transfer gate TG1 conducts, and if SEL=0 transfer gate TG2 conducts. FIG. 29 also shows as an example how an auxiliary potential VCM, corresponding to the equilibrium state of a preceding amplifier stage, can be generated. For this it is enough to lead a current source ISH to a resistor R. In the process, the current source ISH supplies half the bottom-end current of the current source IS of the amplifier from FIG. 24, and the resistor R has the same value as the resistors R1 and R2 of the amplifier according to FIG. 24.

FIG. 30 shows a simple example of a circuit implementation of the second resources and the associated symbol. Here, a number of binary weighted current sources are switched by controllable switches, which are set by signals S0 to S2, by further switches which are controllable by the signal S3 to either a terminal I1 or I2. Signal S3 corresponds to the sign of the error to be corrected.

FIG. 31 shows a simple example of a circuit implementation of the third resources and the associated symbol. This involves a simple transfer gate, which can be switched on and off by a signal SEL.

Figure 32:
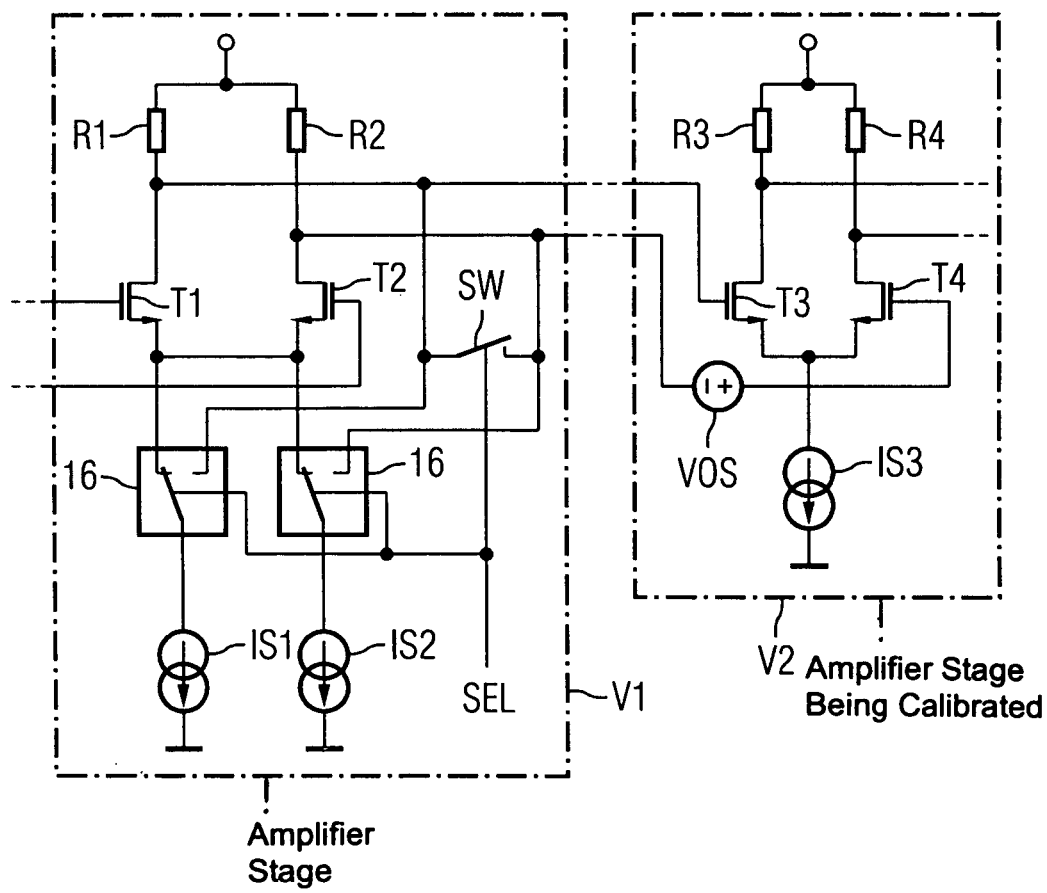
FIG. 32 shows a further example of the circuit implementation of first resources, in which these first resources are in a stage which precedes the stage to be calibrated, so that no transfer switches are required between successive stages.

FIG. 32 shows a circuit implementation of the first resources, these first resources being in an amplifier stage VI which precedes the amplifier stage V2 to be calibrated. In this way, transfer gates can be avoided in the signal paths for normal operation, which gives a speed advantage, particularly with relatively low supply voltages, or even makes the use of the invention possible.

The basic idea here is to affect the preceding stage in such a way that an essentially equal voltage is set at its outputs. If, for instance, the preceding stage is an amplifier stage according to FIG. 24, in principle this could be managed by switching off its bottom-end current source. The load resistors R1, R2 would then pull the output of this preceding stage to the same potential, and thus also the inputs of the subsequent stage. The off-switch for the bottom-end current source of the preceding stage would thus be the first resource of the subsequent stage. This example makes it clear that the resources according to the invention can be implemented in many ways, although this simple solution would have the disadvantage that the subsequent amplifier stage to be calibrated is calibrated with a different common-mode control than in normal operation.

In FIG. 32, a circuit which avoids this disadvantage is disclosed. The bottom-end current source here comprises two current sources ISI, IS2, each of which contributes half the current, and in normal operation (switch position in the figure), these are switched to the common source node of the differential pair TI, T2. In calibration operation, the current sources ISI, IS2 are each switched to one of the load resistors R1, R2. The switch SW is open in normal operation, closed in calibration operation. It must be designed with such low resistance that the potential at the outputs A1 and A2 is sufficiently balanced even if there is a mismatch of the current sources and the load resistors RI, R2. If previously calibrated current sources are involved, and the matching of the load resistors is good enough, which is not usually a problem with resistors, because they usually have better matching properties than transistors, the switch SW can also be omitted. The advantage of this inventive circuit arrangement is that the subsequent amplifier stage is calibrated with a common-mode control which corresponds to normal operation, and it is therefore possible to calibrate the offset voltage successfully even with a relatively high output conductance of its bottom-end current source IS3.

However, if the requirements are lower, the possible solution which is not shown pictorially but mentioned above, i.e. simply disconnecting the bottom-end current source of the preceding amplifier stage, is usually enough.

Figure 33:
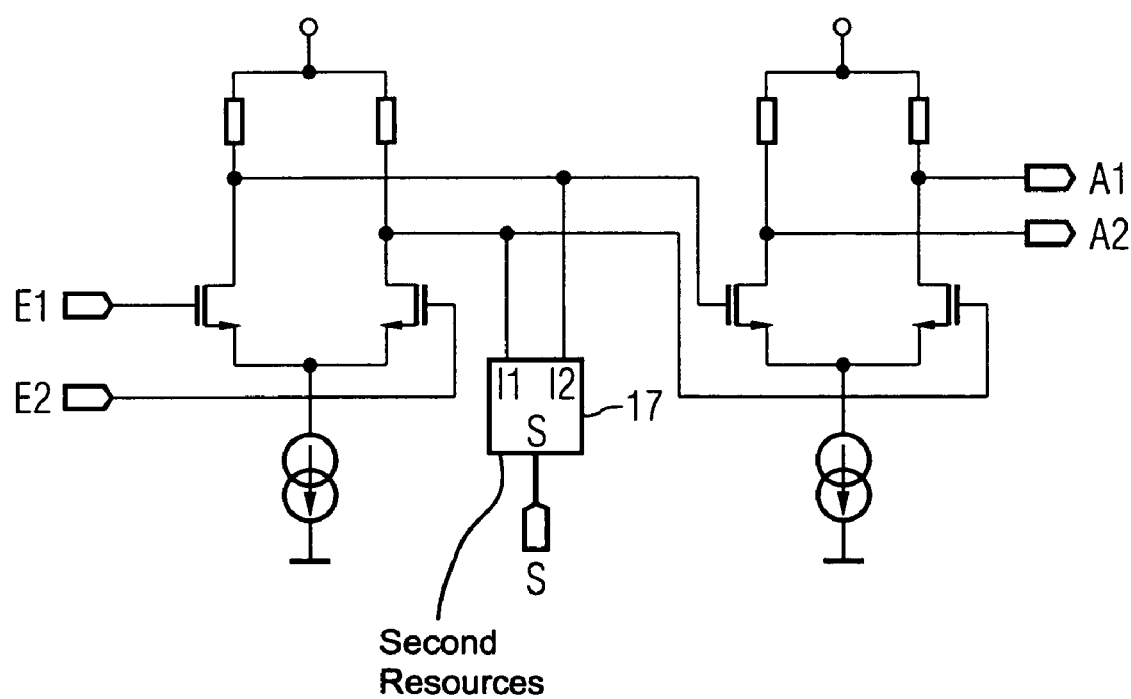
FIG. 33 shows an example, which is suitable for folding ADCs, of the use of second resources in a two-stage amplifier.

FIG. 33 shows a suitable example for folding ADCs of a two-stage amplifier, in which the second resources according to FIG. 30 can also be used for folding stages. Since in the case of folding stages multiple calibratable amplifier stages are interconnected at their outputs, forming trees of such amplifiers, it is impossible to put the second resources according to FIG. 30 directly onto the outputs A1, A2 of the amplifier, since otherwise the second resources would be short-circuited and thus independent calibration of the interconnected individual amplifiers would be impossible. The multistage construction according to FIG. 33 shows the way out. The second resources are here connected between two differential amplifier stages, in such a way that connection of the outputs A1, A2 has no undesired reaction on the second resources. Such a two-stage construction also brings further advantages (bandwidth), since the required amplification can be distributed to two stages.

Figure 34:
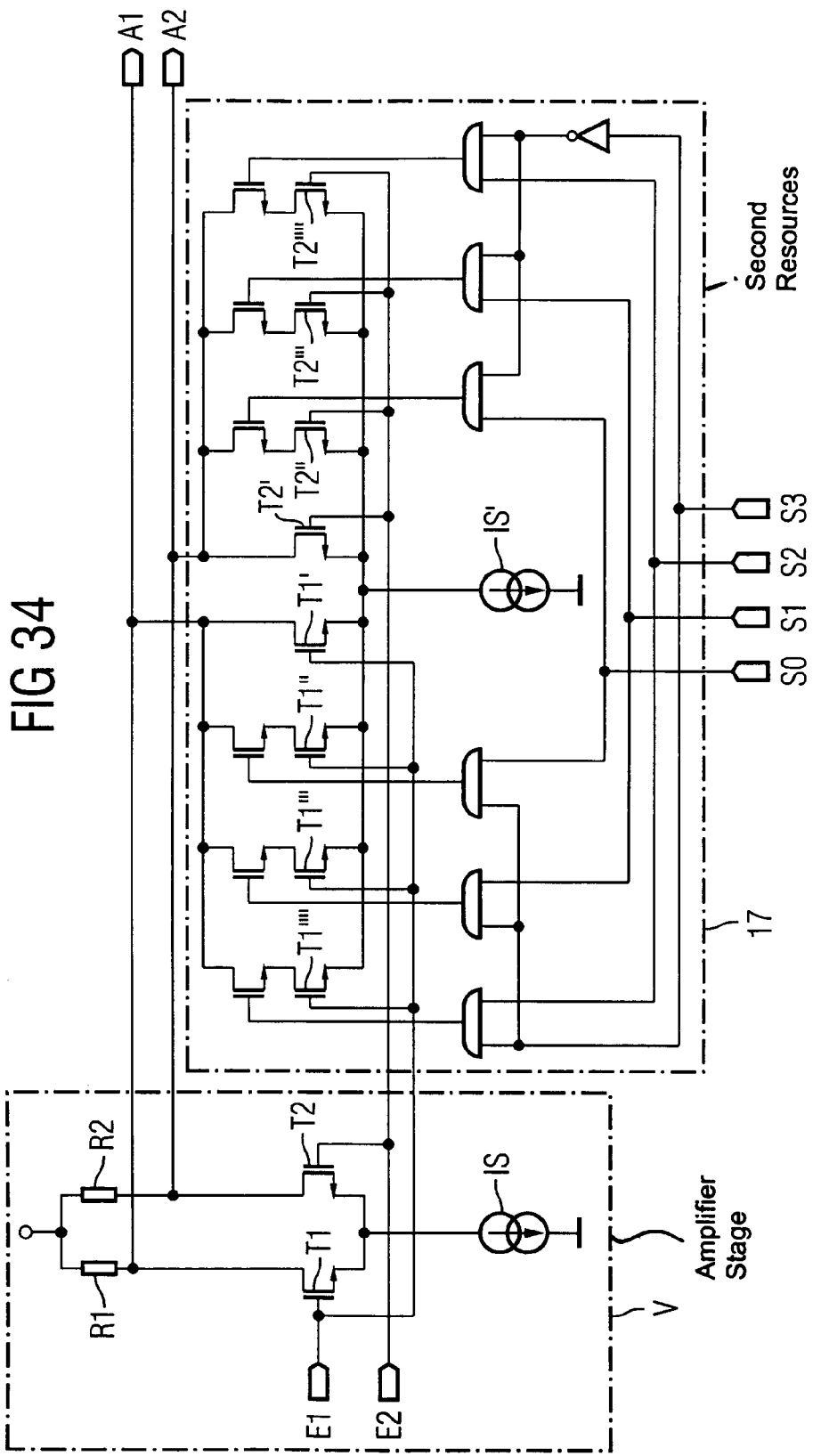
FIG. 34 shows an example, which is particularly suitable for folding ADCs and also functions in the case of a single-stage folding amplifier, of the circuit implementation of second resources.

FIG. 34 shows as an example a further suitable example for folding ADCs of a circuit implementation of the second resources. In parallel to the input differential pair T1, T2, switchable transistors T1', T1", T1''', T1'''' and T2', T2", T2''', T2'''' are connected, the gate terminals of all transistors T1 [lacuna] . . . T1'''' and T2 [lacuna] . . . T2'''' being connected. In the process, the drain terminals of transistors T' . . . T1'''' are connected via controllable switching transistors to the output A1, and the drain terminals of transistors T2' . . . T2'''' are connected via controllable switching transistors to the output A2. For instance, if the width of the transistors is binarily weighted, the result with three additional differential pairs—as in the example—is up to eight graduations, with four the result would be sixteen graduations, etc. It is expedient that the bottom-end current source IS', which is connected to the source terminals of the additional transistors T1' . . . T1'''' and T2' . . . T2'''', supplies a significantly smaller current than the bottom-end current source IS of the differential pair TI, T2. By changing the current in IS', the offset correction range could be controlled, if this is required.

Figure 35:
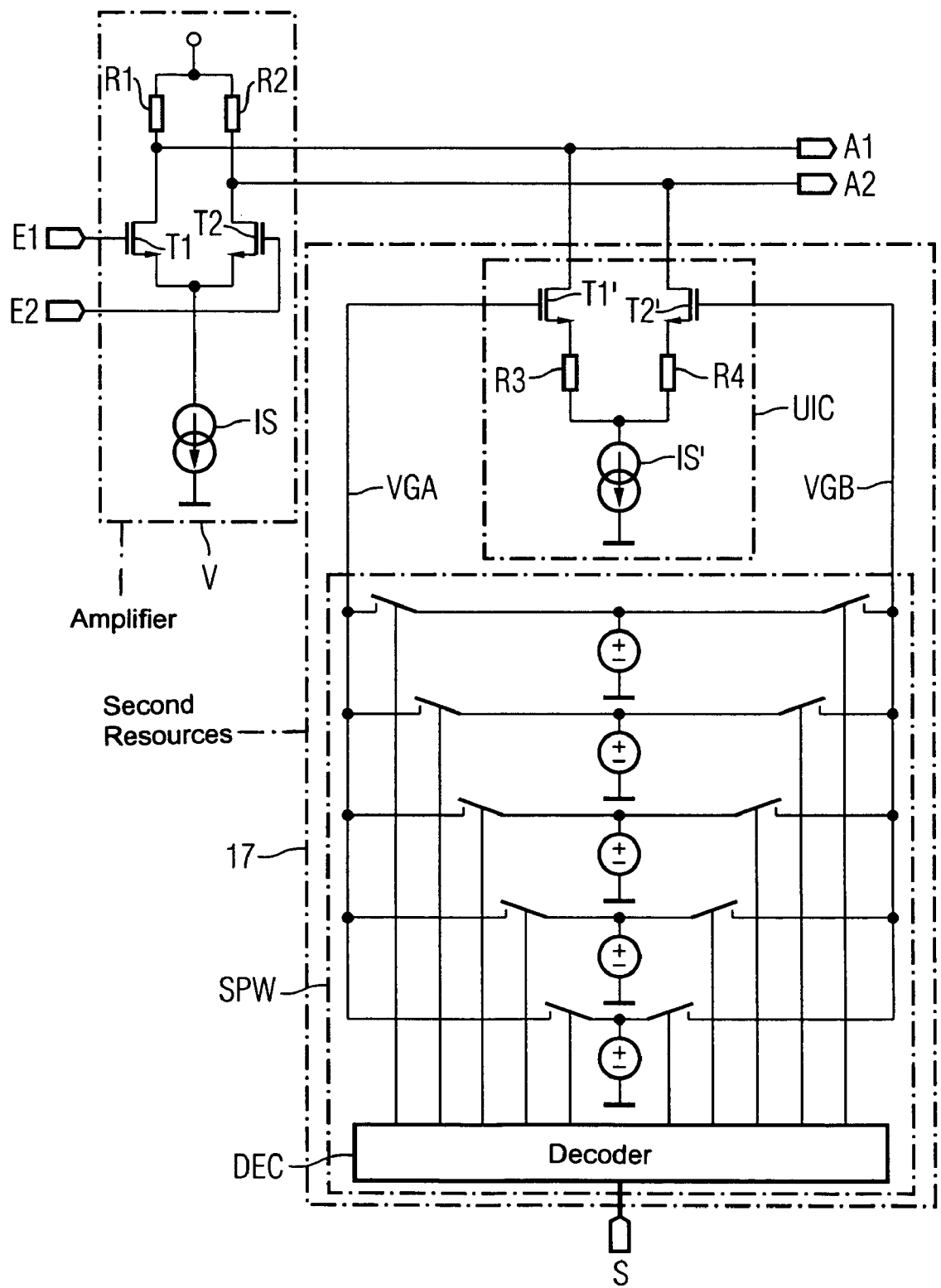
FIG. 35 shows a basic principle according to the invention and an exemplary embodiment of the circuit implementation of second resources with particularly good common-mode rejection.

FIG. 35 shows a particularly advantageous implementation of second resources, within block 17. This is characterized by a voltage-controlled differential current source UIC, which affects the load elements R1, R2 of the calibratable amplifier, and a voltage selector SPW, which under the influence of control inputs S selects suitable voltages and feeds them via its outputs VGA and VGB to the voltage-controlled differential current source UIC. UIC and SPW together form the second resource 17 according to the invention.

The internal circuit which is specified in blocks UIC and SPW in FIG. 35 should be seen as a possible exemplary embodiment. In general, any expedient voltage-controlled differential current sources and voltage selectors can be used to implement this particularly advantageous digitally controllable differential current source. Its advantages are a high common-mode rejection even against disturbances which are connected via gates of switching transistors, since these are symmetrical if the design is suitable, and a low capacitive load on the internal nodes of the amplifier.

In the example, the voltage-controlled differential current source is implemented by a differential pair T1', T2'. Degeneration resistors R3 and R4 are used for linearization. With lower requirements, these resistors can be omitted. The prior art knows many circuit techniques to implement suitable voltage-controlled differential current sources, so-called transconductors, which can take the place of the example circuit in block UIC.

The prior art also knows many possibilities for implementing suitable voltage selectors. Possible voltage selectors in the sense of the invention are characterized by a number of voltage sources, which can also be formed, for instance, from taps of a resistor chain, a number of controllable switches, with which the desired voltages can be selected and fed to the terminals VGA and VGB, and a control signal analyzer, for instance a decoder DEC, which sets the controllable switches. Any number of variants, which have the characterizing properties of the voltage selector, are possible here, e.g. implementation of the decoding by connecting controllable switches in series.

Figure 36:
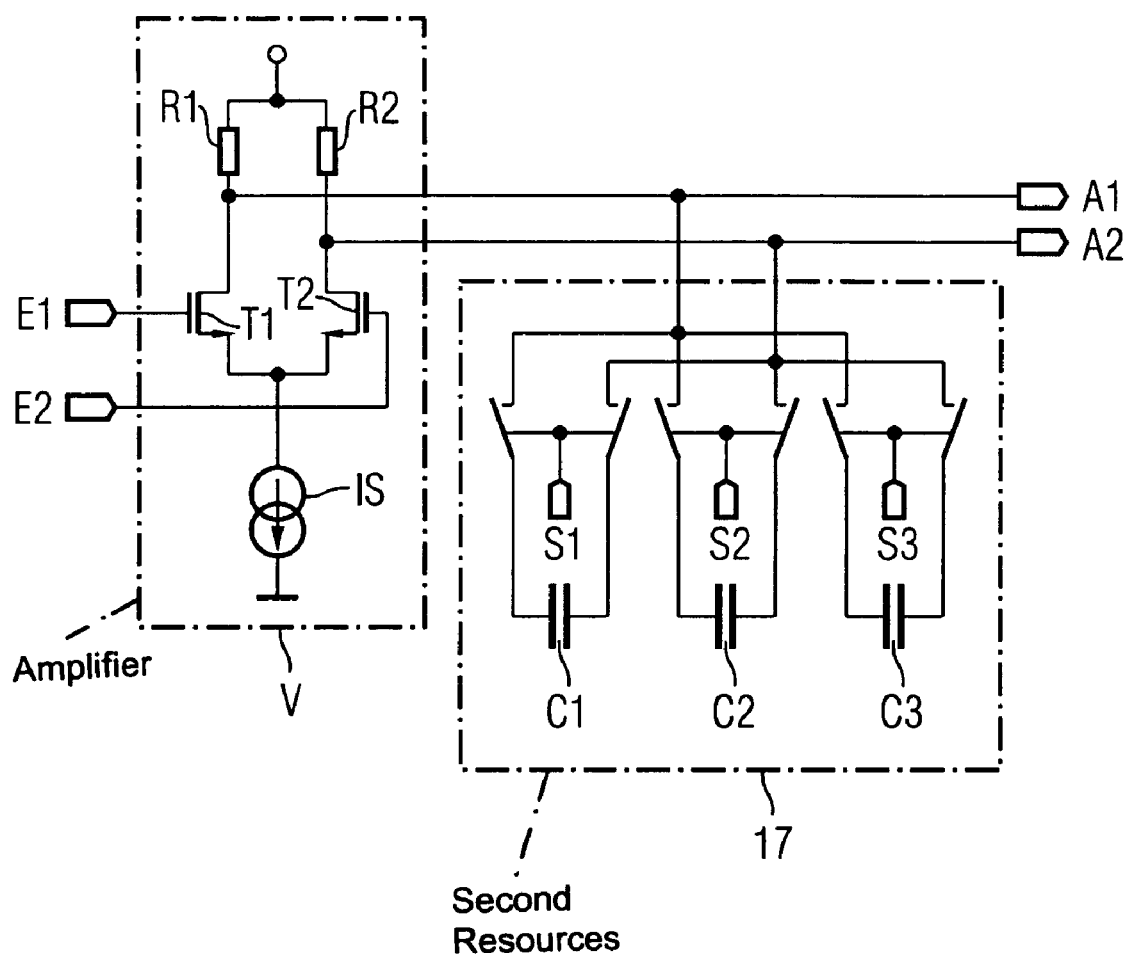
FIG. 36 shows an example for second resources for setting a frequency response.

FIG. 36 shows an example of a circuit implementation of second resources for calibrating a frequency response. Instead of switchable current sources as in FIG. 30, here capacitors are connected to nodes of the amplifier V. Here too, the circuit implementation of the amplifier is free, and any expedient amplifier circuit can take the place of the example.

Figure 37:
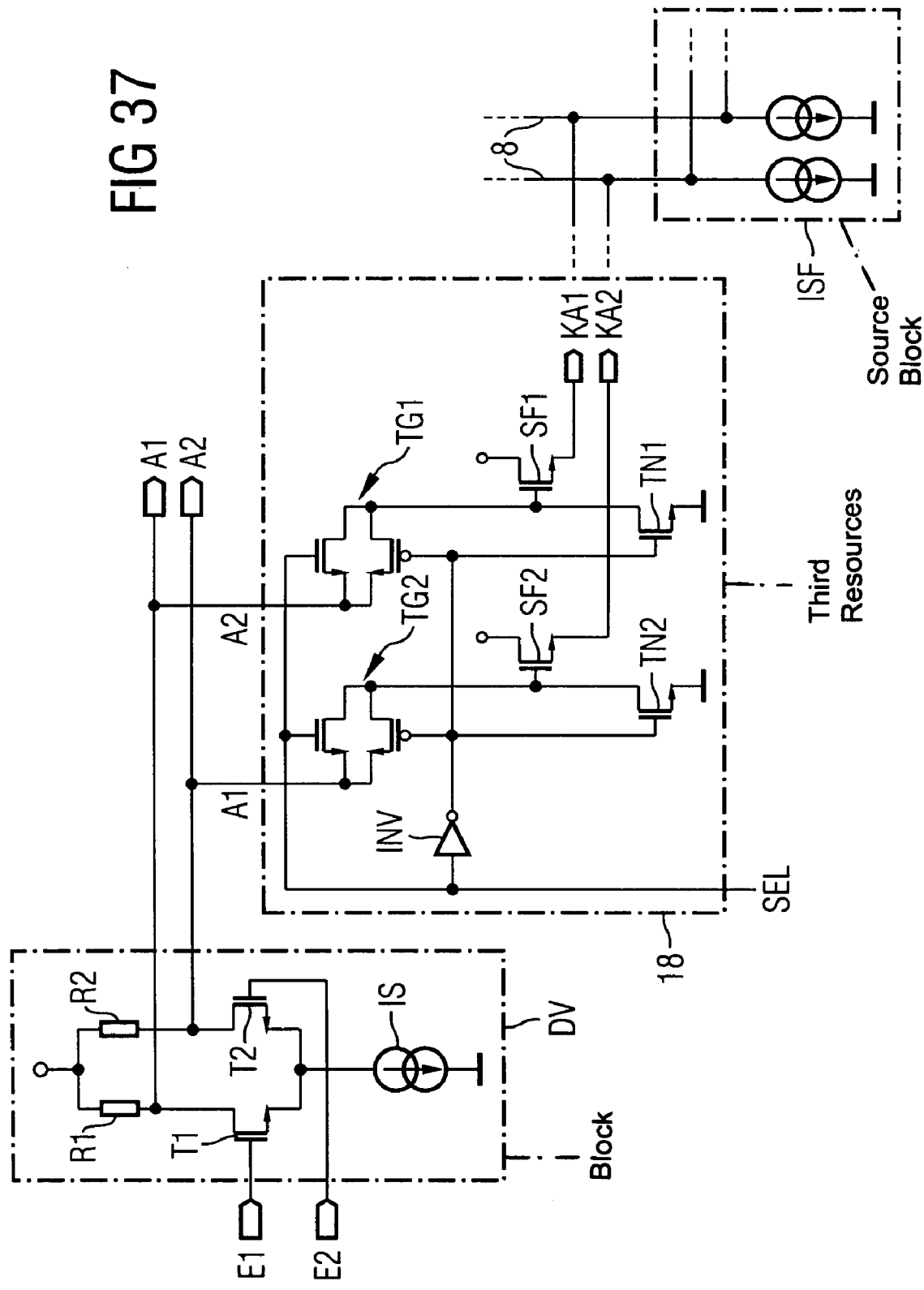
FIG. 37 shows a particularly advantageous example of the implementation of third resources, in which the capacitive loading of nodes of the amplifier stage in normal operation is minimized.

FIG. 37 shows an example of a particularly advantageous circuit implementation of the third resources. Here these comprise transfer gates TG1, TG2, downstream of each of which a source follower transistor SF1, SF2 is connected. The outputs of the source followers lead to the calibration outputs KAI, KA2 of the calibratable amplifier, which are connected via the measurement lines 8 to the current sources of the source followers in block ISF. These current sources therefore need to be present only once, at a central point.

In normal operation, SEL=0 and the transfer gates are disconnected. Because their transistors do not form channels, the capacitive load of the nodes of the calibratable amplifier is low. Because of the source followers, the transfer gates themselves can be designed to be significantly smaller than in the case of FIG. 31, where the transfer gates operate the measurement lines 8 directly. The source followers SF1 and SF2 are disconnected in normal operation, because their gates are pulled to ground via the transistors TN1 and TN2 under the control of the inverter INV. In calibration operation, with the selected calibratable amplifier stage, SEL=1. The transfer gates are switched on, TN1 and TN2 are switched off, and thus the source followers switch the nodes of the calibratable amplifier stage to the measurement lines 8.

Figure 38:
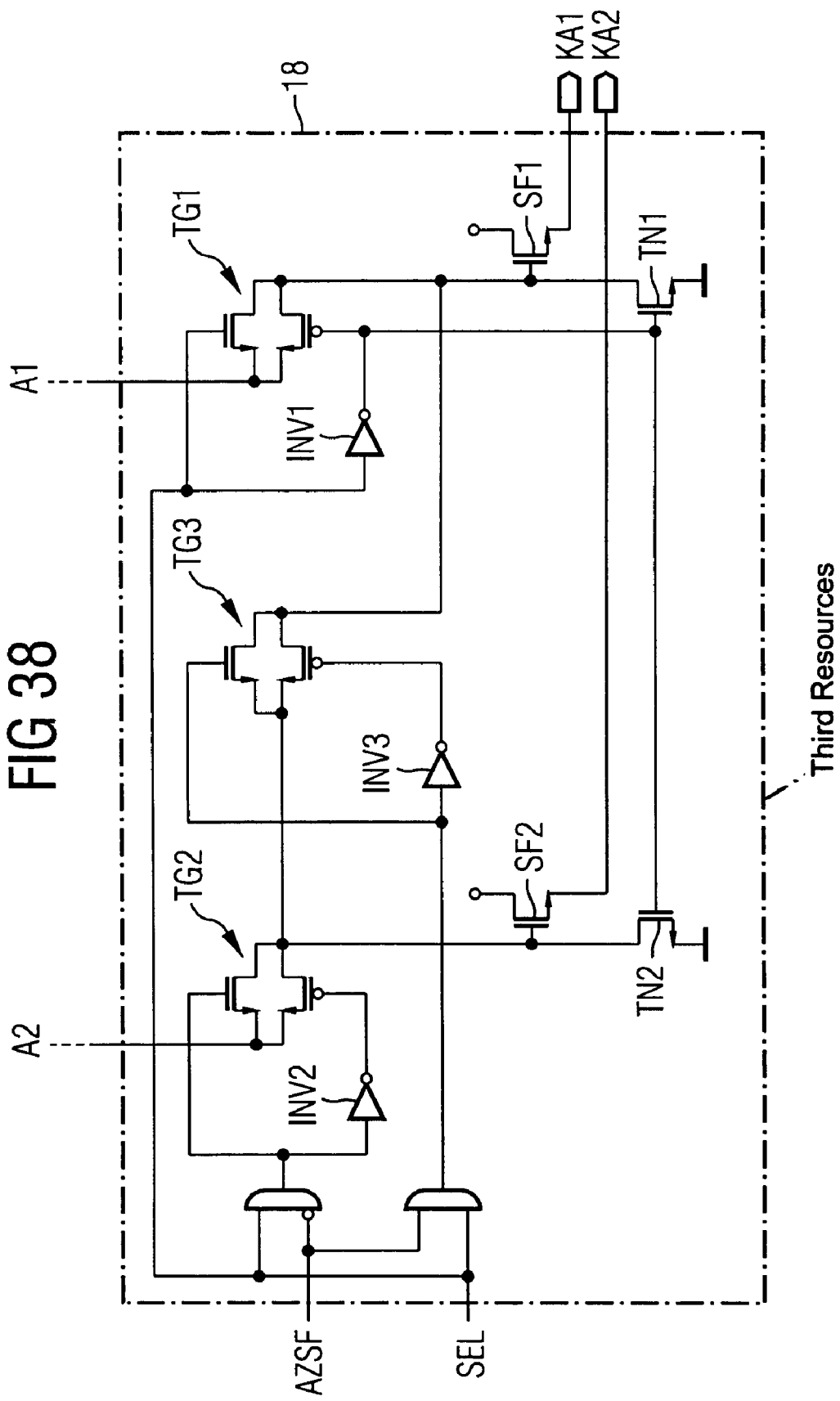
FIG. 38 shows the offset-compensatable variant of the third resources.

FIG. 38 shows an example of an offset-compensated variant of the third resources of FIG. 37. This action is required if a higher precision of calibration is wanted. An additional transfer gate TG3 and an additional control signal AZSF, which for instance can come from the storage register of the calibratable amplifier stage, make it possible, before the calibration of the amplifier stage, to carry out an offset compensation of the source followers. For this purpose, with SEL=1 and AZSF=1, transfer gate TG2 is still disconnected, whereas transfer gate TG1 connects the gate of SF1 to node A1. Transfer gate TG3 connects the gate of SF2 to the gate of SF1 and thus to the same potential, that of node A1. Admittedly TG3 could be connected to node A1 directly, but this would increase the capacitive load on A1 asymmetrically even in normal operation. In both variants, the gates of SF1, SF2 are at the same potential, so that an offset voltage of the source followers is manifested at outputs KAI and KA2 and can thus be calibrated out. How this happens is described further below relating to FIG. 39. After the calibration of the source followers, AZSF=0 is set, TG3 is then disconnected and TG1, TG2 are switched on, and the gate of SF2 is thus connected to node A2. The previously calibrated source followers now transmit the equilibrium state at A1, A2 without errors to the calibration outputs KAI, KA2, which lead to the comparator unit.

Figure 39:
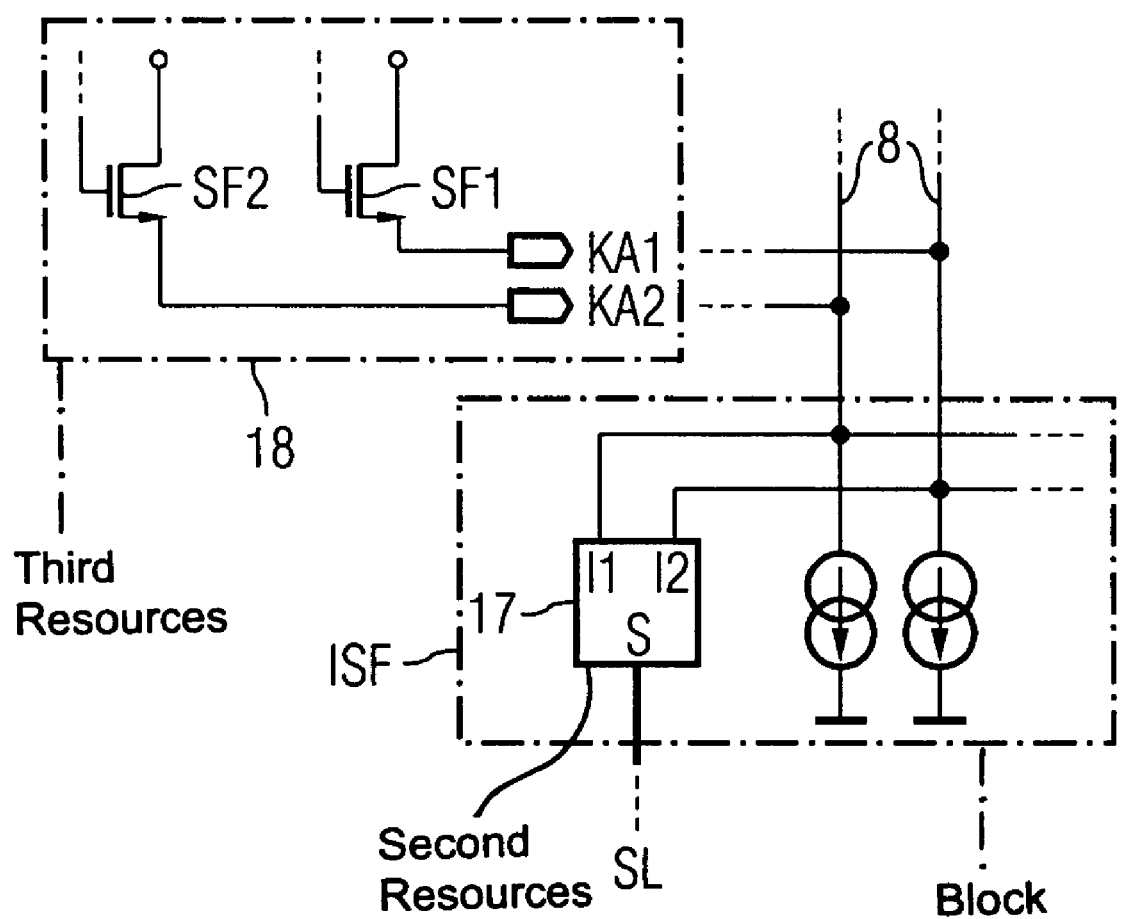
FIG. 39 shows an additional circuit which is required for its operation, for offset compensation.

FIG. 39 shows as an example how the current sources of the source followers, block ISF, can be extended, to carry out the offset compensation of the third resources according to FIG. 38 at low cost. At one or both current sources of the source followers, second resources 17, with which the current can be made adjustable by an average value, are provided.

It is thus easily possible for the control unit which carries out the calibration method to carry out the calibration of the third resources as described relating to FIG. 38 via the control lines SL. In this way, the more expensive second resources are necessary only once per current source block ISF, i.e. in the normal case only once per comparator unit, and not per third resource in the calibratable amplifier stages.

Figure 40:
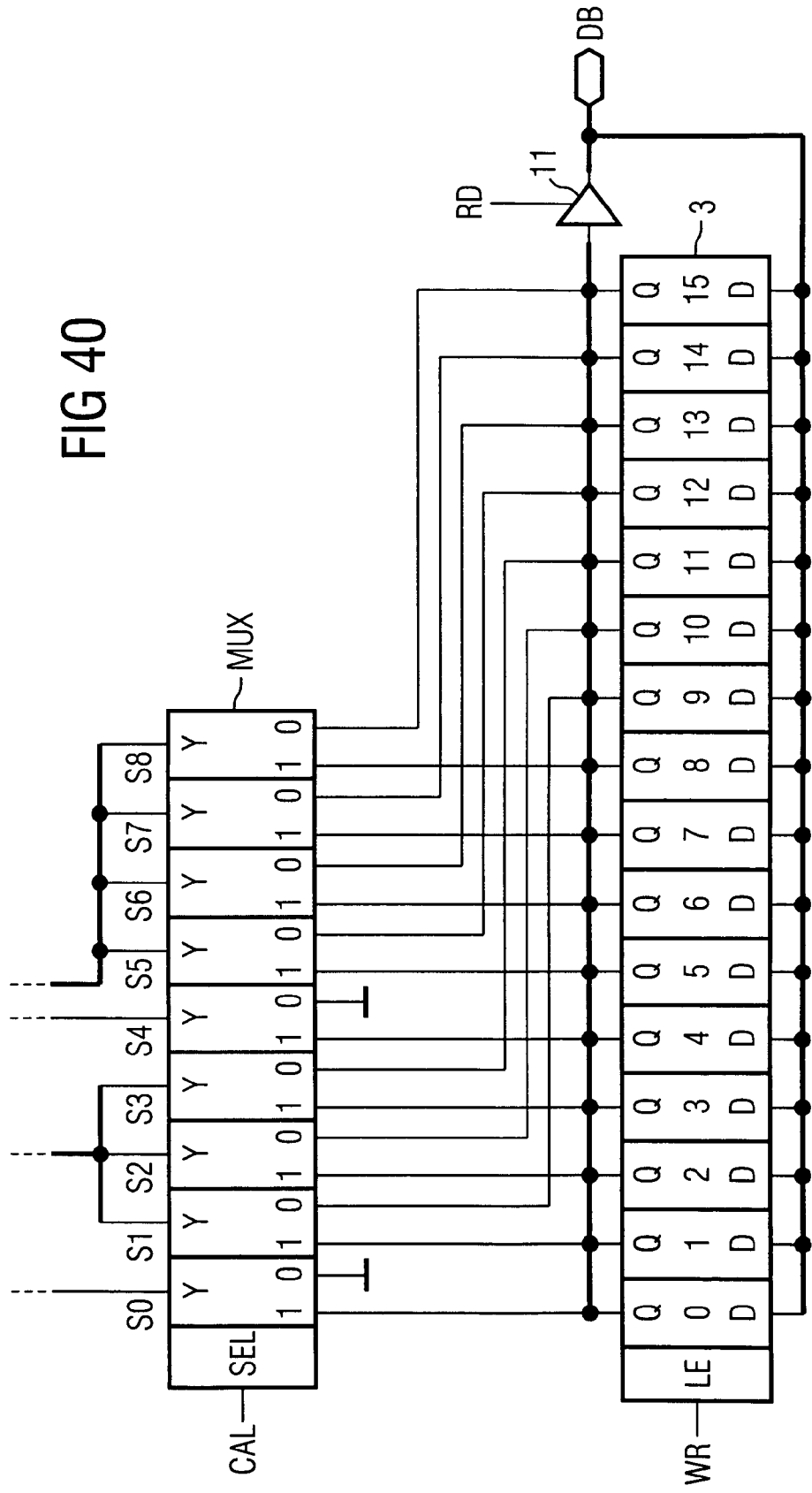
FIG. 40 shows an implementation of the storage register with combinational logic connected downstream, such that particularly quick changing between normal operation and calibration operation is possible.

FIG. 40 shows a particularly advantageous implementation of the storage register of a calibratable amplifier stage, in which particularly fast switching between normal operation and calibration operation is possible.

This occurs by extending the storage register by a second set of the storage cells which are required for normal operation and combinational selection logic, which is for instance constructed of 2:1 multiplexer cells, and is marked MUX in the figure. An additional global signal CAL, which is not shown in the preceding figures, and which is fed to all such calibratable storage cells, affects the combinational selection logic in such a way that in normal operation, CAL=0, the setting values which are provided for normal operation, in the example bits 9 . . . 15 of the storage register, are fed to the first, second and third resources, and in calibration operation, CAL=1, the setting values which are provided for calibration operation, in the example bits 0 . . . 8. As some of the multiplexer inputs which are permanently connected to ground show, it is unnecessary to provide a further storage cell for normal operation for all the control bits which are required in calibration operation, if a purely combinational link is enough to supply the setting value for normal operation.

Because of this extended storage register, the control unit is now capable of preparing a calibration step by writing to the storage cells which are provided for calibration operation, without changing the storage cells for normal operation. Then, by switching the signal CAL to 1, the whole calibratable system is put into calibration mode immediately, and after settling and when the result of the comparator units are present, it can be put back into normal operation immediately by resetting CAL to 0. The control unit can now analyze the result of the comparison and prepare the next calibration step, while normal operation continues. In this way, calibration steps can be inserted into normal operation in cycles.

This version of the invention, which uses the storage register according to FIG. 40, is capable, for instance, of interlacing the calibration method at every Nth cycle into an ADC which is clocked at full speed, creating the illusion that the calibration method runs in the background. So that this illusion is not deceptive, after a cycle in which the ADC was put into calibration mode, and the quantization result is therefore necessarily false, this false quantization result must not be further processed. This succeeds trivially by N=2 and each second quantization result being discarded, giving the impression of an ADC calibrated in the background with a halved sampling frequency. Nothing is lost by this, because self-calibrated ADCs which use the invention are significantly faster still than conventional ADCs even at half their maximum speed.

The description of the device according to the invention is concluded here. It is immediately possible for the particularist to make changes or additions to the circuits which are presented as examples, without changing the spirit and claim of the invention, e.g. the described circuits can also be constructed with complementary MOS transistors, or in the case of a BiCMOS process MOS transistors can be replaced with bipolar transistors, or cascodes can be fitted.

How the calibration method according to the invention works is shown below with reference to FIG. 26.

The calibration is started by a start signal which affects the control unit 14, and is not shown in the figure. This occurs expediently at least once, immediately after the integrated circuit is switched on.

If the system to be calibrated includes calibratable current sources, these are first calibrated to the appropriate setpoint value. This occurs by disconnecting the current sources from their normal sink and diverting the output current via a measurement line network to a comparator unit for currents. Depending on the result of the comparison, the control unit sets the second resources so that the observed current comes as close as possible to the setpoint value. For this purpose, linear search methods, upward/downward counters or binary search methods such as successive approximation are conceivable. Since the current sources are disconnected from their sinks during calibration, they do not affect each other and can therefore be calibrated in any sequence.

For calibration of offset voltages or other amplifier properties which cannot already be brought to setpoint during current source calibration, the sequence in which the stages are calibrated would not matter in the case that all calibratable amplifier stages have third resources and calibration outputs. However, this would increase the cost.

In a particularly advantageous variant of the calibration method, called cascaded step-by-step calibration, the method attempts to use connections, which are previously specified by the architecture of the calibratable system, between the calibratable amplifier stages, and through which they are connected to signal processing chains or signal processing trees, in such a way that additional third resources are saved, by using previously calibrated amplifier stages as third resources for calibration of calibratable amplifier stages which precede them. As a rule, therefore, additional third resources are only necessary at the respective ends of the signal processing chains or signal processing trees. If there are suitable comparators at these ends, they can even be used as comparator units for the purposes of the invention.

The method of cascaded step-by-step calibration begins with the calibration of those amplifier stages which are at the ends of the signal processing chains or signal processing trees, e.g. V3. When these are calibrated, they are used in the subsequent calibration steps as third resources, to amplify the output voltages of preceding amplifier stages, e.g. V2, and to feed them to the comparator unit or comparator units. This occurs preferably using connections which exist in any case. However, fitting additional third resources, which avoid individual or a plurality of amplifier stages, to feed the signal to the comparator unit via further amplifier stages, is also conceivable. Until now however, no case in which this complication would be necessary has been found in practice. Even for such complex structures as folding ADCs, suitable third resources exist so that it is possible to set up unique signal paths through the amplifier matrix.

The calibration method thus proceeds systematically from stage to stage, e.g. V3, V2, V1, until all calibratable parameters in all amplifier stages are at setpoint.

If this is unsuccessful, e.g. because of an error in the manufacture of the relevant integrated circuit, the control unit can establish that the calibration has failed because one of the parameters cannot be brought to setpoint. The control unit can then pass on this fact as an error report, so that in the case of a circuit which is equipped with the invention there is also a self-test, which can considerably reduce the test time and cost for manufacturing such an integrated circuit.

For cases in which the failure of the self-test can be attributed to an excessively small correction range for errors, e.g. offset voltages, the correction range has been made centrally adjustable by the control unit, by making it possible to affect the currents in the current sources of the second resources. The described self-calibration method can then increase the correction range step by step, until calibration is successful, or if it is still unsuccessful, the integrated circuit can finally be assessed as defective. Resulting byproducts include not only a completion report, but a classification of the integrated circuits into, for instance, first, second and third choice, without having to involve expensive automatic test machines.

After successful conclusion of the calibration, the calibratable subsystem, e.g. an ADC, is ready for normal operation. However, because of unavoidable effects such as slow temperature and supply voltage variations, the calibratable subsystem will unavoidably drift out of calibration.

By restarting the calibration from time to time, it is possible to compensate for this drift effect. This is feasible, in particular, in systems in which the calibratable subsystem is not used continuously, e.g. in the case of disk storage drives it is pointless to digitize the data coming from the read head during head movement. In this case it would be possible to insert the calibration method without loss of performance.

If such an interruption possibility does not exist, by using the storage register according to FIG. 40 it is possible to create a speed-optimized switching possibility between normal and calibration operation, so that the individual calibration steps can be inserted into normal operation in cycles, and continuous calibration takes place in the background.

A detailed description of devices and methods for compensation for errors which are present in devices connected upstream of an amplifier stage now follows.

First, compensation for an error in a reference voltage divider (compensation for an erroneous reference voltage) is described.

Reference voltage dividers comprise a chain of resistors, and are used above all in analog/digital converters (ADCs) of flash or folding type.

In the input stage of such an ADC, there are usually numerous differential amplifiers, to which the input signal to be quantized is fed at a signal input, and to which a reference potential which is derived from a reference voltage divider chain is fed at a reference input.

Figure 41:
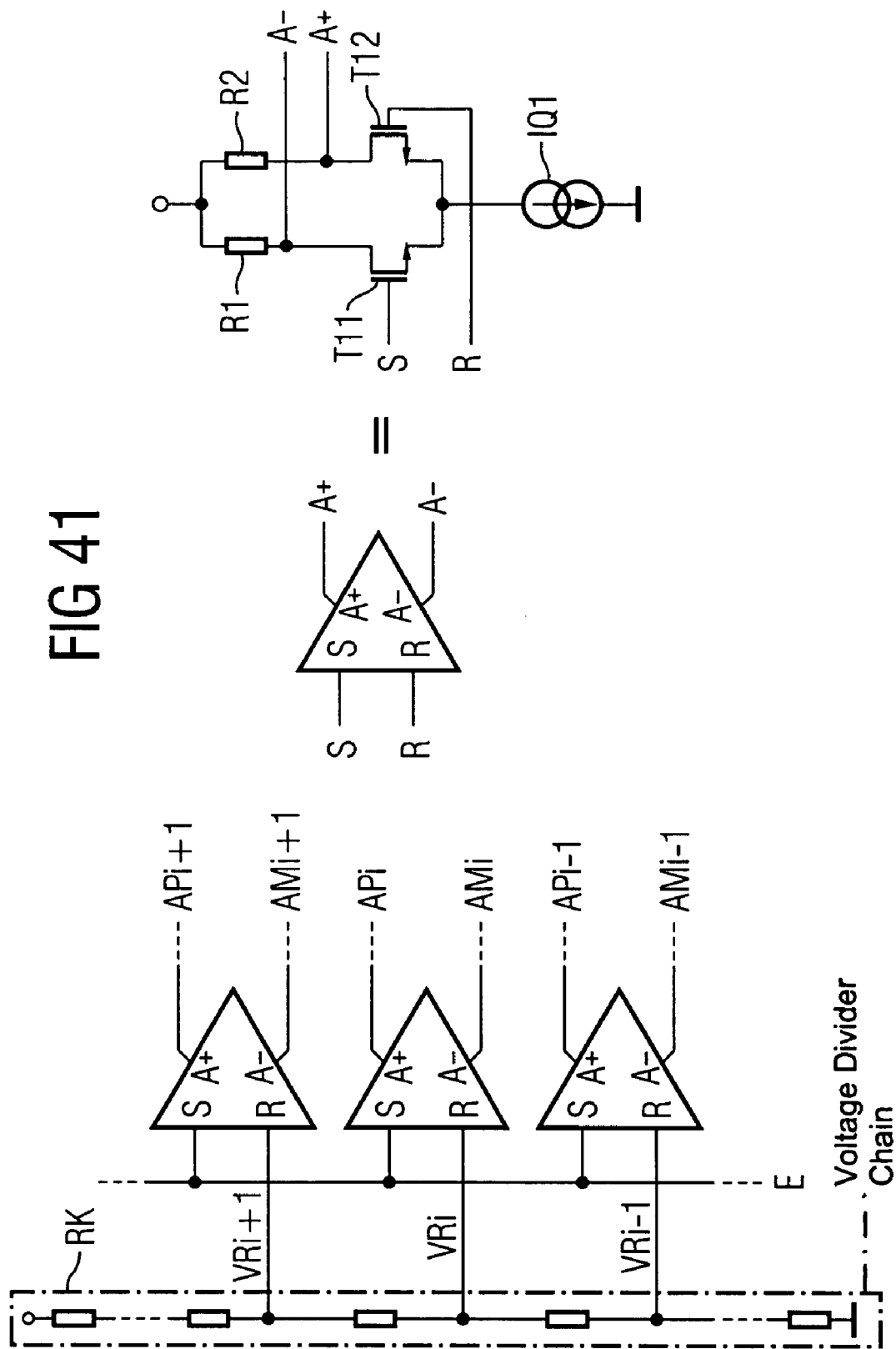
FIG. 41 shows the input stage of an ADC.

In FIG. 41, which shows a section from a known input stage of such an ADC as an example, the reference voltage divider chain is marked RK, the reference potentials which are derived from it are marked $VR_{i-1}$, $VR_i$, $VR_{i+1}$, the input signal to be quantized is marked E, and the differential amplifier inputs are marked S and R. The task of the differential amplifiers is to compare the input signal E with the appropriate reference potential.

Such an input stage of an ADC has the disadvantage that the precision of the quantization, even assuming ideal properties of the differential amplifiers and the circuit stages which follow them, can in principle not be more precise than the precision of the reference potentials at the taps of the reference voltage divider chain.

It is usually possible to implement a reference voltage divider chain for lower requirements, e.g. an 8-bit video ADC, as it is without any problems, e.g. as a polysilicon strip. However, for higher speeds it is necessary to implement the reference voltage divider chain with lower resistance, so that in general a material with a lower resistance per unit length must be taken.

Here salicided polysilicon suggests itself. However, because of the larger grain size of the salicide, the result would be larger statistical variations of the resistance values between the reference voltage taps. It would only be possible to avoid these by a greatly increased area of the reference voltage divider chain.

In practice, this often becomes unusably large as a result, so that some developments have turned toward the use of metal conductor tracks as reference voltage dividers. These are usually implemented as meandering structures, which wind through a matrix of differential amplifiers. A matrix arrangement usually represents the best possible solution, to minimize the length of time-critical signal lines, but simultaneously brings the disadvantage that systematic errors are added to the statistical variations of the reference resistor segments, since not all segments can have exactly the same layout.

These errors are difficult to model and to predict, so that with the known prior art several mask versions and production runs must be expected if high precision of the reference voltage divider chain is required, for instance for a 10-bit or 12-bit ADC, resulting in a high cost and an unplannable loss of time.

Below, a device and a method are described, with which, above all, the effects of errors of the-reference voltage divider chain or other reference voltage generators can be minimized by a process to calibrate the ADC. As a further beneficial effect, with a certain version of the invention it is possible also to minimize static errors of functions connected upsteam of the ADC, particularly a sample-and-hold or track-and-hold stage, likewise by the calibration process.

Above, devices and methods with which, among other things, offset errors of differential amplifiers can be minimized by a self-calibration method, have already been described in detail. Because statistical or systematic variations of the reference voltage potentials around their respective setpoint value have the same effects as offset errors of the differential amplifiers, the device and method for calibrating these offset errors in the way which is disclosed here can be used to calibrate out errors in the reference voltage divider chain.

The idea on which the devices and methods which are described below are based has already been described above with reference to FIGS. 17 and 19.

The following explanations include a more general representation and advantageous developments, and give further possible uses.

A particularly advantageous version of the basic idea involves including a sample-and-hold stage in the calibration process:

Because a static non-linearity error or a static offset error of a sample-and-hold stage can be mapped onto a corresponding systematic error of the reference potentials within the ADC, it is possible in principle to calibrate out these errors of the sample-and-hold stage, if this is included in the calibration process. The basic idea for this is already included in FIG. 23 and the description which refers to it. In this example, a so-called distributed-track-and-hold is represented, but where the sample-and-hold stage is is not significant for the possibility of calibrating its errors, if the device and method according to the invention are used, provided that the calibration signal source feeds in its signal before the sample-and-hold stage. The architecture of the analog/digital converter may be different in each case here, but the device and method of calibration are the same.

The in [sic] proposed device is described using the example of an analog/digital converter which includes a reference voltage divider chain, the taps of which lead to reference inputs of several differential amplifiers, the offset voltages of which can be calibrated independently of each other, [sic].

The described device has the following particular features:

that resources to generate a calibration signal and feed it to signal inputs of the differential amplifiers are present, and that the calibration signals are in such a form that they simulate the ideal values of the potentials at the reference voltage divider chain taps with the precision required in each case.

The particular features of the calibration method are that in calibration mode the calibration signal is fed to the differential amplifiers instead of the input signal of the ADC, and that then that part of the offset compensation method is gone through in which the offset voltage of the differential amplifier is set so that an equilibrium state is set up at the output of the differential amplifier.

The use of the calibration signal as the input signal of the differential amplifier during calibration of the offset voltages of the input stage of the ADC, because of the fact that the differential amplifiers cannot distinguish between the reference signal and the calibration signal because of their internal symmetry, causes the appropriate offset voltage of a differential amplifier to be set to a value which is opposite to the error of the appropriate reference potential and to a large extent equal to it in amount, so that these errors largely cancel each other out, and thus almost ideal quantization thresholds result.

This individual setting of the quantization thresholds within the differential amplifiers of the input stage of the ADC through setting the offset voltages of these differential amplifiers to compensate for offset errors, errors of the reference voltage divider chain, and/or errors of other circuit stages connected upstream of the differential amplifiers is a feature which is absent from the devices and methods for calibrating ADCs which are known from the prior art. There are numerous known calibration methods which use a calibration digital/analog converter (calibration DAC) to generate a calibration signal, and then try to correct errors, for instance using a digital correction table which is provided behind the ADC. These methods usually fail in practice because the ADC as such must then have a significantly higher number of sufficiently monotonic quantization steps to reach a calibrated quantization by converting its output code using the correction table. For instance, a 10-bit ADC with a differential non-linearity DNL of less than 0.5 LSB would be required to obtain an 8-bit ADC with a differential and integral non-linearity of less than 0.125 LSB according to the correction table. However, because a DNL of 0.125 LSB of the 8-bit ADC corresponds to the 0.5 LSB of the 10-bit ADC for the possible absolute resolution, nothing is actually gained by this and similar methods apart from the possibility of correcting an integral non-linearity INL. In particular, it is impossible to correct those errors of the 10-bit ADC which would lead to coding conflicts of its least significant bits and would make this ADC and thus the whole calibration concept using the correction table incapable of functioning. With these known calibration methods, therefore, the 10-bit ADC can allow itself no greater statistical variations of the reference potentials and offset voltages of the differential amplifiers, and consequently becomes expensive in area and otherwise.

In contrast, the device and method which are disclosed here make it possible to set the quantization steps as precisely as desired, restricted only by the resolution and setting range of the resources for setting the offset voltage of the differential amplifiers, and if required also to calibrate a non-linear correction function into the ADC, which can be used, for instance, to correct static linearity errors of signal processing stages connected upstream of the ADC, if these are included in the calibration. In practice, by using the invention which is disclosed here, it is possible to calibrate an ADC which would be unusable per se without calibration, with serious faults, e.g. a DNL of more than one LSB, thus a non-monotonicity, to the quality standard of a premium ADC.

FIG. 42a shows a block circuit diagram of the device according to the invention.

The resource to generate the calibration signal is marked KSG, and its output is marked K. A further resource, marked US, makes it possible to switch between the input signal E and the calibration signal K. In normal operation, the input signal E is fed to the inputs S of the differential amplifiers which are in the calibratable input stage ES of the ADC. In calibration operation, the calibration signal K is fed to the inputs S of the differential amplifiers.

Figure 42B:
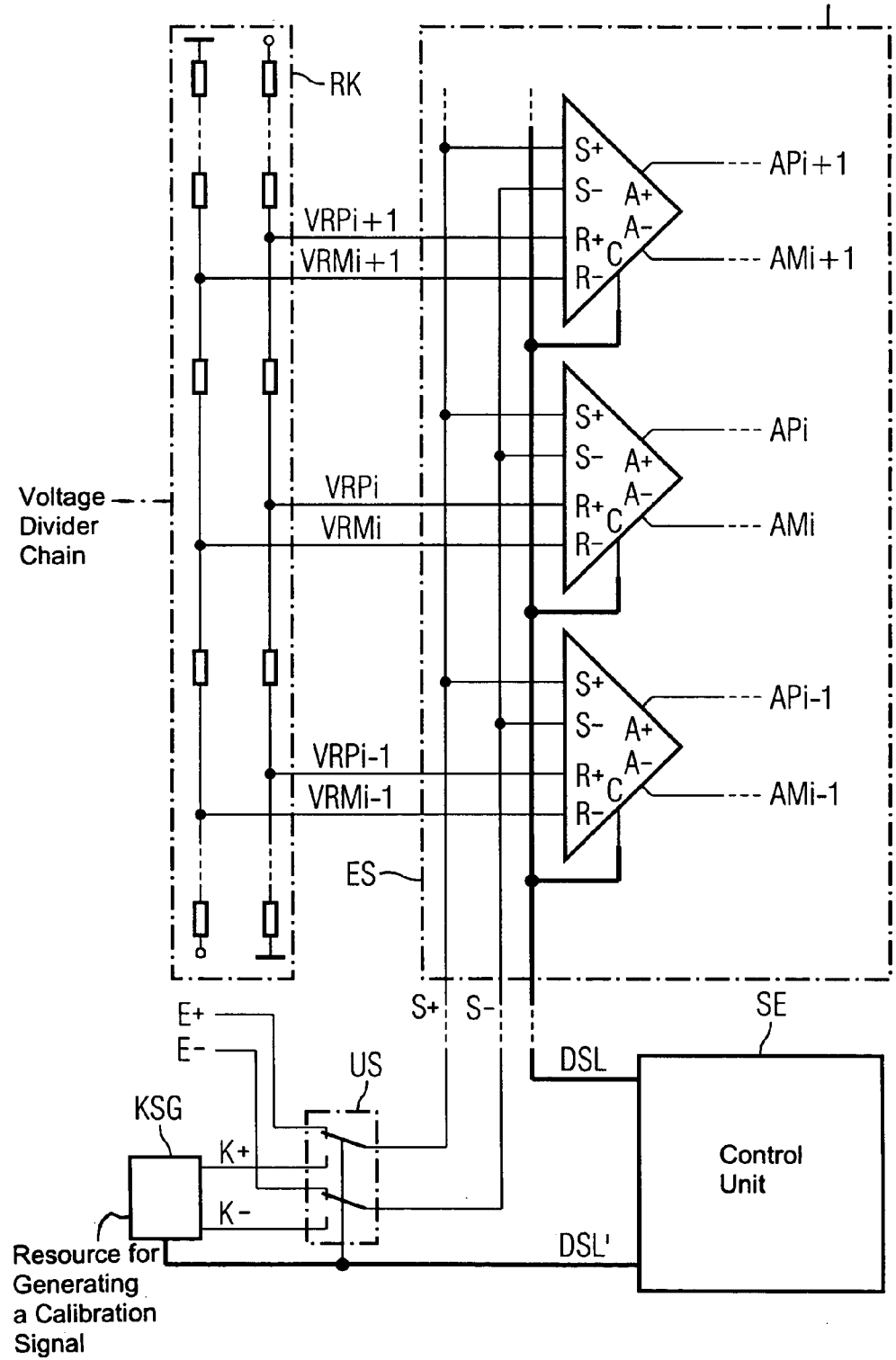

FIG. 42b shows a fully differential implementation with input signals E+, E− and calibration signals K+, K−, either of which can be fed to the inputs S+, S− of the differential amplifiers via the resource US. Signals E+, K+ correspond to signals E and K from FIG. 42a, and input S+ corresponds to input S. Signals E−, K− are the respective complementary signals of E+, K+, i.e. when E+ increases E− decreases and vice versa. In practice, the sum of the differential signals E+, E− and K+, K− is preferably held at a constant value. The purpose of the fully differential construction is better rejection of common-mode interference signals.

In FIGS. 42a, 42b, at least the differential amplifiers of the input stage ES of the ADC are equipped with a device for offset calibration, and to control this device, they are connected via data and control lines DSL to a control unit SE, which carries out the calibration method. As devices and methods for offset compensation of the differential amplifiers, the calibration devices and methods referring to FIGS. 1 to 40, but also any other calibration devices and methods for offset compensation of differential amplifiers, can be used. For the proposed calibration of the reference voltage divider chain, all that is relevant is that the control unit SE can set the offset voltages of the differential amplifiers individually, and by analyzing the output signals of the differential amplifiers it can test whether an equilibrium state is present at them or not. Additionally, the control unit must be able to control the generation of the calibration signal in block KSG and resource US, for which purpose KSG and US are also connected to the control unit SE via data and control lines DSL'. The control unit SE controls the calibration of the differential amplifiers and the reference voltage divider chain.

FIGS. 42a and 42b represent the most general embodiment of the invention. In particular, no explicit assumptions are made about the location of any driver stages, sample-and-hold stages or track-and-hold stages, which are required for practical implementation of an ADC according to the prior art. Any necessary driver stages could be part of the resource US, or if the input capacitance of the differential amplifiers is low, it can be arranged before them or omitted, and the sample-and-hold or track-and-hold function could be arranged as in [16] as a so-called "distributed sample and hold" after the input stage ES within the ADC, or for small signal bandwidths it can be omitted.

Figure 43:
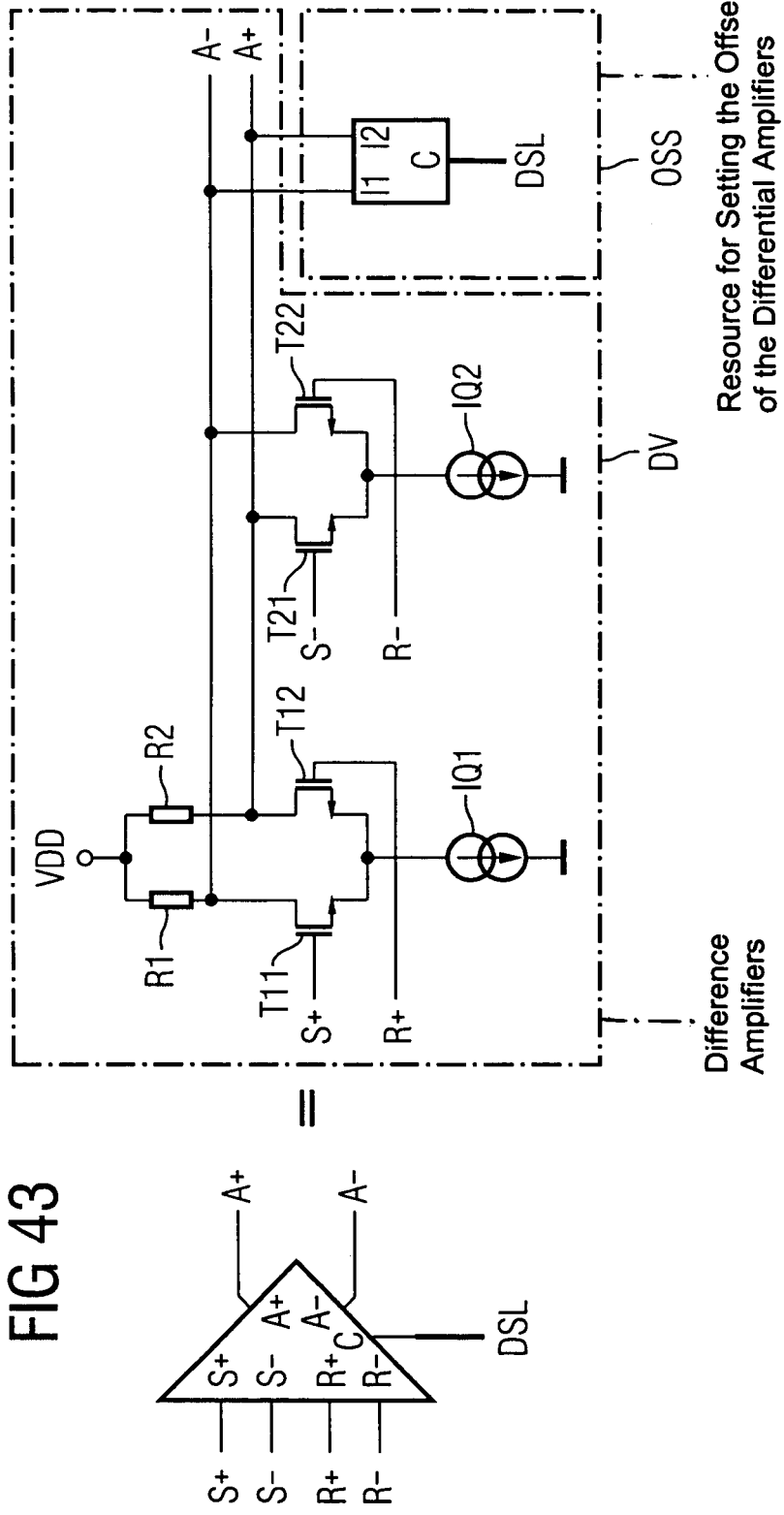
FIG. 43 shows the structure of the differential amplifier which is shown in FIG. 42b, FIGS. 44a and 44b show further embodiments of a device to eliminate errors in a reference voltage divider chain.

FIG. 43 shows one possibility for implementing one of the differential amplifiers which are shown in FIG. 42b of the input stage ES for fully differential input signals (box DV) and a resource which is connected there to, for setting the offset voltage of the differential amplifier (box OSS).

Compared to an implementation which is not fully differential, the differential amplifiers have double the number of differential pairs:

A first differential pair of transistors T11, T12, with a signal input S+ and a reference input R+, is connected with its drain terminals to load resistors R1, R2 and the output terminals A+, A− of the differential amplifier. The second terminal of the load resistors R1, R2 is connected to a terminal VDD, to which a supply voltage is fed.

A second differential pair of transistors T21, T22, with a signal input S− and a reference input R−, is connected in reverse to the same load resistors R1, R2.

The source terminals of the differential pairs are connected to current sources IQI, 1Q2. The inputs S+ of all differential amplifiers are connected to each other at a higher circuit level (see FIG. 42b), as are the inputs S−, and form the fully differential input S+, S− of the fully differential input stage.

A fully differential reference potential, which is derived from one or two reference voltage divider chains RK, is fed to the reference inputs R+, R−. The sum of two reference potentials which go to a differential amplifier at R+, R− is preferably equal to the sum of the potentials at S+, S−, to obtain the best possible common-mode rejection.

For the implementation of the invention, all that is relevant is that the resource to generate the calibration signal KSG must be able to supply a fully differential calibration signal K+, K−, where the sum of the potentials at K+, K− also corresponds to the sum of the potentials at the inputs S+, S−, and also the calibration signal must be able to represent the ideal values of a pair of reference potentials R+, R− with sufficient precision.

The function of the resource to set the offset voltage in the box OSS is to draw an adjustable current in each case via two terminals 11, 12, which are connected to the output terminals A+, A− of the differential amplifier, so that it can shift the voltage at the load resistors. The resource has data and control inputs, which are marked DSL, and are connected to the control unit SE at a higher circuit level (see FIG. 42). The resource preferably contains a digital storage register, by which the setting values of the currents at its terminals 11, 12 can be stored. Details of this resource can be taken from the description of FIGS. 24 to 40.

For a not fully differential version of the circuit of FIG. 43, it is sufficient to omit the transistors T21, T22 and the current source 1Q2. The result is then a calibratable differential amplifier, which is suitable for the version of the invention according to FIGS. 42a and 44a.

A preferred implementation of the invention is shown in FIGS. 44a and 44b. Here, a sample-and-hold stage SH is arranged between the switching resource US and the inputs S or S+, S− of the differential amplifiers of the input stage ES. This can also be implemented as a track-and-hold stage.

A first advantage of this preferred implementation is the use of the drivers of the sample-and-hold stage also to feed the calibration signal to the input stage of the ADC, so that these only have to be present once, resulting in a reduction of the area and the current consumption.

A second advantage is that now even small signal-dependent static errors of the sample-and-hold stage can also be calibrated out, without the method according to the invention having to be extended in any way.

The background is that such errors of the sample-and-hold stage falsify the sampled calibration signal K or K+, K− in the same way as an input signal E or E+, E− to be quantized. Since the calibration now sees this falsified signal as an ideal value and sets a corresponding correction offset in which the quantized value corresponds to the ideal value, in normal operation an input signal which corresponds to the ideal value results in the correct, ideal quantized value at the output of the ADC, in spite of the falsification by the sample-and-hold stage. This is a useful property of the implementation of the invention according to FIG. 44a or 44b, and can be obtained without any additional cost.

However, dynamically caused errors of the sample-and-hold stage cannot be corrected by this arrangement.

In short, the proposed calibration method of the present invention comprises a calibration signal K or K+, K− being generated in calibration mode for each differential amplifier in the input stage of the ADC, this signal corresponding to the ideal value of the potential or potentials at the reference inputs R or R+, R− of the differential amplifier apart from a small permitted residual error, this calibration signal K or K+, K− being given to the signal inputs S or S+, S− of the differential amplifiers instead of the regular input signal E or E−, E+, and offset calibration of the differential amplifier being carried out. This process is preferably carried out for all differential amplifiers in the input stage of the ADC in succession, but calibrating only a smaller, input signal range of the ADC which is actually used instead of all differential amplifiers is also conceivable. As was explained above, during the offset calibration process the offset voltage of the differential amplifier is adjusted so that an essentially equal potential is set at its outputs, i.e. the differential output voltage is minimized and ideally set to zero.

The difference between pure offset compensation and calibration of the reference voltage divider chain comprises only the preparation of this offset calibration step:

In the case of pure offset calibration, the inputs of the differential amplifier to be calibrated are brought to the same potential by, for instance, switching both of them together to an auxiliary potential or short-circuiting them. In the case of calibration of the reference voltage divider chain, the differential amplifier reference inputs R or R+, R− which lead to it remain connected to it, and the sufficiently precise calibration signal is fed to the signal input S or S+, S−. In this case, the offset calibration step does not lead to a minimization of the offset error of the differential amplifier, but to a deliberate offset error, the polarity of which is opposite to that of the error of the reference potential and the amount of which is equal or equal with sufficient precision, and which compensates for it. Thus a first, adjustable error is used to compensate for a second error which is within the reference voltage divider chain or in stages connected upstream of the ADC, for instance a sample-and-hold stage, and which cannot be influenced.

As the resource KSG to generate a calibration signal K or K+, K−, an ordinary digital/analog converter DAC with a significantly higher resolution than the ADC, for instance a 13-bit DAC for a 10-bit ADC, is suitable. With an approximately equal span of the signal, the DAC would thus be able to resolve the calibration signal in steps of approx. 0.125 LSB of the ADC, which would correspond to the precision of calibration of the reference voltage divider chain which could be achieved with it.

Numerous possibilities for implementing highly precise but slow DACs are known to the prior art, e.g. see [17]. Since the calibration signal for a calibration step can be generated while the ADC is being operated regularly, and a calibration step has to be inserted relatively rarely, because after a first calibration of the ADC after switching on it only has to compensate for slow drift effects, particularly thermal drift, the slow method of working of such highly precise DACs is not a problem for using them in this invention.

On a highly integrated chip, there are often high-resolution DACs for different tasks in any case, e.g. for audio channels, and these can be used for a calibration process of the ADC, so that it is unnecessary to provide an extra DAC.

An even simpler resource for generating the calibration signal is a clocked integrator with switched capacitors, using which, after resetting, a linearly increasing ramp of equally high steps can be generated by numerous integration steps. If the calibration method is suitably equipped, the absolute height of these integration steps is insignificant, provided that they are small enough for sufficient resolution of the calibration. So-called matching requirements for the components of the integrator are thus significantly reduced.

Many of the known sample-and-hold stages happen to be very similar to a clocked integrator. If they are slightly extended, the functions of the sample-and-hold circuit, the resource for generating the calibration signal, and the resource for switching between the input and calibration signal can be combined into one functional unit KSH called a calibrating sample-and-hold stage KSH.

Such a functional unit KSH is shown in FIGS. 44a, 44b as a dashed block, and includes the abovementioned functions. The internal working of the dashed block in FIGS. 44a, 44b should then be understood only functionally and symbolically, because the actual circuit implementation is different, because the functions are combined in the implementation.

Figure 45:
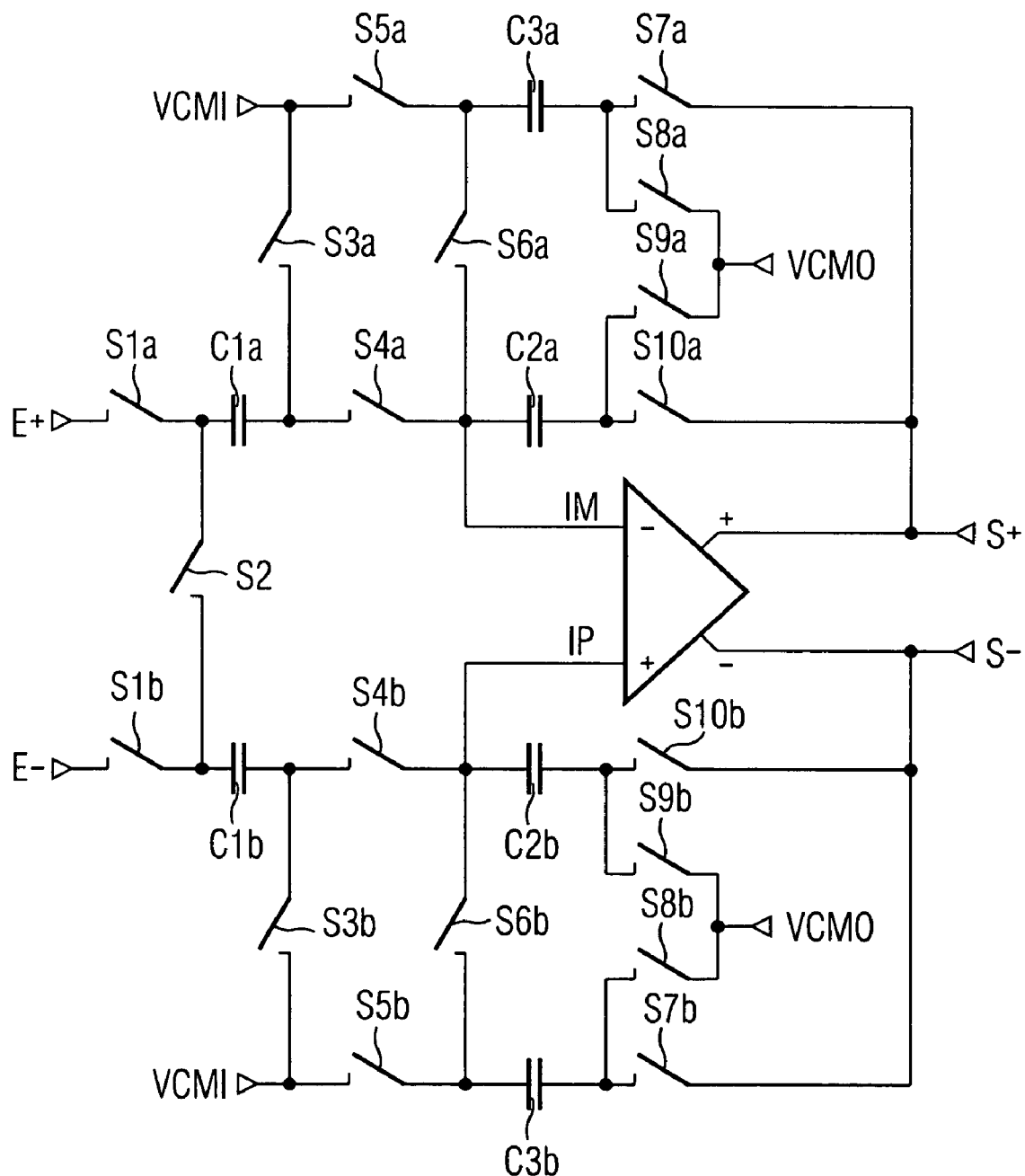
FIG. 45 shows the structure of a known sample-and-hold stage.

FIG. 45 shows the circuit implementation of a known sample-and-hold stage; a similarly constructed sample-and-hold stage is also used in [18]. The only difference between the circuit from FIG. 45 and the quoted reference is the additional capacitors C3a, C3b and the switches S5a, S5b, S6a, S6b, S7a, S7b, S8a, S8b which are assigned to them, to be able to provide the sampled input signal even during the next sampling phase. These additional parts would not be necessary for calibration signal generation in itself, but the circuit according to FIG. 45 is currently the best solution, and therefore the following description is based on this solution.

In the sampling phase, the switches S1a, S1b, S3a, S3b at the capacitors C1a, C1b are closed, and it is thus the input signals at terminals E+, E− which are stored on these capacitors C1a, C1b; the reference potential here is VCMI. C1a and C1b are not yet connected to the feedback loops of the operational amplifier OP, because this is so-called "open loop sampling". The operational amplifier is connected with negative feedback via capacitors C3a, C3b and closed switches S6a, S6b, S7a, S7b. Capacitors C2a, C2b are connected via closed switches S9a, S9b to a reference potential VCMO. The remaining switches S4a, S4b, S5a, S5b, S8a, S8b, S10a, S10b are open.

In the holding phase, firstly switches S3a, S3b, S6a, S6b are opened, then switches S1a, S1b, S7a, S7b, S9a, S9b. Switches S2, S4a, S4b, S5a, S5b, S8a, S8b, S10a, S10b are then closed. The charges on the capacitors are here redistributed in such a way that at the outputs S+, S− of the operational amplifier the input voltage difference which is sampled from E+, E− is set, but with a common-mode level which is shifted from VCMI to VCMO, which is an intentional function. If the potentials VCMI and VCMO are equal, the common-mode level is simply not shifted.

On switching back to the sampling phase, firstly S4a, S4b, S5a, S5b are opened, and then the remaining switches are brought into the positions described above for the sampling phase. In this way the charges are shifted again, and while the next sampling is being carried out, the signal from the previous sampling is retained at outputs S+, S−. In the case of the simpler circuit according to [18], this would not be so, since in this case the operational amplifier is not connected with negative feedback during the sampling phase. Apart from this less favorable property, the method of working of the two circuits is the same, but here it is considered to be important to represent the best solution in each case, so that the more advantageous circuit variant according to FIG. 45 was selected, to represent as an example an advantageous additional action which can be implemented in the case of this circuit, its predecessors according to [18], and other circuits which are suitable for it, so that the original sample-and-hold stage becomes the abovementioned calibrating sample-and-hold stage KSH, which in a particularly cost-saving way includes the resource KSG to generate the calibration voltage and the resource US to switch between normal and calibration operation, and combines them with the sample-and-hold function.

Figure 46:
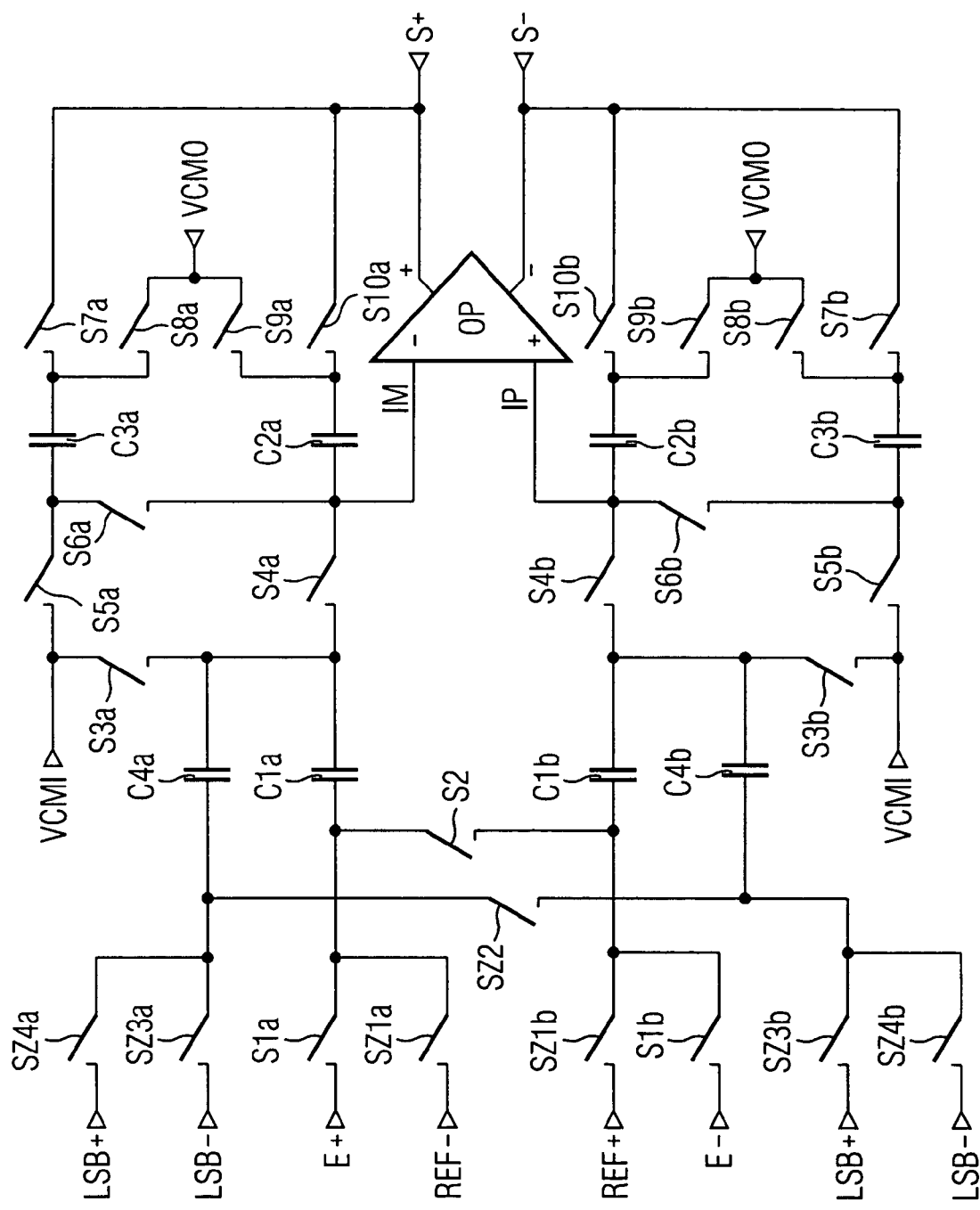
FIG. 46 shows the structure of an arrangement which can be used as a sample-and-hold stage and to generate calibration signals which are required to calibrate the reference voltage divider chain.

FIG. 46 represents for this purpose an extended circuit, in which additional switches SZ1a, SZ1b, SZ2, SZ3a, SZ3b, SZ4a, SZ4b and a pair of capacitors CZa, CZb are added to the circuit in FIG. 45. The capacitance of CZa, CZb is preferably less than that of capacitors C1a, C1b. Switch SZ1a is connected to a terminal REF− and capacitor C1a. Switch SZ1b is connected to a terminal REF+ and capacitor C1b. Switches SZ2, SZ3a, SZ3b, SZ4a, SZ4b are connected to capacitors C4a, C4b in the same way as switches S1a, S1b, SZ1a, SZ1b, S2 are connected to capacitors C1a and C1b. This circuit arrangement of SZ2, SZ3a, SZ3b, SZ4a, SZ4b, C4a, C4b has the same topology as the circuit arrangement of S1a, S1b, SZ1a, SZ1b, S2, C1a, C1b and is connected in parallel to it to the common node of switches S3a, S4a and S3b, S4b. Switches SZ3a, SZ3b, SZ4a, SZ4b are connected to terminals LSB+, LSB− in such a way that −SZ3a, SZ3b can sample one differential voltage of the potentials at these terminals and SZ4a, SZ4b can sample the same differential voltage but with the opposite sign.

With this arrangement, it is now possible, on the one hand, to carry out the sample-and-hold operation described above, for which purpose switches SZ1a, SZ1b, SZ2, SZ3a, SZ3b are kept permanently open, and SZ4a and SZ4b are kept permanently closed. SZ3a, SZ3b and SZ4a, SZ4b can also exchange roles, i.e. SZ3a, SZ3b remain closed and SZ4a and SZ4b remain open.

On the other hand, because of the additional switches and capacitors, the following three additional functions have become possible:
a) resetting the calibration signal
b) step-by-step upward integration, i.e. raising the calibration signal by one step
b) step-by-step downward integration, i.e. lowering the calibration signal by one step Below, it is assumed that, for instance, terminal REF− is connected to the lowest potential which is present at a reference input R or R+, R− of a differential amplifier, terminal REF+ is connected to the highest such potential, terminals LSB− are connected to a potential which is slightly lower than the arithmetic mean of REF− and REF+, and terminals LSB+ are connected to a potential which is slightly higher than the arithmetic mean of REF− and REF+. All the potentials which are necessary here can preferably be taken directly from taps of the reference voltage divider chain, with interconnected driver stages if necessary, or from other suitable voltage sources.

In case a), i.e. when the calibration signal is reset (in reset mode), the method of working of the circuit essentially corresponds to the sample-and-hold process described above, with the difference that when the calibration signal is reset, switches SZ1a, SZ1b are opened and closed instead of switches S1a, S1b, and switches S1a, S1b remain open. In this way, instead of the differential voltage at terminals E+, E−, the differential voltage at terminals REF−, REF+ is sampled and provided at outputs S+, S−.

On transition from reset mode into one of the two integration modes, firstly switches S4a, S4b are opened, before further switch changes take place. In the integration modes, switches S10a, S10b always remain closed from the reset phase, and thus the operational amplifier OP always remains connected with negative feedback via capacitors C2a, C2b. In the integration modes, switches S6a, S6b, S9a, S9b also always remain open, so that capacitors C3a, C3b do not take part in charge redistributions. In this way the position of switches S5a, S5b, S7a, S7b, S8a, S8b during the integration modes basically does not matter, provided that nodes S+ and S− are not short-circuited against CVMO by switching on switches S7a, S7b, S8a, S8b. It is recommended that this forbidden switch state should be avoided, and in particular it is desirable to keep S7a and S7b open, to avoid loading the outputs of the operational amplifier unnecessarily.

On transition from reset mode into one of the two integration modes, additionally after opening switches S4a, S4b, switch S2 is opened, and then switches SZ1a and SZ1b are closed. In this way the input side nodes of capacitors C1a, C1b are connected to potentials preferably derived from low-resistance sources at terminals REF−, REF+, about which it is assumed that they always remain the same at the sampling time of the integration. One advantage of this switch position is that undesired capacitive injection of signals at terminals E+, E− via unavoidable parasitic capacitances of switches S1a, S1b, which remain open during the integration modes, are strongly attenuated.

During the two integration modes, only switches SZ3a, SZ3b, SZ4a, SZ4b, S3a, S3b, S4a, S4b are moved.

In case b), i.e. the case of step-by-step upward integration (upward integration mode), in a first phase switches SZ4a, SZ4b, S3a, S3b are closed, and thus the potential at terminal LSB+ is transmitted to the first plate of capacitor C4a, and the potential at terminal LSB− is transmitted to the first plate of capacitor C4b. The second plates of capacitors C4a, C4b are connected here via switches S3a, S3b to the reference potential VCMI. Switches SZ3a, SZ3b remain open. In a second phase, firstly switches S3a, S3b are opened, and then switches S4a, S4b are closed. Switches SZ4a, SZ4b are then opened and switch SZ2 is closed. A charge transfer to the input nodes IM, IP of the operational amplifier takes place, and correspondingly the potential at the output node S+ increases by a small step, and the potential at the output node S− decreases by a small step, if the capacitor ratios between C4a, C2a and C4b, C2b are correspondingly small, and also the voltage difference at LSB+, LSB− has been expediently chosen, for instance exactly as high as one quantization step of the ADC, the stated capacitor ratio then being responsible for a further subdivision, which is desired for calibration mode, to be able to resolve the calibration signal sufficiently finely. In practice, for good results, the step height should preferably be one eighth of the quantization step of the ADC. A step height of half a quantization step should be seen as a theoretical minimum, below which the calibration would make little sense.

At the transition to the next integration step, switches S4a, S4b are opened first, then switch SZ2, and then the cycle begins from the beginning.

In case c), i.e. the case of step-by-step downward integration (downward integration mode), in a first phase switches SZ3a, SZ3b, S3a, S3b are closed, and thus the potential at terminal LSB− is transmitted to the first plate of capacitor C4a, and the potential at terminal LSB+ is transmitted to the first plate of capacitor C4b. The second plates of capacitors C4a, C4b are connected here via switches S3a, S3b to the reference potential VCMI. Switches SZ4a, SZ4b remain open. In a second phase, firstly switches S3a, S3b are opened, and then switches S4a, S4b are closed. Switches SZ3a, SZ3b are then opened and switch SZ2 is closed. A charge transfer to the input nodes IM, IP of the operational amplifier takes place, and correspondingly the potential at the output node S+ decreases by a small step, and the potential at the output node S− increases by a small step.

At the transition to the next integration step, switches S4a, S4b are opened first, then switch SZ2, and then the cycle begins from the beginning.

Through these additional functions, the implementation cost of which is very low, above all because capacitors C4a, C4b are much smaller than the capacitors of the original circuit according to FIG. 45, a functional unit can be created, which in a particularly cost-saving way includes the resource KSG to generate the calibration signal and the resource US to switch between normal and calibration operation, and combines them with the sample-and-hold function.

It should be emphasized that the described novel calibrating sample-and-hold stage is only one possible exemplary implementation, since the known topologies of sample-and-hold circuits are very varied and do not always correspond to the topology of FIG. 45. However, a particularist who can implement a sample-and-hold circuit should be capable, on the basis of the described exemplary embodiment, of extending his or her sample-and-hold circuit so that a calibrating sample-and-hold stage results therefrom.

The additional cost for the implementation of the reference voltage divider chain calibration is very low with this variant, and in practice it is insignificant, if it is assumed that the ADC already has the resources and method to calibrate the offset voltages of the differential amplifiers of the input stage. However, the disadvantage of this variant is that while the calibration signal is being set up, normal operation of the ADC is impossible, since the sample-and-hold function which it requires has been dedicated to something else. If this is unacceptable, the invention according to FIGS. 42a, 42b can be implemented using a separate DAC.

An inventive calibrating sample-and-hold stage KSH, which is claimed as a subclaim, and which in a particularly cost-saving way includes the resource KSG to generate the calibration voltage and the resource US, and combines them with the sample-and-hold function, is characterized by a (sample-and-hold) circuit, the usual function of which is to sample an input signal at its input terminals, and after sampling to provide an image of the input signal at the time of sampling at its output terminals, the image being derived from the input signal by multiplication by a factor and addition or subtraction of a constant amount, where the factor can equal one and the constant amount can equal zero, which is equipped with circuit resources, which as well as sampling the input signal, as a first, characterizing further function, make resetting to a defined output voltage possible, and which is equipped with circuit resources, which as well as sampling the input signal, as a second, characterizing further function, generate a step-by-step upward or downward ramp, the step height of which is essentially constant and so small in amount that more than two steps of the ramp are required for a code change of the ADC.

Figure 47:
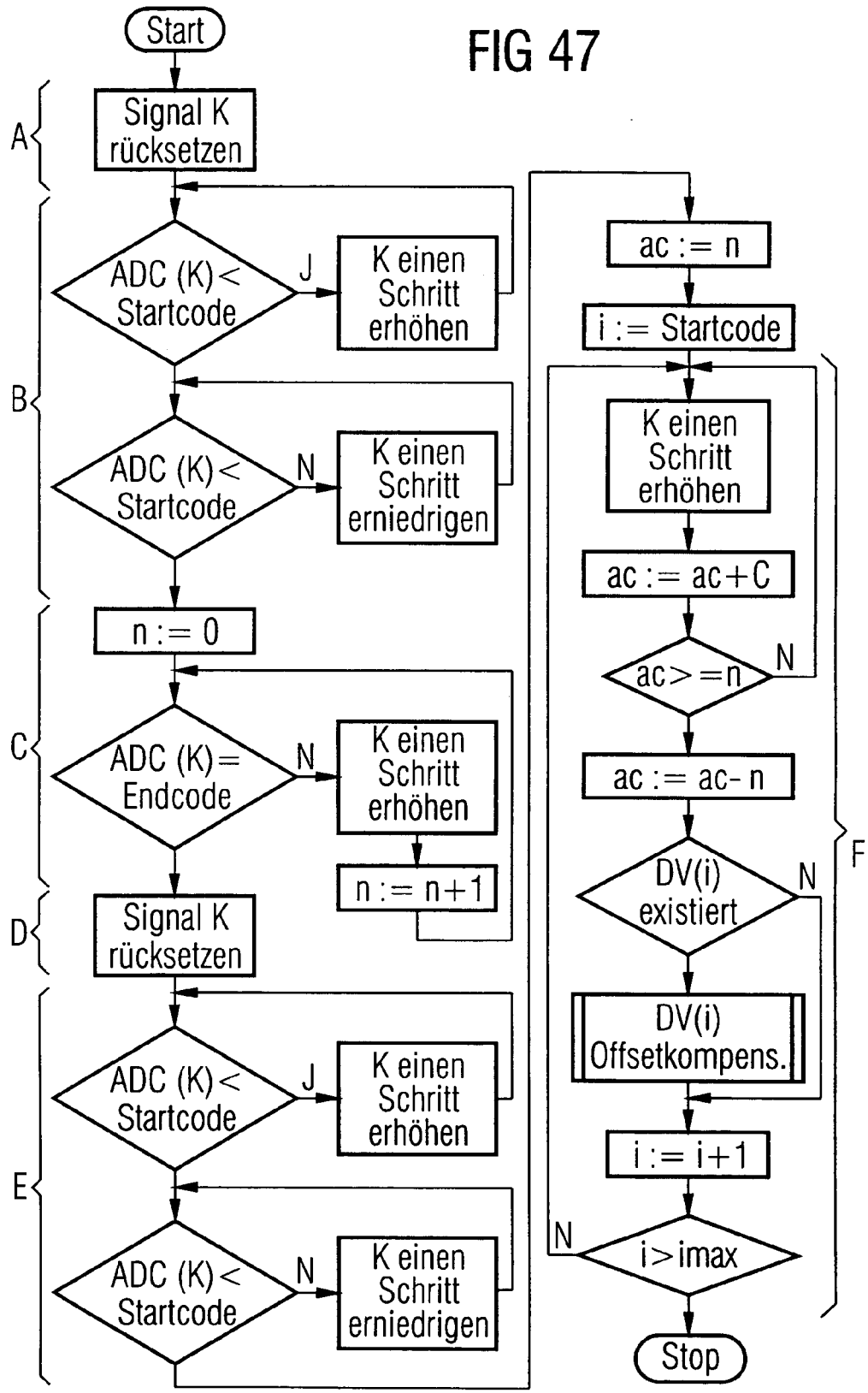
FIG. 47 shows the sequence of calibration of a reference voltage divider chain using the arrangement according to FIG. 46.

The control method for a calibrating sample-and-hold stage KSH according to FIG. 46 is shown in FIG. 47 as a flowchart. In principle this control method is suitable for all conceivable calibration signal sources which are based on a step-by-step integration process.

In particular, the facts that neither the zero point after resetting nor the step height of the individual upward and downward integration steps is known are assumed here to be defects which are permitted in practice. The control method is in such a form that these defects have no damaging effect on the precision of the calibration.

If a calibrating sample-and-hold stage with sufficiently good properties is involved, so that these assumed defects do not apply, the method which is disclosed below can be simplified, e.g. if the process of resetting the calibration signal to the starting value is sufficiently exact, phases B and E can be omitted.

The control method requires as additional resources an accumulator register ac, a counter register n, an index register i and an arithmetic unit which can establish whether the content of the accumulator register ac is greater than or equal to the content of the counter register n, and which can subtract the content of the counter register n from the content of the accumulator register. The comparison and subtraction functions can expediently be combined, and the only difference is whether the result of the subtraction is put back into the accumulator register or not. The arithmetic unit must also make it possible to add a constant C, which can be hard-wired, to the accumulator register, and to put the sum back into it. It must be possible to reset and increase by one, i.e. increment, each of counter register n and index register i.

Figure 48:
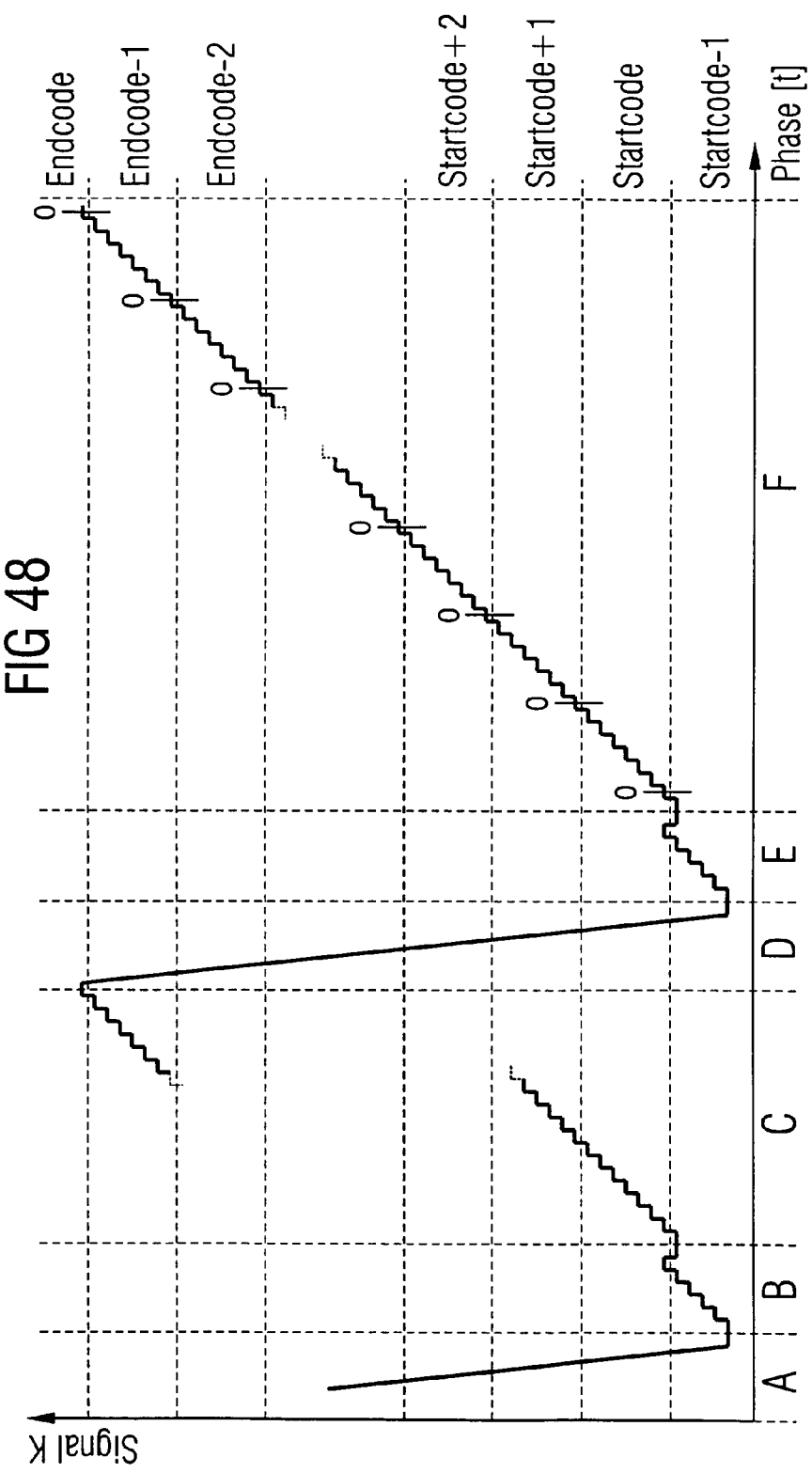
FIG. 48 shows a representation of signal characteristics which are set up during reference voltage divider chain calibration.

The control method works as explained below, with reference to a flowchart which is shown in FIG. 47 and a signal diagram which is shown in FIG. 48.

Firstly, the integrator and thus the calibration signal K are reset (phase A). If the reset process does not coincide exactly with the code change of the ADC between start code and start code−1, which in practice is usually the case, in an optional phase B the calibration signal is integrated step-by-step downward or upward until the ADC changes from start code to start code−1, which defines the starting point of the calibration.

The result of the conversion of the calibration signal K by the ADC is symbolized in the flowchart by ADC(K).

As the start code, code 0, i.e. the smallest quantization result of the ADC, is suitable only if this has an underflow signal, which can represent start code−1. Otherwise, code 1 is taken as the start code. However, in principle the control method is suitable for any start code, eparticularly as some applications allow only part of the input voltage range of the ADC to be calibrated, while the edges of this range are allowed to be imprecise, so-called guard bands, in which there is normally no signal, and a signal which touches them would result in automatic regulation of the amplification, so that the signal is kept out of the guard bands. Because of such applications, the control method has been designed for arbitrary start and end codes.

After the starting point of the calibration is reached through phases A and B, the counter register n is reset, and then, in a phase C, the calibration signal is raised step by step, i.e. integrated upward, and the ADC is operated until it outputs the end code. The number of integration steps required for this is counted by incrementing the counter register n. The code change to the end code defines the end of the calibration. In the case of an ADC which has an overflow signal, this can be the end code. Otherwise, the highest output code of the ADC is recommended. For an M-bit ADC, this is the code $2^M-1$. However, in principle the control method is suitable for any end code, provided that it is above the start code.

For a mathematically exact method, before phase D the content of counter register n would then have to be decreased by one, but with a sufficiently large n, which is usually the case, because n is preferably significantly greater than the number of quantization steps of the ADC, this decrementing can be omitted, and it is therefore also absent from the flowchart.

In a phase D, the calibration signal K and thus the integrator are then reset again, and in an optional phase E, which corresponds functionally to phase B, the start code is approached again. The index register is set to the start code. The accumulator register ac is initialized to the value of the counter register n.

In a phase F, for each index i, which represents the ideally quantized code of the ADC, a calibration signal is generated by a sufficient number of upward integration steps. The calibration signal here corresponds—as far as the integration step width allows—to the ideal switching point of the relevant preamplifier, i.e. its equilibrium state at its outputs. The offset compensation method described above (FIGS. 1 to 40) sets this equilibrium state and thus compensates in this case not only for the offset error of the preamplifier, but also for the error of the reference voltage divider chain tap.

Reaching a value of the calibration signal which comes as close as possible to an ideal quantization step is established by adding a constant C to the accumulator register ac. Linked to this, an upward integration step, i.e. raising the calibration signal by one step, takes place. Only after these two steps, the time sequence of which does not matter, the content of the accumulator register ac is tested by comparison to be greater than or equal to the content of the counter register n. Two cases are then distinguished:

Case 1, if the result of the comparison is that ac is less than n, exit "N" of the branch box, the control method immediately continues with the next increase of the calibration signal by one step and the addition of the constant C.

Case 2, if the result of the comparison is that ac is greater than or equal to n, the lower exit of the branch box, the content of the counter register n is deducted from the content of the accumulator register ac, and the result is put back into the accumulator register, and, if an offset-compensatable differential amplifier is assigned to the quantization threshold which has been reached corresponding to the content of the index register i, the offset compensation method which is described with reference to FIGS. 1 to 40, and in which its outputs are led as close as possible to the equilibrium state, is carried out for it. The real quantization threshold, which is defined by this differential amplifier, is thus calibrated as close as possible to the ideal quantization threshold. With many ADCs, particularly if they use interpolation methods, a differential amplifier is not assigned to every index i in the input stage, and offset compensation is not carried out for the non-existent differential amplifiers. To establish whether a differential amplifier DV(i) exists for an output code i, the flowchart includes a branch box with the condition "DV(i) exists". If this is untrue (exit "N" of the branch), the box with the offset compensation process is bypassed. In the diagram according to FIG. 48, the places at which an offset compensation process takes place are marked with a vertical line and an O placed above it.

The index register i is then increased by one, to prepare the next quantization threshold. The control method continues with the next cycle of the loop in phase F, and so on until all quantization thresholds which are to be calibrated are calibrated. The exit condition is reached when the index i is greater than an index imax, which stands for the last differential amplifier to be calibrated.

The constant C is given by the number of quantization steps which are run through in phase C while incrementing the counter register n. If the range between underflow and overflow is involved, the constant C must be set equal to $2^M$, so that with a 10-bit ADC with M=10, K [sic]=1024. On the other hand, if phase C begins with the transition between code 0 and code 1 and ends with the transition between code $2^M-2$ and code $2^M-1$, code 0 and code $2^M-1$ are missing from the span which the counter register n covers, and the constant C must be set equal to $2^M-2$. For other spans, which are defined by a different choice of the code range to be calibrated, C is assigned accordingly.

This control of the calibrating SH stage is preferably implemented in the form of the abovementioned registers, the arithmetic unit and a switching device, which takes control of the registers, arithmetic unit and switches in the functional block which generates the calibration signal, e.g. a functional block according to FIG. 46. The digital components, registers, arithmetic unit and controller can also be implemented within the comprehensive control unit of the differential amplifier calibration device, and are then part of a greater whole.

Figure 49:
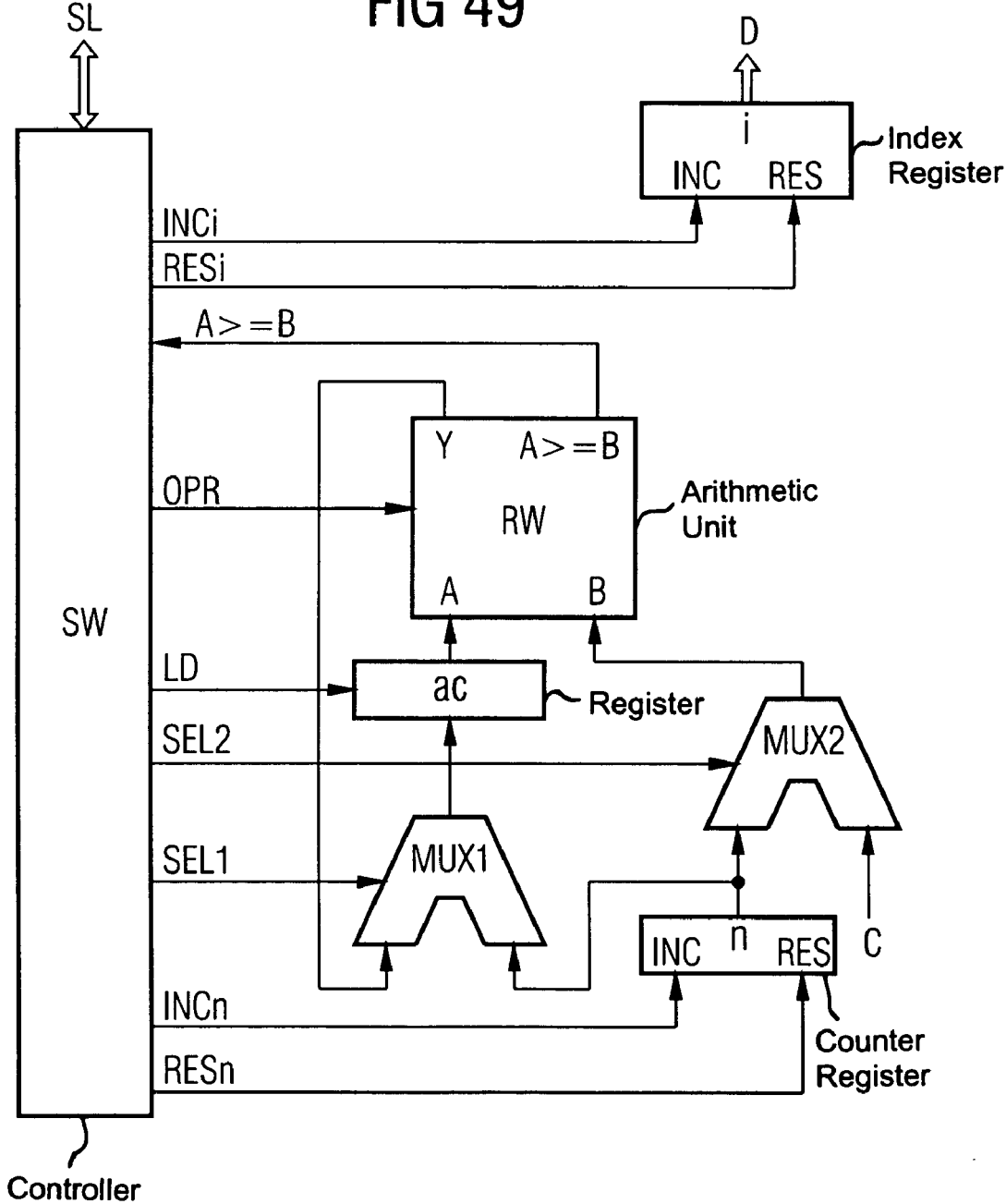
FIG. 49 shows a block circuit diagram of an arrangement by which the method which is shown in FIGS. 47 and 48 can be implemented.

FIG. 49 represents the block circuit diagram of an implementation of the control method as an example. As well as the registers ac, n and i and the hard-wired constant C, which must not be confused with the calibration signal, it contains an arithmetic unit RW, which can carry out a subtraction or addition of its inputs A or B, the operation being selected by a signal OPR. In the case of a subtraction, the arithmetic unit also provides an output signal A>=B, which is fed to a controller SW, in which the control method according to FIG. 47 is implemented, and which is connected via control lines SL to the switches in the calibrating sample-and-hold stage and a higher-level controller, which implements the whole calibration method. Data lines D lead from the index register i also to the higher-level controller, so that it can decide, when a certain quantization step is reached according to index i, whether a differential amplifier to be calibrated exists in the input stage of the ADC or not. A loading signal LD controls the acceptance of data into the accumulator register ac, this being selected, via a multiplexer MUX1, using the signal SEL1, between the output Y of the arithmetic unit or the content of the counter register n. Another multiplexer MUX2, using the signal SEL2, makes it possible to select the second operand B between the content of the counter register n and the constant C. The counter register n and the index register i are each equipped with an increment input INC and a reset input RES, which are operated by the controller SW via the signals INCN, RESN, INCI, RESI, the index register being reset to the starting value explained above. This example makes it clear that the control cost for generating the calibration signal in an integrator, in spite of assumed defects such as unsafe resetting to a starting value or unknown step height of integration, need not be very high, and that complicated operations such as multiplication and division can be avoided by the specified control method.

The result of the calibration process described above is an ADC which, in spite of errors in the reference voltage divider chain, has an optimally small differential and integral non-linearity DNL, INL. Admittedly the total span from the smallest to the largest code with this method is still subject to the natural error of the reference voltage divider chain, since the control method of the calibration signal generation only ensures an equal subdivision of the total span, so that a small amplification error of the ADC and also a residual offset resulting from the definition of the zero point before phase C remain, but these errors can be corrected using global compensation methods which are known to the prior art, e.g. by digitizing a reference signal and a reference level and using these values in the digital signal processor after the ADC, to calculate out the abovementioned residual errors. However, in general such additional actions are not required, because fast ADCs of the mentioned types are mainly used in communication systems, in which the remaining small amplification errors and residual offset are insignificant, whereas what matters a great deal is optimum spectral performance of the ADC, which the device and method according to the invention can achieve by optimizing DNL and INL.

The control method which has just been described for the calibrating sample-and-hold stage can also be used in the variant of the invention according to FIGS. 44a, 44b, to control a conventional integrator, which for instance results from the circuit according to FIG. 46, if the switches and capacitors which are required for sample-and-hold mode are removed (S5a, S5b, S6a, S6b, S7a, S7b, S8a, S8b, C3a, C3b). Such a circuit, which is used in FIGS. 44a, 44b as block KSG, can be implemented at lower cost than a high-resolution DAC according to [17], but on the other hand it is also significantly slower. However, because with a circuit arrangement according to FIGS. 44a, 44b the respective next value of the calibration signal can be generated while the ADC is working regularly, a slow method of working of the calibration signal source is not usually a disadvantage. Above (FIGS. 24 to 40) was disclosed a particularly advantageous storage register for calibration setting values, with which the whole ADC can be put cyclically into calibration mode under the influence of a single global signal. With an arrangement according to FIGS. 44a, 44b, it is thus possible to feed the calibration signal to the sample-and-hold amplifier SH only when it has reached a new quantization threshold, and when the next cycle of the ADC is a calibration cycle. The regular ADC input signal, which is not quantized in this step, can, for instance, be replaced by a filter arrangement, or as described above (FIGS. 1 to 40), the ADC is operated at double the clock rate, and each second cycle is a calibration cycle, which can also expire unused if no valid calibration signal is yet present.

By the described device and described method, errors of the reference voltage divider chain of ADCS, and in particularly advantageous versions also errors of sample-and-hold amplifiers of the ADC, can be calibrated away by setting the offset errors of differential amplifiers of the input stage of the ADC in such a way that they compensate for the errors of the reference voltage divider chain and/or the sample-and-hold amplifier.

The reference voltage of which the errors are compensated for does not have to be derived from a reference voltage divider chain. By the described device and described method, it is possible to compensate for errors in reference voltages which are generated in any way.

Obviously, the described device and described method can not only be used in ADCs, but in any other devices in which it is necessary to compensate for errors in a reference voltage which is fed to a differential amplifier.

Additionally, compensation for reference voltage errors can be done using devices and methods for differential amplifier calibration which differ from the devices and methods described here, i.e. using any devices and methods which are suitable for differential amplifier calibration.

Reference voltage errors for which it is possible to compensate are not restricted to the reference voltage potential. By the described method, other errors, for instance phase errors, can also be eliminated.

A detailed description of compensation for errors in a sample-and-hold stage connected upstream of an amplifier stage now follows.

In the case of fast analog/digital converters with sampling frequencies of a few 100 MHz and above, the use of so-called "open-loop sample-and-hold stages" or "open-loop track-and-hold stages" is usual. Examples of these are found in [19] and [20]. Such circuits make the necessary high sampling rate possible, but suffer from various problems which falsify the signal, particularly signal-dependent charge injection at the sampling switches. [20] discloses a possible solution to this, but this is insufficient to obtain a sufficiently high linearity, above all in modern 0.12 μm CMOS processes, because the source follower alone within the stage has a considerable non-linearity, because of short channel effects and a poor output conductance of its current source. In such processes, because of the low supply voltage of around 1.2 V, it is very difficult to implement even closed-loop sample-and-hold stages with sufficient spectral purity, because the low supply voltage to a large extent prevents the use of cascodes. It looks as if from [sic] fast analog/digital converters which are manufactured in such very modern processes would have to be satisfied with poor properties of the sample-and-hold or track-and-hold stages.

Starting from the observation that with sufficient bandwidth of the sample-and-hold or track-and-hold circuit, often a considerable part of its error is not of dynamic type, i.e. not frequency-dependent, but of static type, i.e. describable by a non-linear direct voltage curve, a device and a method by which this static non-linearity can be subjected to error correction are disclosed. A device and a method which have been described in detail previously, to be precise with reference to FIGS. 1 to 40, are used for offset calibration.

It is interesting to note that the published prior art does not seem to have recognized the basic idea of the described device and described method at all, i.e. that an offset calibration method within the input stage of ADCs can be used to program such a non-linear curve into the quantization threshold that both a non-linear curve of stages connected upstream of the quantizer and the offset voltages of the quantizer are compensated for. The stages connected upstream only have to be included in the offset compensation method for this purpose. However, precisely this is not done in the cases of [19] and [20], although it would have been possible. Instead, Nagaraj et al. separate the offset-compensatable input stages of their quantizer from the sample-and-hold during the autozero phase, and can therefore not compensate for its static non-linearity curve.

Figure 50:
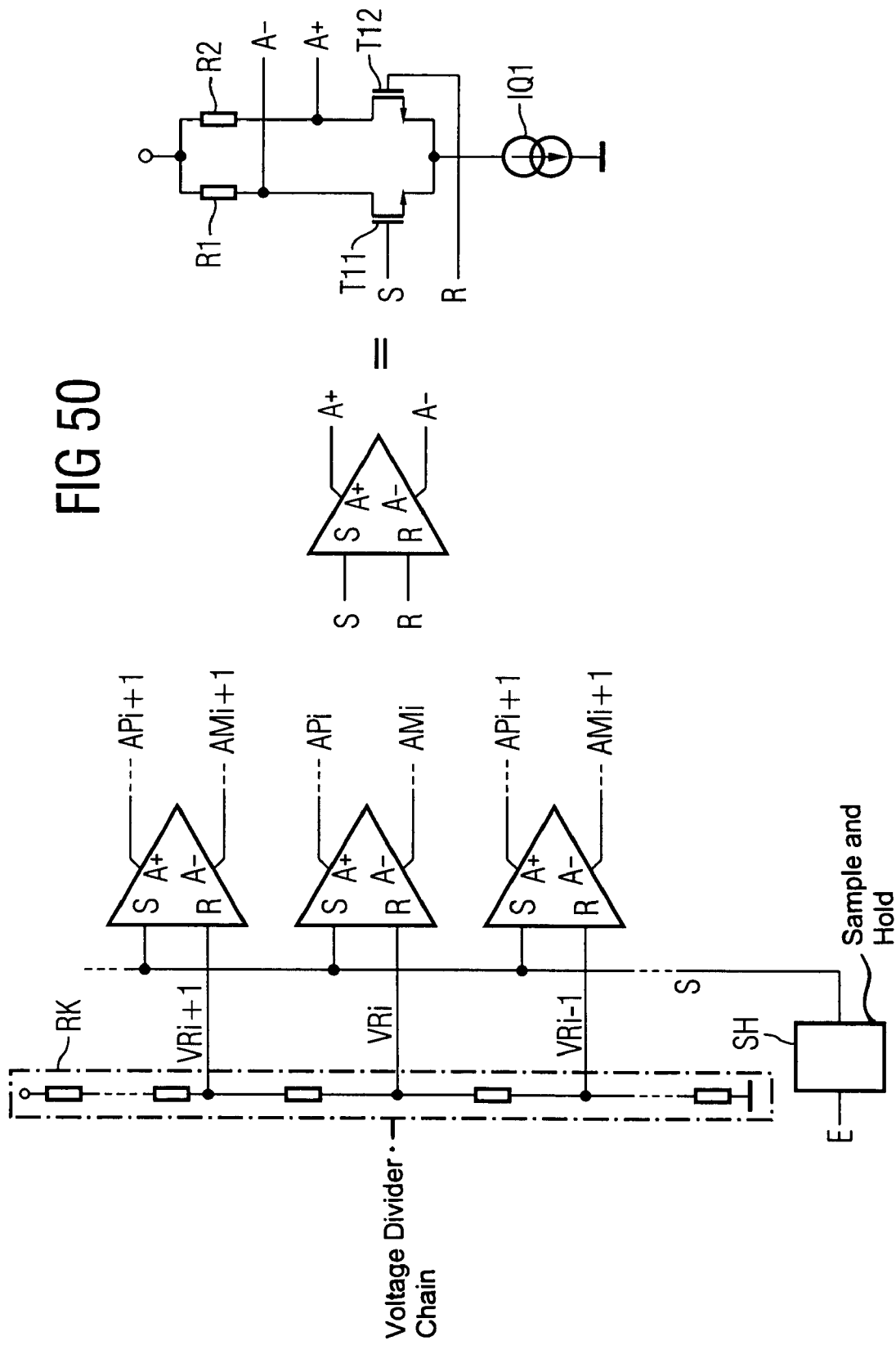
FIG. 50 shows a known input stage for fast ADCs, containing multiple differential amplifiers and a sample-and-hold stage connected upstream of the latter.

In FIG. 50, a section from a known input stage for fast ADCs, for instance for flash or folding converters, is shown. From a reference voltage divider chain RK, reference potentials VRi−1, VRi, VRi+1, each of which leads to a first input R of an assigned differential amplifier, are derived. At a second input in each case, an ADC input signal E, which is sampled by a sample-and-hold stage SH, is fed to the differential amplifiers. The task of the differential amplifiers is to compare the sampled input signal to the appropriate reference potential. The outputs of the differential amplifiers APi+l, AMi+1, APi, AMi, APi−1, AMi−1 lead either to comparators (in the case of a flash ADC) or to folding stages (in the case of a folding ADC). In the ideal case, the potentials at the outputs APj, AMj of the differential amplifier are equal when the sampled input voltage agrees with the appropriate reference potential. This state is called "equilibrium" of the differential amplifier, and its differential output voltage, which results from the potential difference APj−AMj, is then zero.

In FIG. 50, the internal circuit of a differential amplifier is in [sic] FIG. 1 is likewise shown as an example. A differential pair of transistors T11, T12, with a signal input S and a reference input R, is connected with its drain terminals to load resistors R1, R2 and the output terminals A+, A− of the differential amplifier. The second terminal of the load resistors R1, R2 is connected to a terminal VDD, to which a supply voltage is fed. If the load resistors are not exactly equal, or if the transistors of the differential pair have an offset, the result is an offset error of the differential amplifier, i.e. its equilibrium state is shifted by a small amount compared to the ideal. The reference potential or input voltage E should now be increased or decreased by this amount, to set up the equilibrium state.

Above (FIGS. 24 to 40), devices and methods with which the offset errors of the differential amplifiers can be minimized by a self-calibration method have already been described. If now the sample-and-hold stage is included in the offset compensation process, static non-linearity errors of this stage can also be calibrated out. This is based on the consideration that a static non-linearity error can be mapped onto a systematic distribution of the offset voltages of the differential amplifiers of the input stage of the ADC. If these are now set during offset compensation so that this systematic error is corrected, for which only suitable setting resources with a sufficiently large, and in this case sufficiently finely graduated, setting range are required, the offset compensation method corrects not only the actual offset of the differential amplifiers but also the static non-linearity error of the sample-and-hold stage.

The basic idea of the invention has already been shown in FIGS. 16 and 18, and described in detail in the text. Error correction of a sample-and-hold stage by including it in the offset calibration method has also already been described, see FIG. 23 and the description which refers to it. However, in this case the starting point was an arrangement of the sampling switches—and thus of the sample-and-hold stage—after the differential amplifiers of the input stage, as in [16]. However, this represents only a particular case, because the same device and the same method for offset calibration are suitable for error correction of sample-and-hold stages irrespective of their position in the circuit of the ADC, provided that the reference potentials of the sample-and-hold stage, which are tapped from a reference voltage divider chain via a multiplexer, are fed in.

A first exemplary embodiment of a device for compensating for errors in the sample-and-hold stage is shown in FIG. 51a. Compared to FIG. 50, a multiplexer MUX has been added, with which a control unit SE can select a reference potential via control and data lines DSL', which affect control inputs SEL of the multiplexer, and in calibration mode feed it as a signal K via a switching resource US of the sample-and-hold stage SH. In normal operation of the ADC, i.e. not in calibration mode, the regular input signal E of the ADC is fed to the sample-and-hold stage SH. The switching resource can also be part of the sample-and-hold stage. The output signal S of the sample-and-hold stage leads to the signal inputs of the differential amplifiers in the input stage of the ADC (block ES). The reference potentials which are derived from the reference voltage divider chain RS are fed to the appropriate reference input of the differential amplifiers as usual. The differential amplifiers have resources to change the offset voltage, it being possible to set these resources from the control unit SE via data and control lines.

The method of correcting errors in sample-and-hold stages is based on this. In an offset calibration mode, the control unit selects the individual differential amplifiers of the input stage in succession, selects the reference voltage potential which is assigned to the differential amplifier via the multiplexer MUX as the calibration signal, feeds this via the switching resource to the sample-and-hold stage, and after sampling carries out the offset calibration process for the selected differential amplifier. The method continues until all differential amplifiers have been processed. The result is a quantizer with which the offset voltages in the input stage are set so that they are opposite to the static errors of the sample-and-hold stage but as equal as possible to them in amount. The precision of the method is limited only by the fineness of the offset setting. The result is an ADC which in spite of static errors in the sample-and-hold stage, and in spite of statistically or systematically caused unavoidable initial offset errors in the individual differential stages, has almost ideal quantization steps. The success of the method is essentially determined by the resolution of the offset calibration process, by noise and by the static nature of the error of the sample-and-hold stage. It should be pointed out here that for offset calibration not one of the devices described above or methods described above has to be used. Any other offset compensation methods in which the inputs of the differential amplifiers are switched to reference potentials during offset compensation can be used, e.g. offset compensation methods which work using an autozero loop according to [19].

FIG. 51b shows the exemplary embodiment which is shown in FIG. 51a for the case that differential amplifiers with differential inputs are used, which is advantageous for many applications because of the common-mode rejection.

Instead of only one reference potential VRj, here a pair of reference potentials VRPj, VRMj is fed to every differential amplifier. These can be derived from two opposite reference voltage divider chains, which can often reduce the wiring cost in practice, or they can be taken from one and the same reference voltage divider chain. It is important for good common-mode rejection that the arithmetic mean of a pair of reference potentials VRPj, VRMj corresponds to the arithmetic mean of the differential input signal S+, S−. The same rule applies to the differential input signal E+, E− of the ADC, and the calibration potentials K+, K− which are derived from the two multiplexers. The method of working of this circuit and of the calibration method corresponds to that of FIG. 51a.

FIG. 52 shows as an example the circuit of a differential amplifier which is suitable for the input stage according to FIG. 51b, with adjustable offset voltage.

A first differential pair of transistors T11, T12, with a signal input S+ and a reference input R+, is connected with its drain terminals to load resistors R1, R2 and the output terminals A+, A− of the differential amplifier. The second terminal of the load resistors R1, R2 is connected to a terminal VDD, to which a supply voltage is fed.

A second differential pair of transistors T21, T22, with a signal input S− and a reference input R−, is connected in reverse to the same load resistors R1, R2.

The source terminals of the differential pairs are connected to current sources IQ1, IQ2. The inputs S+ of all differential amplifiers are connected to each other at a higher circuit level (see FIG. 51b), FIG. 2b [sic], as are the inputs S−, and form the fully differential input S+, S− of the fully differential input stage there.

A fully differential reference potential, which is derived from one or two reference voltage divider chains RK, is in each case fed to the reference inputs R+, R−. The sum of two reference potentials which lead to a differential amplifier at R+, R− is preferably equal to the sum of the potentials at S+, S−, to obtain the best possible common-mode rejection. The resource to set the offset voltage is in a block OSS. At each of its two outputs I1, I2, which are connected to the outputs of the differential amplifier, a current which can be adjusted via the data and control lines DSL is drawn from the load resistors R1, R2. Depending on whether more current is drawn at I1 or I2, the equilibrium of the differential amplifier can be shifted in either direction. The current intensity determines in the process the extent of the shift. Possible practical implementations of resources to set the offset voltage have already been described above, as have the further elements and resources of a device to implement a suitable offset compensation method in an ADC at low cost.

In FIG. 52, if transistors T21, T22 and current source IQ2 are deleted, and if input S+ is marked S and input R+ is marked R, the result is a variant, which is suitable for implementation according to FIG. 51a, of the differential amplifier with adjustable offset voltage.

FIG. 53a shows an exemplary embodiment in which the sample-and-hold stage is not in front of the differential amplifiers of the input stage of the ADC, but behind them as in [16]. In this case, the output of the switching resource US is connected directly to the input signal S of the input stage ES. However, nothing changes in the method of correcting errors as described above. It should be noted though that the bandwidth of the differential amplifiers in this case—depending on the required resolution of the ADC—must be considerably greater than in the case of an implementation according to FIG. 51a, since otherwise dynamic (frequency-dependent) errors dominate, and the described device and described method cannot compensate for them. The exemplary embodiment which is shown in FIG. 53 corresponds to the implementation of an ADC according to FIGS. 16 and 23, and is merely somewhat more clearly drawn and labeled.

Figure 53B:
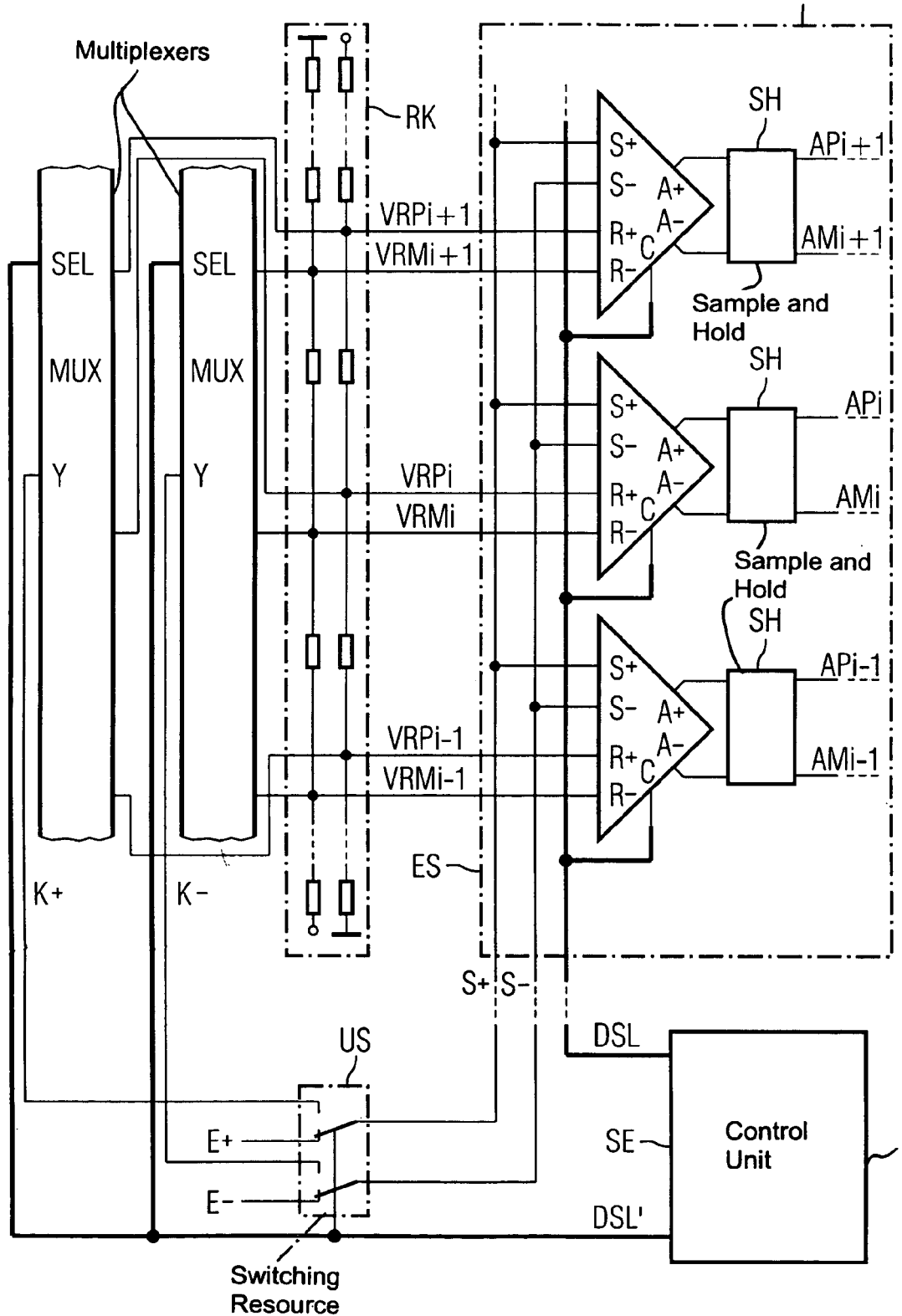
FIG. 53b shows an arrangement with a device which is intended for other differential amplifiers, for compensation of errors which are contained in a sample-and-hold stage.

FIG. 53b shows the second implementation of the invention for the case of a differential input. This implementation corresponds precisely to the implementation of an ADC according to FIGS. 18 and 23.

FIG. 54a shows an arrangement with two reference voltage divider chains, namely:
a relatively high-resistance reference voltage divider chain (RK2) of non-salicided polysilicon, with which in practice precisions of around 12 bits can be achieved at little area cost, and
a low-resistance reference voltage divider chain (RK1) of salicided polysilicon or metal, which is admittedly less precise, but makes the required small time constants of the input stage possible.

If, during calibration, the reference potentials are taken from the high-resistance, precise reference voltage divider chain, the errors of the low-resistance, imprecise reference voltage divider chain can also be calibrated out, like the errors of the sample-and-hold stage.

In FIG. 54a, this variant is shown for differential amplifiers with a single input. RK1 is the low-resistance, less precise reference voltage divider chain which supplies the reference potentials VRi+1, VRi, VRi−1 for the input stage of the ADC. RK2 is the high-resistance, more precise reference voltage divider chain which supplies the reference potentials which are used during calibration to the multiplexer MUX. The potential at node A is here essentially equal to the potential at node A', but the potential at node A is more precise and is used as the reference potential during the calibration process. Similarly, the potential at node B is essentially equal to the potential at B', C and C', etc.

Figure 54B:
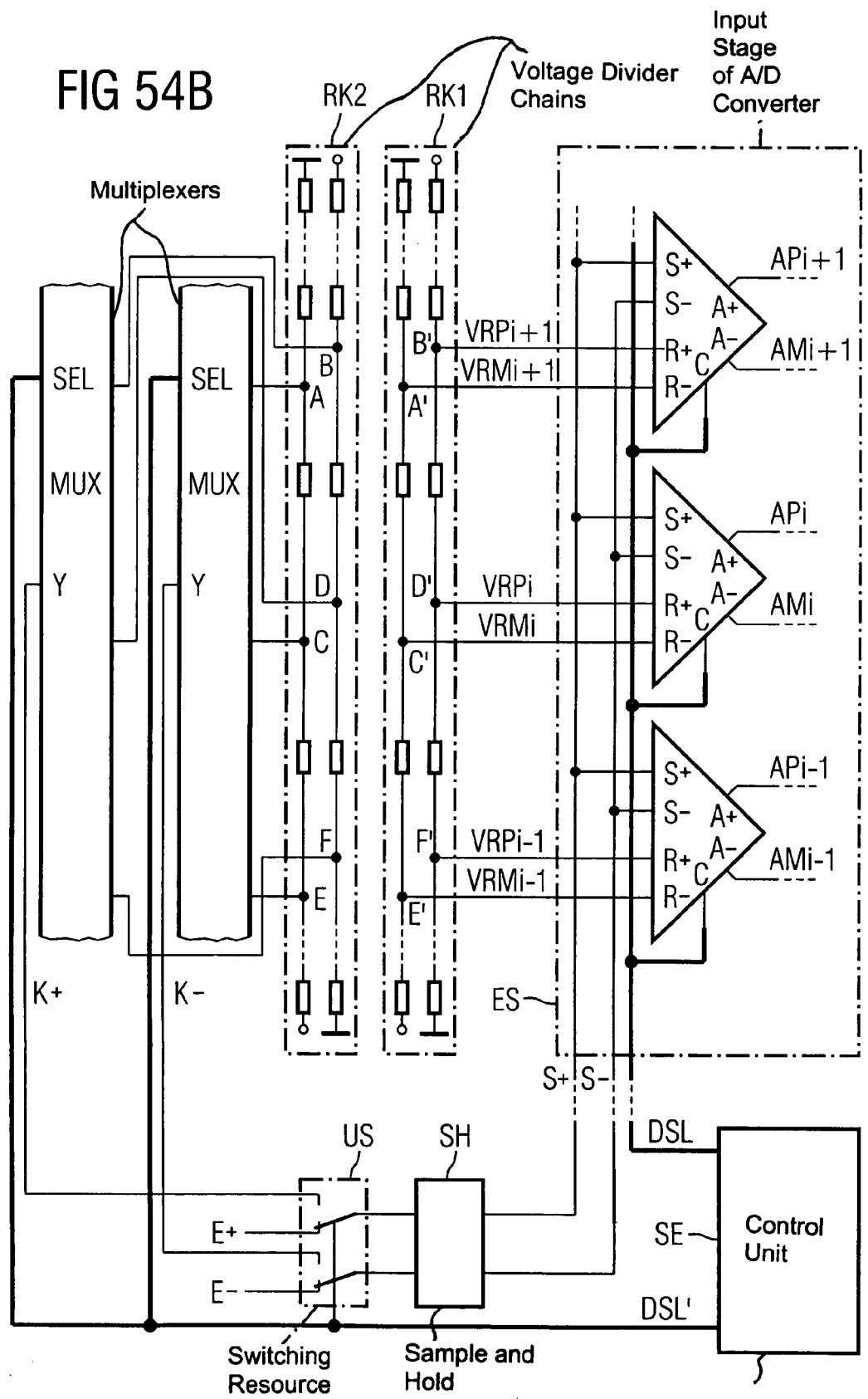
FIG. 54b shows an arrangement with a device which is intended for other differential amplifiers, for compensation of errors which are contained in a sample-and-hold stage.

In FIG. 54b, this variant is shown for differential amplifiers with differential input.

Figure 55:
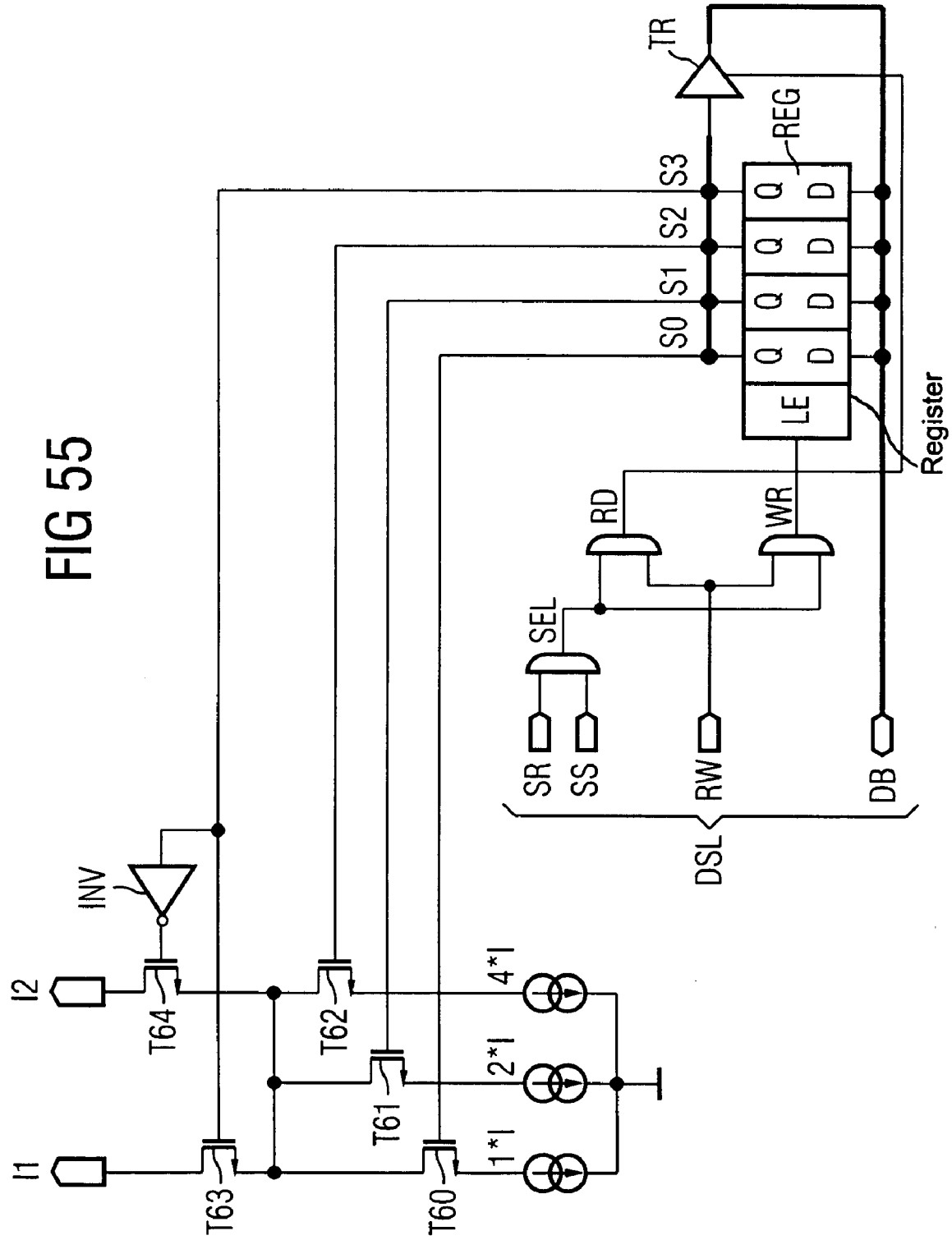
FIG. 55 shows a possible implementation of the resource for setting the offset voltage of a differential amplifier.

For completeness, FIG. 55 shows another possible circuit implementation for the resource to set the offset voltage in block OSS of FIG. 52. This is the preferred variant of digital storage of the setting values.

These are stored here in a register REG which comprises 4 bits, and which can be read and written via a data bus DB. Two selection signals SR and SS, for rows and columns in a matrix, generate the signal SEL for the appropriate differential amplifiers, which is preferably arranged in a matrix. A read/write control signal RW (read if RW=1 and write if RW=0) is linked to the signal SEL in such a way that a read signal WR [sic] and a write signal RD [sic] result. The read signal RD switches the outputs of the register SO, SI, S2, S3 via a bus driver TR onto the data bus DB. The write signal controls the input LE of the register, "Latch Enable", which is preferably in the form of a D latch. The control signals SR, SS, RW and the data bus DB are combined at the higher circuit levels (see FIGS. 51a, 51b, 52, 53a, 53b, 54a, 54b) into the control and data lines DSL, via which the control unit SE can select a differential amplifier and read and write the setting value in the register.

The analog circuit part of the resource here comprises weighted current sources 1*I, 2*I, 4*I, which can be combined via n-channel MOS transistors T60, T61, T62, which work as switches, and the gates of which are connected to outputs SO, S1, S2. In this way it is possible to set 8 different current steps. An inverter INV and two other transistors T63, T64, which work as switches, make it possible, under the control of the register output S4, to derive the current from either terminal I1 or terminal I2. This causes the equilibrium state of the differential amplifier to shift.

Using the devices and methods described above, errors of the sample-and-hold stage of ADCs, and in a subvariant also errors of low-resistance reference voltage divider chains of the ADC, can be calibrated away by setting the offset errors of differential amplifiers of the input stage of the ADC in such a way that they compensate for errors of the sample-and-hold amplifiers and/or of the low-resistance reference voltage divider chain. Suitable for this purpose, above all, are the devices and methods described above (FIGS. 1 to 40), by which the offset errors of the differential amplifiers can be made adjustable and calibrated to a setpoint value at their outputs on the basis of an equilibrium condition. However, many other offset compensation methods can be used, for instance autozero loops.

Through the described devices and described methods, the calibration of amplifier stages and the compensation for errors in components connected upstream of amplifier stages can be carried out quickly and precisely in an amazingly simple way.

REFERENCES

[1] R. E. J. van de Grift, I. W. J. M. Rutten, M. van der Veen, "An 8-bit Video ADC Incorporating Folding and Interpolation Techniques", IEEE Journal of Solid State Circuits, Vol. SC-22, No. 6, December 1987, pp. 944-953

[2] B. Nauta, A. G. W. Venes, "A 70-MS/s 110-mW 8-b CMOS Folding and Interpolating A/D Converter", IEEE Journal of Solid State Circuits, Vol. 30, No. 12, December 1995, pp. 1302-1308

[3] K. Bult, A. Buchwald, J. Laskowski, "A 170 mW 10b 50 M sample/s CMOS ADC in 1 $mm^2$", IEEE International Solid State Circuits Conference ISSCC 1997, paper 8.3

[4] K. Bult, U.S. Pat. No. 5,835,048

[5] K. Kattman, J. Barrow, "A Technique for Reducing Differential Non-Linearity Errors in Flash A/D Converters", IEEE International Solid State Circuits Conference ISSCC 1991, Digest of Technical Papers, pp. 170-171, February 1991

[6] U.S. Pat. No. 5,955,978

[7] U.S. Pat. No. 4,947,168

[8] U.S. Pat. No. 5,047,772

[9] U.S. Pat. No. 5,784,016

[10] U.S. Pat. No. 4,983,969

[11] P. Vorenkamp, R. Roovers, "A 12-b, 60-Msample/s Cascaded Folding and Interpolating ADC", IEEE Journal of Solid State Circuits, Vol. 32, No. 12, December 1997, pp. 1876-1886

[12] M. Dwarakanath, D. Marsh, "Operational Amplifier with Offset Compensation", U.S. Pat. No. 4,306,196

[13] E. Vittoz, H. Oguey, "Amplifier with Input Drift Voltage Compensation", U.S. Pat. No. 4,628,274

[14] P. Ferguson, C. Burra, M. Mueck",Calibrating the DC Offset of Amplifiers", U.S. Pat. No. 5,789,974

[15] M.-J. Choe, B.-S. Song, K. Bacrania",A 13b 40 Msample/s CMOS Pipelined Folding ADC with Background Offset Trimming", 2000 IEEE International Solid-State Circuits Conference, Paper MP 2.2

[16] A. Venes, R. van de Plassche",An 80-Mhz, 80-mW, 8-b CMOS Folding A/D Converter with Distributed Track-and-Hold Pre-processing", IEEE Journal of Solid-State Circuits, Vol. 31, No. 12, December 1996

[17] M. Pelgrom, M. Roorda, "An Algorithmic 15-bit CMOS Digital-to-Analog Converter", IEEE Journal of Solid State Circuits, Vol. 23, No. 6, December 1988, pp. 1402

[18] T-H. Shu, K. Bacrania, R. Gokhale, "A 10b 40-Msampe/s BICMOS A/D Converter", IEEE Journal of Solid State Circuits, Vol. 31, No. 10, October 1996, pp. 1507

[19] K. Nagaraj, et al., "A 700 Msample/s 6b Read Channel A/D Converter with 7b Servo Mode", IEEE International Solid State Circuits Conference ISSCC2000, Paper WP26.1

[20] K. Nagaraj, "MOS Sample and Hold Circuit", U.S. Pat. 6,052,000

I claim:

1. A device for self-calibrating an amplifier stage, comprising:
a first device for creating appropriate conditions for calibrating the amplifier stage;
a second device for changing properties of the amplifier stage;
a comparator unit for comparing signals being output by the amplifier stage or electrical quantities occurring within the amplifier stage with each other or with assigned reference values; and
a control device for setting the properties of the amplifier stage by appropriately controlling said second device, depending on a comparison result output by said comparator unit.

2. The device according to claim 1, wherein said appropriate conditions that are created by said first device are conditions under which said signals that are output by said amplifier stage cause said comparator unit to produce said comparison result such that said comparison result enables a determination without any doubt as to whether and/or how precisely the amplifier stage is calibrated.

3. The device according to claim 1, in combination with the amplifier stage, wherein the amplifier stage has input terminals, and said first device can specify whether signals are fed to the input terminals of the amplifier stage.

4. The device according to claim 1, in combination with the amplifier stage, wherein the amplifier stage has input terminals, and said first device can specify particular signals that will be fed to the input terminals of the amplifier stage.

5. The device according to claim 4, in combination with the amplifier stage, wherein the amplifier stage has at least one input terminal; and the device further comprises:
   a switching device that is connected upstream from said input terminal of the amplifier stage;
   said switching device is for receiving various signals; and
   said switching device is configured to specify which of the various signals is passed on to the input terminal of the amplifier stage.

6. The device according to claim 4, in combination with the amplifier stage, wherein the amplifier stage has at least two input terminals that are connected to each other while the amplifier stage is being calibrated.

7. The device according to claim 4, wherein said first device is constructed as an amplifier stage connected upstream of the amplifier stage.

8. The device according to claim 4, wherein said first device is constructed for reconfiguring the amplifier stage.

9. The device according to claim 8, in combination with the amplifier stage, wherein:
   the amplifier stage has components connected in a wiring configuration; and
   said first device are constructed for changing the wiring configuration of the components in the amplifier stage.

10. The device according to claim 1, in combination with the amplifier stage, wherein:
    the amplifier stage has elements that are or that can be connected to locations within the amplifier stage;
    the elements have properties; and
    the properties of the amplifier stage can be changed by connecting, disconnecting, activating and/or deactivating the elements that are or that can be connected to locations within the amplifier stage.

11. The device according to claim 1, in combination with the amplifier stage, wherein:
    the amplifier stage has elements that are or that can be connected to locations within the amplifier stage;
    the elements have properties; and
    the properties of the amplifier stage can be changed by changing the properties of the elements that are or that can be connected to locations within the amplifier stage.

12. The device according to claim 1, in combination with the amplifier stage, wherein:
    the amplifier stage has input terminals, output terminals, and elements that are or that can be connected to the input terminals or the output terminals of the amplifier stage;
    the elements have properties; and
    the properties of the amplifier stage can be changed by connecting, disconnecting, activating and/or deactivating the elements that are or that can be connected to the input terminals or the output terminals of the amplifier stage.

13. The device according to claim 1, in combination with the amplifier stage, wherein:
    the amplifier stage has input terminals, output terminals, and elements that are or that can be connected to the input terminals or the output terminals of the amplifier stage;
    the elements have properties; and
    the properties of the amplifier stage can be changed by changing the properties of the elements that are or that can be connected to the input terminals or the output terminals of the amplifier stage.

14. The device according to claim 1, wherein said second device includes elements for changing a magnitude of currents flowing inside and/or outside the amplifier stage.

15. The device according to claim 1, wherein said second device includes elements for changing a time characteristic of currents flowing inside and/or outside the amplifier stage.

16. The device according to claim 1, in combination with the amplifier stage, wherein the amplifier stage outputs signals and has electrical quantities occurring therein, and the device further comprises a third device for feeding the signals output by the amplifier stage or the electrical quantities occurring in the amplifier stage to said comparator unit.

17. The device according to claim 16, wherein said third device includes at least one switching device for specifying whether the signals of the amplifier stage are fed to said comparator unit.

18. The device according to claim 16, wherein said third device includes at least one switching device for specifying which of the signals of the amplifier stage are fed to said comparator unit.

19. The device according to claim 16, wherein said third device includes at least portions constructed as amplifier stages connected downstream of the amplifier stage being calibrated.

20. The device according to claim 16, wherein said third device includes devices for calibrating said third device.

21. The device according to claim 16, wherein said control device controls said first device and said third device.

22. The device according to claim 16, further comprising:
    a plurality of storage devices;
    said control device for writing to said plurality of storage devices; and
    said first device, said second device, and said third device each operating depending on a content of a respectively assigned one of said plurality of storage devices.

23. The device according to claim 22, wherein said plurality of storage devices are digital storage devices.

24. The device according to claim 1, in combination with the amplifier stage, wherein:
    the properties of the amplifier stage are selected from a group consisting of an offset, a gain factor, a frequency response, and a phase response; and the properties are calibrated.

25. The device according to claim 1, in combination with an analog/digital converter, wherein the amplifier stage is a part of the analog/digital converter.

26. The device according to claim 25, wherein the analog/digital converter is a folding analog/digital converter.

27. The device according to claim 25, wherein the analog/digital converter is a flash analog/digital converter.

28. The device according to claim 1, in combination with the amplifier stage, wherein amplifier stage is a differential amplifier.

29. The device according to claim 1, in combination with a group of amplifier stages, wherein amplifier stage is a part of the group of amplifier stages.

30. The device according to claim 29, wherein the group of amplifier stages is an amplifier stage chain.

31. The device according to claim 29, wherein the group of amplifier stages is an amplifier stage tree.

32. The device according to claim 29, wherein the group of amplifier stages includes amplifier stages that are calibrated individually in succession.

33. The device according to claim 29, wherein said comparator unit forms a solitary comparator unit cooperating with said group of amplifier stages.

34. A method for self-calibrating an amplifier stage, which comprises:
   creating appropriate conditions for calibrating the amplifier stage;
   comparing signals being output by the amplifier stage or electrical quantities occurring within the amplifier stage with each other or with assigned reference values derived from at least one voltage divider; and
   changing properties of the amplifier stage, depending on a result of the comparing step.

35. The method according to claim 34, wherein the appropriate conditions for calibrating the amplifier stage are conditions under which the signals, which are output by the amplifier stage and compared with each other or with the assigned reference values, produce a comparison result that can be used to establish without any doubt whether and/or how precisely the amplifier stage is calibrated.

36. The method according to claim 34, wherein the step of creating appropriate conditions for calibrating the amplifier stage includes setting whether signals are fed to input terminals of the amplifier stage.

37. The method according to claim 36, wherein the step of creating appropriate conditions for calibrating the amplifier stage includes setting which signals are fed to input terminals of the amplifier stage.

38. The method according to claim 36, which further comprises:
   providing the amplifier stage with at least one input terminal;
   feeding various signals to a switching device connected upstream of the input terminal of the amplifier stage; and
   configuring the switching device to specify which of the various signals are passed on to the input terminal of the amplifier stage.

39. The method according to claim 36, which further comprises:
   providing the amplifier stage with at least two input terminals; and
   while calibrating the amplifier stage, connecting together at least the two input terminals of the amplifier stage.

40. The method according to claim 36, which further comprises connecting an amplifier stage upstream of the amplifier stage being calibrated in order to perform the step of creating the appropriate conditions.

41. The method according to claim 36, wherein the step of creating appropriate conditions for calibrating the amplifier stage includes reconfiguring the amplifier stage.

42. The method according to claim 41, wherein the step of creating appropriate conditions for calibrating the amplifier stage includes changing a wiring configuration of components in the amplifier stage.

43. The method according to claim 41, wherein the step of changing the properties of the amplifier stage includes connecting, disconnecting, activating and/or deactivating elements that are or that can be connected to locations within the amplifier stage.

44. The method according to claim 41, wherein the step of changing the properties of the amplifier stage includes connecting, disconnecting, activating and/or deactivating elements that are or that can be connected to input terminals or output terminals of the amplifier stage.

45. The method according to claim 41, wherein the step of changing the properties of the amplifier stage includes changing properties of elements that are or that can be connected to locations within the amplifier stage.

46. The method according to claim 41, wherein the step of changing the properties of the amplifier stage includes changing properties of elements that are or that can be connected to input terminals or output terminals of the amplifier stage.

47. The method according to claim 41, wherein the step of changing the properties of the amplifier stage includes changing a magnitude of currents flowing inside and/or outside the amplifier stage.

48. The method according to claim 41, wherein the step of changing the properties of the amplifier stage includes changing a time characteristic of currents flowing inside and/or outside the amplifier stage.

49. The method according to claim 41, which further comprises using a third device to feed the signals being output by the amplifier stage or the electrical quantities occurring within the amplifier stage to a comparator unit that performs the comparing step.

50. The method according to claim 49, which further comprises providing the third device with at least one switching device for specifying whether the signals are fed to the comparator unit.

51. The method according to claim 50, which further comprises providing the third device with at least one switching device for specifying which of the signals are fed to the comparator unit.

52. The method according to claim 49, which further comprises forming at least a portion of the third device with at least one amplifier stage connected downstream of the amplifier stage being calibrated.

53. The method according to claim 49, which further comprises enabling calibration of the third device.

54. The method according to claim 34, which further comprises:
   providing a first device for performing the step of creating appropriate conditions for calibrating;
   providing a second device for performing the step of changing the properties of the amplifier stage;
   providing a third device for selecting and feeding the signals being output by the amplifier stage or the electrical quantities occurring within the amplifier stage; and
   using a control device to control the first device, the second device, and the third device.

55. The method according to claim 34, which further comprises:
   writing from a control device to storage devices assigned to the first device, the second device and the third device; and
   operating the first device, the second device and the third device depending on a content of the storage devices assigned thereto.

56. The method according to claim 55, which further comprises providing the storage devices as digital storage devices.

57. The method according to claim 34, which further comprises:
  selecting the properties of the amplifier stage from a group consisting of an offset, a gain factor, a frequency response, and a phase response; and
  calibrating the properties of the amplifier stage.

58. The method according to claim 34, which further comprises providing the amplifier stage being calibrated as an amplifier stage of an analog/digital converter.

59. The method according to claim 58, which further comprises providing the analog/digital converter as a folding analog/digital converter.

60. The method according to claim 58, which further comprises providing the analog/digital converter as a flash analog/digital converter.

61. The method according to claim 34, which further comprises providing the amplifier stage being calibrated as a differential amplifier.

62. The method according to claim 34, which further comprises providing the amplifier stage being calibrated as an amplifier stage of a group of amplifier stages.

63. The method according to claim 62, wherein the group of amplifier stages is an amplifier stage chain.

64. The method according to claim 62, wherein the group of amplifier stages is an amplifier stage tree.

65. The method according to claim 62, wherein the comparator unit forms a solitary comparator unit cooperating with all amplifier stages of the group of amplifier stages.

66. The method according to claim 62, wherein the comparator unit forms a solitary comparator unit cooperating with a plurality of amplifier stages of the group of amplifier stages.

67. The method according to claim 62, which comprises individually calibrating amplifier stages of the group of amplifier stages in succession.

68. The method according to claim 62, which comprises individually calibrating amplifier stages of the group of amplifier stages in succession from a back end of an amplifier stage tree.

69. The method according to claim 62, which comprises individually calibrating amplifier stages of the group of amplifier stages in succession from a back end of an amplifier stage chain.

70. The method according to claim 34, which comprises calibrating the amplifier stage beginning with calibrating a current source contained in the amplifier stage.

71. The method according to claim 34, which comprises, before calibrating the amplifier stage, calibrating a device used as a third device.

72. A device for compensating for errors in a reference voltage applied to a first input terminal of a differential amplifier, the device comprising:
  a device for generating a calibration signal corresponding to an error-free reference voltage and for applying the calibration signal to a second input terminal of the differential amplifier; and
  a device for calibrating the differential amplifier to bring the differential amplifier into an equilibrium state when the reference voltage is applied to the first input terminal and the calibration signal is applied to the second input terminal.

73. The device according to claim 72, wherein said device for generating the calibration signal includes a device for generating the calibration signal; and said device for generating the calibration signal does not generate the reference voltage.

74. The device according to claim 72, wherein said device for generating the calibration signal is constructed so that the calibration signal has no or only negligibly small differences from a magnitude and/or a characteristic that the reference voltage should have.

75. The device according to claim 72, wherein:
  said device for generating the calibration signal includes a sample-and-hold stage that is modified but can still be used as a sample-and-hold stage; and
  said sample-and-hold stage generates the calibration signal.

76. The device according to claim 72, further comprising:
  a voltage divider for generating the reference voltage;
  said device for generating the calibration signal including a voltage divider for generating the calibration signal.

77. A method of compensating for errors in a reference voltage applied to a first input terminal of a differential amplifier, the method which comprises:
  generating a calibration signal corresponding to an error-free reference voltage and applying the calibration signal to the second input terminal of the differential amplifier; and
  bringing the differential amplifier into the equilibrium state by applying the reference voltage to the first input terminal while the calibration signal is applied to the second input terminal.

78. The method according to claim 77, wherein the reference voltage that is applied to the first input terminal and the calibration signal that is applied to the second input terminal are generated by different devices.

79. The method according to claim 77, wherein the calibration signal is generated to ensure that the calibration signal has no or only negligibly small differences from a magnitude and/or a characteristic that the reference voltage should have.

80. The method according to claim 77, wherein the calibration signal is generated by a sample-and-hold stage that is modified but can still be used as a sample-and-hold stage.

81. The method according to claim 77, wherein the calibration signal and the reference voltage are generated by different voltage dividers.

82. A device for compensating for errors in a sample-and-hold circuit connected upstream of a first input terminal of a differential amplifier having the first input terminal and a second input terminal, the device comprising:
  a device for feeding a signal, which at an appropriate time is also fed or would have to be fed to the second input terminal of the differential amplifier, to the sample-and-hold circuit; and
  a device for calibrating the differential amplifier to bring the differential amplifier into an equilibrium state in a phase during which the signal is fed to the sample-and-hold circuit.

83. A method for compensating for errors in a sample-and-hold circuit connected upstream of a first input terminal of a differential amplifier having the first input terminal and a second input terminal, the method which comprises:
  feeding a signal, Which at an appropriate time is also fed or would have to be fed to the second input terminal of the differential amplifier, to the sample-and-hold circuit; and
  bringing the differential amplifier into an equilibrium state in a phase during which the signal is fed to the sample-and-hold circuit.

* * * * *